United States Patent
Kojima et al.

(10) Patent No.: US 8,232,711 B2
(45) Date of Patent: Jul. 31, 2012

(54) SURFACE EMISSION TYPE ELECTRON SOURCE AND DRAWING DEVICE

(75) Inventors: Akira Kojima, Tokyo (JP); Hideyuki Ohyi, Tokyo (JP)

(73) Assignee: Crestec Corporation, Tokyo (JP)

( * ) Notice: Subject to any disclaimer, the term of this patent is extended or adjusted under 35 U.S.C. 154(b) by 275 days.

(21) Appl. No.: 12/597,035

(22) PCT Filed: Apr. 23, 2008

(86) PCT No.: PCT/JP2008/057852
§ 371 (c)(1),
(2), (4) Date: Oct. 22, 2009

(87) PCT Pub. No.: WO2008/133275
PCT Pub. Date: Nov. 6, 2008

(65) Prior Publication Data
US 2010/0072875 A1    Mar. 25, 2010

(30) Foreign Application Priority Data

Apr. 25, 2007 (JP) ................................. 2007-115471
Aug. 9, 2007 (JP) ................................. 2007-207887

(51) Int. Cl.
*H01J 1/02* (2006.01)
(52) U.S. Cl. .................. 313/309; 313/310; 313/495
(58) Field of Classification Search .......... 313/309–310, 313/495–498
See application file for complete search history.

(56) References Cited

U.S. PATENT DOCUMENTS

| | | | |
|---|---|---|---|
| 5,362,972 A * | 11/1994 | Yazawa et al. ................. 257/13 |
| 7,608,147 B2 * | 10/2009 | Samuelson et al. ............. 117/89 |
| 7,709,827 B2 * | 5/2010 | Graham et al. ................. 257/24 |
| 7,834,545 B2 * | 11/2010 | Zhang et al. .................. 313/506 |
| 8,087,151 B2 * | 1/2012 | Park et al. .................... 29/592.1 |
| 2004/0065843 A1 | 4/2004 | Schut et al. |
| 2005/0184642 A1 | 8/2005 | Oh et al. |

(Continued)

FOREIGN PATENT DOCUMENTS

JP        61-150328 A        7/1986
(Continued)

OTHER PUBLICATIONS

Takuya Komoda et al., "Mechanism of efficient and stable surface-emitting cold cathode based on porous polycrystalline silicon films", J. Vac. Sci. Technol. B 17(3) May/Jun. 1999, pp. 1076-1079.

(Continued)

*Primary Examiner* — Tracie Y Green
(74) *Attorney, Agent, or Firm* — Dickstein Shapiro LLP

(57) ABSTRACT

A surface emission type electron source including a first electrode having a planar form, a second electrode having a planar form facing the first electrode, an electron passage layer disposed between the first electrode and the second electrode, an insulator or semiconductor layer between the second electrode and the electron passage layer, and a power source part configured to apply a voltage to the second electrode and the first electrode. The electron passage layer includes plural quantum wires extending in a first direction from the first electrode to the second electrode. The quantum wires are made of silicon and spaced apart from each other at predetermined intervals, and electrons are emitted from a front surface of the second electrode. Protrusions protruding toward leading ends of the quantum wires are formed on a back surface of the second electrode at positions corresponding to the quantum wires.

28 Claims, 23 Drawing Sheets

U.S. PATENT DOCUMENTS

| | | |
|---|---|---|
| 2006/0151720 A1 | 7/2006 | Moon et al. |
| 2007/0080640 A1 | 4/2007 | Son et al. |

FOREIGN PATENT DOCUMENTS

| | | |
|---|---|---|
| JP | 5-74333 A | 3/1993 |
| JP | 7-296755 A | 11/1995 |
| JP | 8-250766 A | 9/1996 |
| JP | 10-79222 A | 3/1998 |
| JP | 2002-279892 A | 9/2002 |
| JP | 2003-45318 A | 2/2003 |
| JP | 2003-331710 A | 11/2003 |
| JP | 2004-127936 A | 4/2004 |
| JP | 2004-206975 A | 7/2004 |
| JP | 2005-243632 A | 9/2005 |
| JP | 2005-317657 A | 11/2005 |
| JP | 2006-40725 A | 2/2006 |
| JP | 2006-120410 A | 5/2006 |
| JP | 2006-147518 A | 6/2006 |
| JP | 2006-179890 A | 7/2006 |
| JP | 2007-109637 A | 4/2007 |

OTHER PUBLICATIONS

Tsutomu Ichihara, et al., "Correlation between nanostructure and electron emission characteristics of a ballistic electron surface-emitting device", J. Vac. Sci. Technol. B 22(3) May/Jun. 2004, pp. 1372-1376.

* cited by examiner (a)

(b)

(a)

(b)

(a)

(b)

(a)

(b)

(a)

(b)

(a)

(b)

(a)

(b)

SURFACE EMISSION TYPE ELECTRON SOURCE AND DRAWING DEVICE

TECHNICAL FIELD

The present invention relates to a surface emission type electron source and an electron emission device for using electron beams to form a pattern at once at the same magnification, and more particularly to a surface emission type electron source and an electron emission device for using electron beams to form a pattern at once at the same magnification even when the region onto which the pattern is to be formed is large.

BACKGROUND ART

In recent years, there has been developed a technology of forming a predetermined pattern on a substrate by scanning electron beams. However, it is time consuming to form a pattern by scanning the electron beams. Thus, it is desired that a predetermined pattern is formed onto a substrate at once at the same magnification with the use of electron beams.

Presently, there are various proposals of electron beam exposure apparatuses for forming a predetermined pattern onto a substrate at once at the same magnification and electron sources used in such electron beam exposure apparatuses (see, for example, patent documents 1 through 6).

Patent documents 1 and 2 disclose an electron beam source 200 as shown in FIG. 23. The electron beam source 200 has an electron passage layer 204 formed on a surface electrode 202. The electron passage layer 204 has plural semiconductor nanocrystals 206 of nanometer-scale. An oxide film 208 is formed on the surface of each semiconductor nanocrystal 206. The thickness of the oxide film 208 is smaller than the crystal grain size of the semiconductor nanocrystals 206. Electrons are emitted from a surface 202a of the electron beam source 200. Thus, the surface 202a of the electron beam source 200 acts as an electron emitting surface.

In patent documents 1 and 2, in a state where the electron beam source 200 is disposed in a vacuum space, electrons e are accelerated by an intense electric field in the electron passage layer 204 including the semiconductor nanocrystals 206. Then, the kinetic energy of the electrons e increases near the surface 202a of the surface electrode 202. The electrons e acquire energy exceeding that of an electrical barrier that restricts the motion of the electrons. Subsequently, the electron beam source 200 emits the electrons into the vacuum space.

Patent document 3 discloses a nitride semiconductor resonance tunnel electron emitting element including a multiple barrier layer constituted by an insulating substrate having formed thereon an AlN layer or an AlGaN layer (where Al(x)Ga(1−x)N and x>0.3) having a thickness greater than or equal to one atomic layer and less than or equal to 10 atomic layers, and a GaN layer having a thickness greater than or equal to five atomic layers and less than or equal to 50 atomic layers.

Patent document 4 discloses an electron beam source including plural electron emitting sources formed on a base; a patterning electrode, which includes a top end formed so as to protrude toward one of the electron emitting sources and also includes an opening through which electron beams can pass; and moving means for moving the relative positions of the base having the electron emission sources formed thereon and the patterning electrode.

Patent document 5 discloses a quantized electron beam generator including an n+ type InP substrate having formed thereon an n+ type InGaAs layer including silicon having a density of $1 \times 10^{19}/cm^3$, an $AlAs_{0.56}Sb_{0.44}$ layer, and an $In_{0.53}Ga_{0.47a}s$ layer. An insulating isolation region is formed around a plane rectangular region, from the $In_{0.53}Ga_{0.47a}s$ layer into the upper part of the n+ type InGaAs layer. The $AlAs_{0.56}Sb_{0.44}$ layer, which is the rectangular region surrounded by the isolation region, serves as a potential barrier layer. The $In_{0.53}Ga_{0.47a}s$ layer above the $AlAs_{0.56}Sb_{0.44}$ layer serves as a potential well layer. Donut-shaped electrodes exposing the potential well layer are disposed with intervals of 1 μm through 2 μm on the $In_{0.53}Ga_{0.47a}s$ layer. By applying a voltage in between these donut-shaped electrodes and electrodes provided on the bottom surface of the n+ type InP substrate, an electric field is generated on the potential well.

Patent document 6 discloses an electron beam source including a bulk region, a barrier region adjacent to the bulk region and having a higher potential than the bulk region, a well region adjacent to the barrier region and having a lower potential than the barrier region, and electric field applying means to apply an electric field on a space adjacent to the well region for causing the potential of the space to incline. The barrier region and the well region are formed to have thicknesses such that the electrons in the bulk region have a maximum transmittance of 100% when permeating the barrier region and the space.

Patent Document 1: Japanese Laid-Open Patent Application No. 2005-317657
Patent Document 2: Japanese Laid-Open Patent Application No. 2006-40725
Patent Document 3: Japanese Laid-Open Patent Application No. 2006-147518
Patent Document 4: Japanese Laid-Open Patent Application No. H7-296755
Patent Document 5: Japanese Laid-Open Patent Application No. H5-74333
Patent Document 6: Japanese Laid-Open Patent Application No. H10-79222

DISCLOSURE OF INVENTION

Problems of the Conventional Technology

In the electron beam source 200 disclosed in patent documents 1 and 2, as shown in FIG. 23, the semiconductor nanocrystals 206 of nanometer-scale constituting the electron passage layer 204 are in contact with each other in a direction including horizontal components with respect to the surface 202a (electron emitting surface) of the surface electrode 202 of the electron beam source 200.

In the electron beam source 200 disclosed in patent documents 1 and 2, as shown in the energy band diagram of FIG. 24, immediately after the electrons e are injected into the electron passage layer 204 (region $D_{204}$ (see FIG. 24)), the kinetic energy level of the electrons e is lower than that of electrical barriers $\psi_{30}$ formed by interfaces of the semiconductor nanocrystals 206. Therefore, the motions of the electrons e in a direction including horizontal components with respect to the electron emitting surface (surface 202a of the surface electrode 202) are restricted, and accordingly, the electrons e move rectilinearly (straight forward).

However, as shown in the energy band diagram of FIG. 24, at the part near where the semiconductor nanocrystals 206 contact the electron emitting surface (see FIG. 23), when the electrons e acquire energy exceeding that of the electrical barriers $\psi_{30}$ formed by the oxide films 208 covering the semiconductor nanocrystals 206, the electrons e are scattered into adjacent semiconductor nanocrystals 206.

In patent documents 1 and 2, in the semiconductor nanocrystals 206 near the electron emitting surface (surface 202a of the surface electrode 202), there is a region $D_{202}$ where the electrons e acquire energy corresponding to a work function $\psi_{31}$ of the surface electrode 202 required for emitting the electrons e from the surface electrode 202 (see FIG. 23), and a region $D_{206}$ where the energy level of the electrons e definitely exceeds that of the electrical barriers $\psi_{30}$. Specifically, the electrons e acquire energy that exceeds that of the electrical barriers $\psi_{30}$ formed by interfaces of the semiconductor nanocrystals 206. Accordingly, a quantum confinement effect no longer functions, and therefore the electrons e are scattered into adjacent semiconductor nanocrystals 206. Consequently, electrons $e_s$ that scatter without moving rectilinearly may be generated with a certain probability, in addition to electrons $e_r$ that move rectilinearly. Thus, the electrons e are emitted after being scattered in various directions.

For this reason, according to the inventions of patent documents 1 and 2, high-speed electrons scattering at large angles are emitted together with electrons that are emitted rectilinearly as ballistic electrons. Such electrons that scatter at large angles may limit the resolution of the exposure pattern that is formed by exposing with electron beams.

Furthermore, in order to achieve higher resolution performance than submicron with the use of the electron beam source 200 disclosed in patent documents 1 and 2, a vertical intensified magnetic field having a uniform intensity (greater than or equal to 0.1 T) is required for converging the electron beams. However, it is difficult to achieve a uniform intensified magnetic field on a large region such as a wafer. This limits the application to electron-beam exposure at the same magnification.

Furthermore, in the inventions of patent documents 1 and 2, the surface emission type electron source is not provided with a structure for converging the electron beams in a direction orthogonal to the electron emitting surface, with which electrons are prevented from diffusing as diffraction waves in an outward direction from the orthogonal direction with respect to the electron emitting surface. Furthermore, in the inventions of patent documents 1 and 2, the surface emission type electron source is not provided with a structure for electrically controlling the rectilinearity (property of moving straight forward) of the emitted electron beams, or a structure for controlling the temperature of the electron source that has a large impact on the rectilinearity of the emitted electron beams.

The electron source disclosed in patent documents 1 and 2 has a structure for causing the electrons to tunnel through an electric insulating layer constituting an electron passage layer, to emit the electron beams into a vacuum space. The electron beam emission properties depend on the intensity of the electric field. However, in practical situations, the electrons can jump across several structural deficiencies included in the electron passage layer, with the assistance of thermal energy. Accordingly, the emitted electrons include electrons that have been emitted into a vacuum space with the assistance of thermal energy. As described above, the electrons have momentum vectors in various directions and the energy distribution of the emitted electrons is wide. These properties cause a decrease in the exposure resolution and also cause chromatic aberration in the surface electron beams.

Furthermore, in patent documents 1 and 2, a pattern of surface electron beams emitted from the surface emission type electron source is formed by shaping the surface electrode or by providing a mask of the pattern on the surface electrode. However, these methods obstruct the formation of a uniform electric field between the surface emission type electron source and the exposure target facing the surface emission type electron source. The electric flux lines between the surface emission type electron source and the exposure target may locally converge at a particular region on the surface electrode. Consequently, the electric field is formed locally and the exposure image becomes distorted. Furthermore, when electron beams are emitted from the opening of the mask, the electron beams are diffracted at the edge of the opening of the mask, which degrades the exposure resolution. In the method of providing a mask on the surface electrode, the portion with the mask will have a protruding shape, and therefore the electric flux lines converge at the protruding shape. Consequently, the electric field is formed locally and the exposure image becomes distorted.

The surface emission type electron source for the electron beam exposure apparatus disclosed in patent document 3 emits electron beams by a principle similar to that of patent documents 1 and 2. That is, the kinetic energy of the electrons increases near the surface of the element, and therefore there is no electrical barrier restricting the movement of the electrons in a direction including horizontal components with respect to the electron emitting surface. Accordingly, the electrons that have acquired high energy can scatter in various directions near the surface. Consequently, high-speed electrons scattering at large angles are generated.

In the surface emission type electron source for the electron beam exposure apparatus disclosed in patent documents 4, 5, and 6, electron sources are disposed at points spaced apart from each other on a plane. Near each electron source, an electrode is disposed for extracting electrons at vacuum level. Electrons are extracted from the openings of the electrodes. Accordingly, an electron beam formed by the emitted electrons extends in a conical shape from the electron sources disposed at the points, toward the openings of the electrodes. This limits the resolution of the transferred pattern.

The object of the present invention is to provide a surface emission type electron source and an electron emission device for solving the problems of the above conventional technologies and for forming a pattern at once at the same magnification with the use of electron beams, even when the region onto which the pattern is to be formed is large.

Means for Solving the Problem

In order to achieve the aforementioned object, according to a first aspect of the present invention, there is provided a surface emission type electron source including a first electrode having a planar form; a second electrode having a planar form facing the first electrode; an electron passage layer disposed between the first electrode and the second electrode; and a power source part configured to apply a voltage to the second electrode and the first electrode, wherein the electron passage layer includes a plurality of quantum wires extending in a first direction from the first electrode to the second electrode, the quantum wires being spaced apart from each other at predetermined intervals, and electrons are emitted from a front surface of the second electrode; and the quantum wires are made of silicon, and each of the quantum wires has a plurality of thin parts having small thicknesses formed at predetermined intervals along the first direction.

According to a second aspect of the present invention, there is provided a surface emission type electron source including a first electrode having a planar form; a second electrode having a planar form facing the first electrode; an electron passage layer disposed between the first electrode and the second electrode; and a power source part configured to apply a voltage to the second electrode and the first electrode, wherein the electron passage layer includes a plurality of quantum wires extending in a first direction from the first electrode to the second electrode, the quantum wires being spaced apart from each other at predetermined intervals, and electrons are emitted from a front surface of the second electrode; and the quantum wires are made of silicon, a layer constituted by an insulator or a semiconductor is formed between the second electrode and the electron passage layer, and protrusions protruding toward leading ends of the quantum wires are formed on a back surface of the second electrode at positions corresponding to the quantum wires.

In the present invention, it is preferable that each of the quantum wires has a plurality of thin parts having small thicknesses formed at predetermined intervals along the first direction.

Furthermore, the present invention preferably further includes a temperature adjusting unit configured to maintain the electron passage layer at a temperature less than or equal to room temperature.

Furthermore, in the present invention, it is preferable that a layer constituted by an insulator or a semiconductor is formed between the second electrode and the electron passage layer, and protrusions protruding toward leading ends of the quantum wires are formed on a back surface of the second electrode at positions corresponding to the quantum wires.

Furthermore, in the present invention, it is preferable that in each of the quantum wires, regions partitioned by the thin parts comprise quantum dots.

Furthermore, the present invention preferably further includes a porous member including a plurality of tube members that are bound together, wherein each of the tube members has a first opening at one end and a second opening at another end that is wider than the first opening, and each of the tube members has a diameter that monotonously increases from the first opening toward the second opening; and a surface electrode having a planar form that is connected to the porous member on a side of the porous member having the second openings, wherein each of the tube members is constituted by an insulator or a semiconductor; and the porous member is connected to the front surface of the second electrode such that the first openings are facing the front surface of the second electrode.

Furthermore, the present invention preferably further includes a porous member including a plurality of tube members that are bound together, wherein each of the tube members has a first opening at one end and a second opening at another end that is wider than the first opening, and each of the tube members has a diameter that monotonously increases from the first opening toward the second opening; an electrode provided for each of the tube members of the porous member; a second power source part configured to apply a voltage to a part between the second electrode and each of the electrodes; and a control unit configured to control the voltage applied by the second power source part, wherein each of the tube members is constituted by an insulator or a semiconductor; and the porous member is connected to the front surface of the second electrode such that the first openings are facing the front surface of the second electrode.

Furthermore, in the present invention, it is preferable that on the first electrode, a conductive body is disposed in a region corresponding to a region from which the electrons are emitted from the front surface the second electrode, and an insulator is disposed in regions other than the region corresponding to the region from which the electrons are emitted.

Furthermore, in the present invention, it is preferable that an electron absorber formed as a predetermined pattern is provided on the front surface of the second electrode.

Furthermore, the present invention preferably further includes a plurality of switch elements provided on the first electrode, wherein the switch elements are connected to at least one of the quantum wires and are configured to switch to a conductive state, a non-conductive state, or a half-conductive state; and a switch control unit configured to switch particular switch elements among the switch elements to the conductive state, wherein the particular switch elements are provided in the region corresponding to the region from which the electrons are emitted from the front surface the second electrode.

Furthermore, in the present invention, it is preferable that each of the quantum wires has a thickness of less than or equal to 5 nm.

Furthermore, in the present invention, it is preferable that the predetermined intervals between the quantum wires are greater than or equal to atom intervals of substances constituting the quantum wires.

Furthermore, the present invention preferably further includes a magnetic field applying unit configured to apply a magnetic field in a direction perpendicular to the front surface of the second electrode; an electron emission angle detector configured to detect an emission angle of each of the electrons emitted from the front surface of the second electrode when the voltage is applied by the power source part; and a control unit configured to adjust an intensity of the magnetic field applied by the magnetic field applying unit based on a detection result indicating the emission angle of each of the electrons obtained by the electron emission angle detector.

Furthermore, the present invention preferably further includes a pulse magnetic field applying unit configured to apply a pulse magnetic field in a direction perpendicular to the front surface of the second electrode, wherein the power source part is configured to apply a pulse voltage to the second electrode and the first electrode; and the power source part applies the pulse voltage to the second electrode and the first electrode while the pulse magnetic field applying unit is applying the pulse magnetic field.

Furthermore, in the present invention, it is preferable that an electron absorbing layer is formed on a leading end of each of the quantum wires, the leading end being at the second electrode side; and the electron absorbing layer is electrically connected to the second electrode.

According to a third aspect of the present invention, there is provided an electron emission device including a surface emission type electron source including a first electrode having a planar form, a second electrode having a planar form facing the first electrode, an electron passage layer disposed between the first electrode and the second electrode, and a power source part configured to apply a voltage to the second electrode and the first electrode, wherein the electron passage layer includes a plurality of quantum wires extending in a first direction from the first electrode to the second electrode, the quantum wires being spaced apart from each other at predetermined intervals, and electrons are emitted from a front surface of the second electrode; and a stage having a surface on which a substrate being radiated by the emitted electrons is placed, the stage being disposed so as to face the second electrode of the surface emission type electron source, wherein the quantum wires of the surface emission type electron source are made of silicon, and each of the quantum wires has a plurality of thin parts having small thicknesses formed at predetermined intervals along the first direction.

According to a fourth aspect of the present invention, there is provided an electron emission device including a surface emission type electron source including a first electrode having a planar form, a second electrode having a planar form facing the first electrode, an electron passage layer disposed between the first electrode and the second electrode, and a power source part configured to apply a voltage to the second electrode and the first electrode, wherein the electron passage layer includes a plurality of quantum wires extending in a first direction from the first electrode to the second electrode, the quantum wires being spaced apart from each other at predetermined intervals, and electrons are emitted from a front surface of the second electrode; a stage having a surface on which a substrate being radiated by the emitted electrons is placed, the stage being disposed so as to face the second electrode of the surface emission type electron source, wherein the quantum wires of the surface emission type electron source are made of silicon, a layer constituted by an insulator or a semiconductor is formed between the second electrode and the electron passage layer of the surface emission type electron source, and protrusions protruding toward leading ends of the quantum wires are formed on a back surface of the second electrode at positions corresponding to the quantum wires.

Furthermore, in the present invention, it is preferable that each of the quantum wires of the surface emission type electron source have a plurality of thin parts having small thicknesses formed at predetermined intervals along the first direction.

Furthermore, in the present invention, the surface emission type electron source preferably further includes a magnetic field applying unit configured to apply a magnetic field in a direction perpendicular to the front surface of the second electrode; an electron emission angle detector configured to detect an emission angle of each of the electrons emitted from the front surface of the second electrode when the voltage is applied by the power source part; and a control unit configured to adjust an intensity of the magnetic field applied by the magnetic field applying unit based on a detection result indicating the emission angle of each of the electrons obtained by the electron emission angle detector.

Furthermore, the present invention preferably further includes a detector configured to detect the electrons that have been emitted from the surface emission type electron source outside a region where the substrate being radiated by the emitted electrons is placed; and a control unit configured to control the voltage of the power source part based on an amount of electrons detected by the detector.

Furthermore, in the present invention, it is preferable that in each of the quantum wires of the surface emission type electron source, regions partitioned by the thin parts comprise quantum dots.

Furthermore, the present invention preferably further includes a temperature adjusting unit configured to maintain the electron passage layer at a temperature less than or equal to room temperature.

Furthermore, in the present invention, the surface emission type electron source preferably further includes a porous member including a plurality of tube members that are bound together, wherein each of the tube members has a first opening at one end and a second opening at another end that is wider than the first opening, and each of the tube members has a diameter that monotonously increases from the first opening toward the second opening; and a surface electrode having a planar form that is connected to the porous member on a side of the porous member having the second openings, wherein each of the tube members is constituted by an insulator or a semiconductor; and the porous member is connected to the front surface of the second electrode such that the first openings are facing the front surface of the second electrode.

Furthermore, in the present invention, the surface emission type electron source preferably further includes a porous member including a plurality of tube members that are bound together, wherein each of the tube members has a first opening at one end and a second opening at another end that is wider than the first opening, and each of the tube members has a diameter that monotonously increases from the first opening toward the second opening; an electrode provided for each of the tube members of the porous member; a second power source part configured to apply a voltage to a part between the second electrode and each of the electrodes; and a control unit configured to control the voltage applied by the second power source part, wherein each of the tube members is constituted by an insulator or a semiconductor; and the porous member is connected to the front surface of the second electrode such that the first openings are facing the front surface of the second electrode.

Furthermore, in the present invention, it is preferable that on the first electrode of the surface emission type electron source, a conductive body is disposed in a region corresponding to a region from which the electrons are emitted from the front surface the second electrode, and an insulator is disposed in regions other than the region corresponding to the region from which the electrons are emitted.

Furthermore, in the present invention, it is preferable that an electron absorber formed as a predetermined pattern is provided on the front surface of the second electrode of the surface emission type electron source.

Furthermore, the present invention preferably further includes a plurality of switch elements provided on the first electrode of the surface emission type electron source, wherein the switch elements are connected to at least one of the quantum wires and are configured to switch to a conductive state, a non-conductive state, or a half-conductive state; and a switch control unit configured to switch particular switch elements among the switch elements to the conductive state, wherein the particular switch elements are provided in the region corresponding to the region from which the electrons are emitted from the front surface the second electrode.

Effects of the Invention

A surface emission type electron source and an electron emission device according to the present invention includes an electron passage layer disposed between the first electrode and the second electrode and a power source part configured to apply a voltage to the second electrode and the first electrode. The electron passage layer includes plural quantum wires extending in a first direction from the first electrode to the second electrode. The quantum wires are spaced apart from each other at predetermined intervals. Electrons are emitted from a front surface of the second electrode. In this case, the movements of electrons in the quantum wires in the electron passage layer are restricted within the first direction by a quantum confinement effect. Thus, the electrons are prevented from jumping to other quantum wires and from being emitted from the other quantum wires. Accordingly, the electrons are emitted in the first direction, thereby improving the rectilinearity of the electron beams emitted from the front surface of the second electrode. Thus, even when the region onto which the pattern is to be formed is large, it is possible to form a pattern at once at the same magnification with the use of electron beams.

Figure 1:
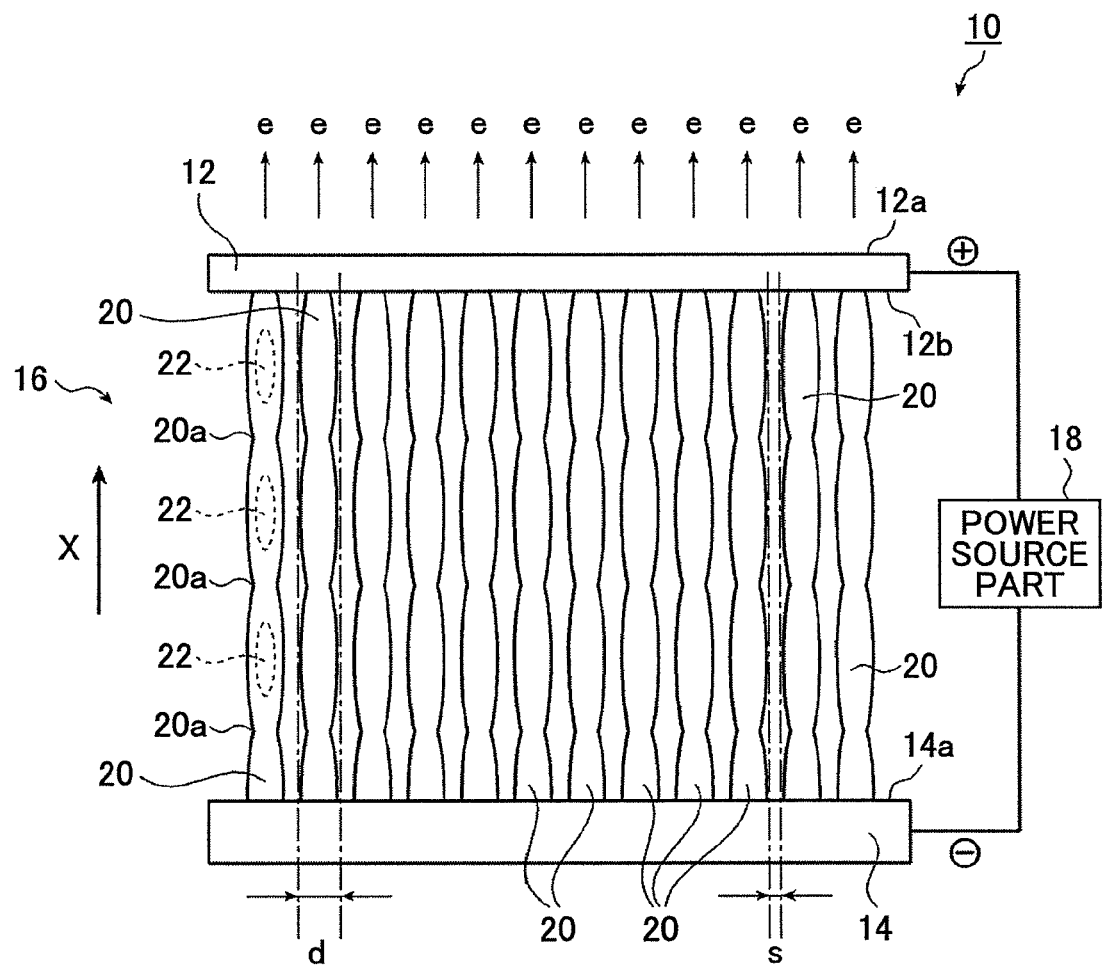
FIG. 1 is a schematic diagram of a surface emission type electron source according to a first embodiment of the present invention.

EXPLANATION OF REFERENCES 10, 10a, 10b, 10c, 10d surface emission type electron source
12, 62 front electrode
12a, 14a, 52a, 62a front surface
12b, 14b back surface
14, 52 back electrode
16 electron passage layer
18 power source part
20 quantum wire
22 quantum dot
30 temperature adjusting unit
32 cooling unit
34 cooler
36 gas supplying unit
38 heater unit
38a, 38b heater part
39 partitioning part
40 heater control unit
50 back auxiliary electrode
54a, 54b, 54c conductive body
56 insulating body
58a, 58b, 58c region
60 substrate
64 protrusion
66 layer
68 recession
72 porous member
74 electron transit tube
76 first surface electrode
77a first electric field applying part
77b second electric field applying part 78 opening
79 second surface electrode
80, 80a, 80b electron emission device
82 vacuum chamber
84 stage
86 substrate
88 detecting sensor
90 multiplying unit
92 comparing unit
94 power source control unit
200 electron beam source
202 surface electrode
204 electron passage layer
206 semiconductor nanocrystal
208 oxide film
s interval
S region onto which the pattern is to be formed

BEST MODE FOR CARRYING OUT THE INVENTION

A detailed description of a surface emission type electron source and an electron emission device according to the present invention is given based on preferred embodiments illustrated in the attached figures.

FIG. 1 is a schematic diagram of a surface emission type electron source according to a first embodiment of the present invention.

A surface emission type electron source 10 includes a planar front electrode (second electrode) 12, a planar back electrode (first electrode) 14, an electron passage layer 16, and a power source part 18. The front electrode 12 and the back electrode 14 are facing each other, and the electron passage layer 16 is formed between the front electrode 12 and the back electrode 14. The front electrode 12, the back electrode 14, and the electron passage layer 16 are connected to each other.

The power source part 18 is for applying a direct voltage to the front electrode 12 and the back electrode 14, such that a positive potential is applied to the front electrode 12. Accordingly, electrons e are emitted from a front surface 12a of the front electrode 12.

The front electrode 12 and the back electrode 14 can be any shape as long as they are planar.

The front electrode 12 and the back electrode 14 can be made of a material such as metal, a semiconductor, carbon, a carbon compound, and a conductive material.

In the electron passage layer 16, there are plural quantum wires 20 spaced apart from each other at predetermined intervals. The quantum wires 20 extend in a first direction X from the back electrode 14 to the front electrode 12.

In the electron passage layer 16, each of the quantum wires 20 has a length extending from a front surface 14a of the back electrode 14 to a back surface 12b of the front electrode 12, and is orthogonally connected to the front surface 14a and the back surface 12b. As described below, the electrons e are emitted from each of the quantum wires 20, and therefore the resolution of the drawn image is determined based on the positions of the quantum wires 20 in the electron passage layer 16.

In the present embodiment, the quantum wires 20 have plural regions having different thicknesses, for example three regions, at predetermined intervals along the first direction X. The regions having different thicknesses are edge parts 20a having small thicknesses, which are disposed along the first direction X, and quantum dots 22 that are partitioned by the edge parts 20a.

Each quantum wire 20 has, for example, three quantum dots 22. A voltage is applied to both ends of the quantum wire 20 such that the electrons in the quantum dots 22 have equal energy levels. Accordingly, electrons can be transmitted according to the resonance tunnel effect among the quantum dots 22.

The surface of the quantum wire 20 is terminated by an atom such as oxygen, nitrogen, carbon, hydrogen, or chlorine, so that electric conduction can be stabilized over time.

The quantum wire 20 is constituted by a conductive body shaped as a long, thin wire having a thickness that is sufficient for achieving a quantum effect. The quantum wire 20 is constituted by, for example, metal, carbon, a carbon compound, a charge-transfer complex, a conductive polymer, or a semiconductor.

The maximum thickness of the quantum wire 20 is, for example, less than or equal to 10 nm. When the quantum wire 20 is constituted by silicon, the maximum thickness of the quantum wire 20 is less than or equal to 5 nm.

The intervals s between the quantum wires 20 may vary depending on the substances constituting the quantum wires 20. For example, the intervals s are preferably greater than or equal to atom intervals of substances constituting the quantum wires 20, and preferably greater than or equal to 0.5 nm. In the present embodiment, the resolution of the drawn image is determined based on the intervals s of the quantum wires 20.

In the present embodiment, the front surface 12a and the back surface 12b of the front electrode 12 are planar, but the present invention is not so limited. For example, the regions on the front electrode 12 corresponding to the top ends of the quantum wires 20 may have locally recessed shapes, for the purpose of improving the rectilinearity of the movement of electrons e emitted from the front surface 12a.

Furthermore, each of the quantum wires 20 is not limited to being in contact with, i.e., being directly and electrically in contact with, the front electrode 12 or the back electrode 14. The quantum wire 20 may be covered by an insulator of nanometer-scale, and electrical carriers may be transmitted by a tunnel effect between the front electrode 12 or the back electrode 14 and the quantum wires 20.

The quantum wire 20 constituting the electron passage layer 16 may have a consistent thickness, without forming the quantum dots 22. In this case, a thickness d of the quantum wire 20 is simply the thickness of the entire quantum wire 20.

In the present invention, nanometer order corresponds to 1 nm through 100 nm, which is a size for achieving a quantum confinement effect.

A description is given of functions of the surface emission type electron source 10 according to the present embodiment.

Figure 2:
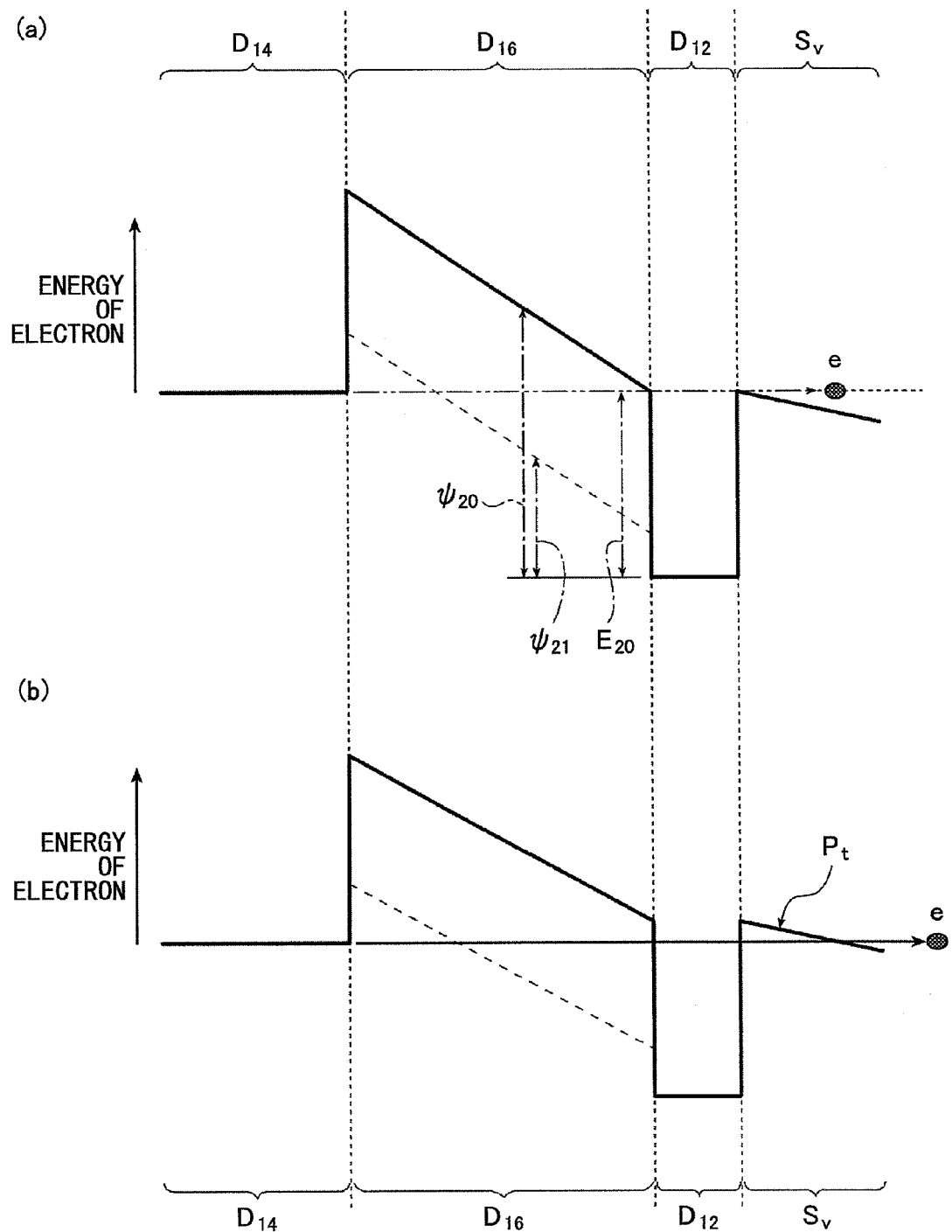
FIG. 2(a) is an energy band diagram for describing a function of the surface emission type electron source according to the first embodiment of the present invention, where the vertical axis represents the energy of the electrons and the horizontal axis represents the position.
FIG. 2(b) is an energy band diagram for describing a function of the surface emission type electron source according to the first embodiment of the present invention.

In the energy band diagram of FIG. 2(a), a reference numeral $D_{12}$ denotes a region corresponding to the front electrode 12, a reference numeral $D_{14}$ denotes a region corresponding to the back electrode 14, and a reference numeral $D_{16}$ denotes a region corresponding to the electron passage layer 16. The front surface 12a of the front electrode 12 is assumed to be contacting a vacuum space Sv.

In FIG. 2(a), $\psi_{21}$ denotes the minimum energy of electrons in the quantum wire 20. The electron e is injected from the back electrode 14 to the electron passage layer 16 by a Fowler-Nordheim type tunnel, or by radiation of ultraviolet rays from the back electrode 14.

In the present embodiment, as shown in FIG. 2(a), when the Fermi level of the region $D_{12}$ corresponding to the front electrode 12 is used as the reference of the potential, a vacuum level $\psi_{20}$ of the quantum wire 20 can be greater than or equal to energy $E_{20}$ required for the electrons e to be emitted from the front surface 12a of the front electrode 12 (electron emitting surface) to the vacuum space Sv. Accordingly, in the surface emission type electron source 10 according to the present embodiment, in the electric conduction body (conductive body) of the quantum wire 20, the electrons are not scattered in a direction including horizontal components with respect to the electron emitting surface. Thus, highly rectilinear electron beams can be achieved.

Furthermore, FIG. 2(a) illustrates an electric field in the vacuum space Sv. However, such an electric field is not necessarily required. Furthermore, the electrons e can only move rectilinearly or directly backward by the quantum confinement effect of the quantum wire 20. Therefore, the movements of the electrons e are limited so that the electrons e do not scatter at large angles.

Furthermore, in the present embodiment, as shown in the energy band diagram of FIG. 2b, a triangle potential $P_t$ formed by an electric field existing in the vacuum space Sv can be used for transmitting the electrons by the tunnel effect. This method is advantageous in that it does not require a high vacuum space or an intense electric field, which are indispensable in the case of a conventional electric field emission type electron source for extracting electrons from an electron source. Such advantages can be attained because immediately before the electrons e are emitted into vacuum space, the electrons e are accelerated to the same level as the energy corresponding to the work function of the substance forming the electron emitting surface.

Furthermore, the surface emission type electron source according to an embodiment of the present invention does not require heating, while a conventional hot cathode electric field emission type electron source heats the electron source to a high temperature for extracting electrons into a vacuum space. Therefore, the surface emission type electron source according to an embodiment of the present invention may emit electrons in a stable manner during a long operating life.

As described above, in the surface emission type electron source 10 according to the present embodiment, the quantum wires 20 in the electron passage layer 16 have structures with which highly rectilinear electrons e can be extracted from the front surface 12a of the front electrode 12 (electron emitting surface) in a substantially orthogonal direction from each of the quantum wires 20. Accordingly, by using the surface emission type electron source 10, a high-resolution pattern can be formed at once at the same magnification, with the use of highly rectilinear electron beams. Furthermore, by changing the size of the front electrode 12 (electron passage layer 16) of the surface emission type electron source 10, even when the region onto which the pattern is to be formed is large, it is possible to form a pattern at once at the same magnification. As described above, by using the surface emission type electron source 10, even when the region onto which the pattern is to be formed is large, it is possible to form a pattern at once at the same magnification and also with high resolution, with the use of electron beams.

Furthermore, in the present embodiment, electrons e can be extracted from the front surface 12a of the front electrode 12 (electron emitting surface) in a substantially orthogonal direction. Therefore, while the conventional technology requires an electron lens on the outside of the electron source for forming electron beams, the surface emission type electron source 10 according to the present embodiment does not necessarily require such an electron lens, and therefore the structure can be simplified.

Furthermore, in the surface emission type electron source 10 according to the present embodiment, with the structure of the electron passage layer 16, the electrons are prevented from scattering, and therefore the emitted electrons can be highly rectilinear. Accordingly, there is no need for a magnetic field for correcting the directions of the emitted electrons. Even if there is a need for a magnetic field, the magnetic field only needs to have a low intensity of less than 0.1 T, and the uniformity of such a magnetic field does not need to be precise. Thus, the structure can be simplified.

Furthermore, the surface emission type electron source 10 according to the present embodiment does not require heating, while a conventional hot cathode electric field emission type electron source heats the electron source to a high temperature for extracting electrons into a vacuum space. Therefore, the surface emission type electron source according to an embodiment of the present invention may emit electrons in a stable manner during a long operating life. Furthermore, as a heating process is not required, the structure can be simplified.

The shape of the surface emission type electron source shown in FIG. 1 can be changed so that a consistent distance is maintained to an exposure target having a large region. For example, by providing the back electrode 14 of the surface emission type electron source 10 on a plastic substrate (not shown), and changing the shape of the plastic substrate, a consistent distance can be maintained to an exposure target having a large region.

Next, a description is given of a method of manufacturing the surface emission type electron source 10 according to the present embodiment.

First, for example, a thin film of tungsten having a thickness of 300 nm is formed on a quartz substrate (not shown) by a heat CVD method. The thin film of tungsten corresponds to the back electrode 14 (see FIG. 1).

Next, on the back electrode 14, the quantum wires 20 (see FIG. 1) are formed with silicon, at intervals s of, for example, approximately 1 nm.

In this case, the substrate (back electrode) 14 is first put into a vacuum chamber for CVD. Subsequently, for example, $SiH_4$ gas is injected into the chamber for 40 seconds. According to the thermal decomposition of the $SiH_4$ gas, for example, silicon particles with diameters of approximately 3 nm are grown on the back electrode 14. Then, the injection of the $SiH_4$ gas into the vacuum chamber for CVD is stopped, so that the chamber returns to its original vacuum state.

Next, for example, oxygen plasma is radiated onto the back electrode 14 for 60 seconds to oxidize the surfaces of the silicon particles. Even if adjacent silicon particles contact each other before the radiation of oxygen plasma, the oxidation progresses by starting from the interface between the silicon particles, so that an oxide film is formed between adjacent silicon particles. Thus, an oxide film of approximately 1 nm is formed at the interfaces between the silicon particles.

The process of growing the silicon particles by thermal decomposition of $SiH_4$ gas and the process of oxidizing the surfaces of the silicon particles are repeated. When the surface of the back electrode 14 is filled with silicon particles, the silicon oxide film at the outermost surface is removed by reactive ion etching with the use of $CF_4$ gas. Thus, on the surface of the silicon formation film, the top parts of the silicon particles are exposed. When removing the silicon oxide film at the outermost surface, the oxide films located between the silicon particles are not removed. Accordingly, a first layer is formed, which is filled with silicon particles. Incidentally, the growth of the silicon particles occurs in a substantially isotropic manner.

Next, the second layer and onwards are formed in the same manner as the first layer. For example, $SiH_4$ gas is injected, and silicon particles are caused to grow by the thermal decomposition of the $SiH_4$ gas, on top of the silicon particles of the first layer. After the growth of the silicon particles, oxygen plasma is radiated to oxidize the surfaces of the silicon particles. The process of growing of the silicon particles and the process of oxidizing the surfaces of the silicon particles are repeated. When the second layer is filled with silicon particles, the silicon oxide film at the outermost surface is removed by reactive ion etching with the use of $CF_4$ gas. The cores of the silicon particles that have grown on the silicon oxide film are removed together with the silicon oxide film by the reactive ion etching process.

The above-described procedure is repeated until, for example, ten layers are formed. After forming the tenth layer, the silicon oxide films located between silicon wires are removed by a wet etching process with the use of a HF solution. At this point, a structure is formed, including multiple separate silicon wires that are juxtaposed, each having a diameter of approximately 3 nm. As described above, each silicon wire is constituted by silicon particles that are serially stacked on one another, thereby forming the quantum wires 20. The length of the quantum wires 20, i.e., the final thickness of the electron passage layer 16 is, for example, approximately 50 nm.

The intervals s between adjacent quantum wires 20 are approximately 1 nm. The quantum wires 20 are arranged so as to extend in the first direction X (see FIG. 1) that is substantially perpendicular with respect to the front surface 14a of the back electrode 14 and the front surface 12a of the front electrode 12 serving as the electron emitting surface. Then, a gold thin film having a thickness of 10 nm is formed on the electron passage layer 16 by a vacuum evaporation method to thereby form the front electrode 12.

For example, the surface emission type electron source 10 according to the present embodiment manufactured by the above manufacturing method is placed in a vacuum chamber. A potential difference is applied between the front electrode 12 and the back electrode 14, where a positive potential is applied to the front electrode 12. Electrons are injected from the back electrode 14 into the electron passage layer 16 constituted by multiple quantum wires 20, and the electrons are accelerated by the potential difference between the back electrode 14 and the front electrode 12. The work function of the front electrode 12 made of a metal thin film is, for example, 5 eV. Thus, when the electrons e acquire energy that is substantially equal to 5 eV, the electrons e are emitted from the front surface 12a of the front electrode 12.

Next, a description is given of a second embodiment of the present invention.

Figure 3:
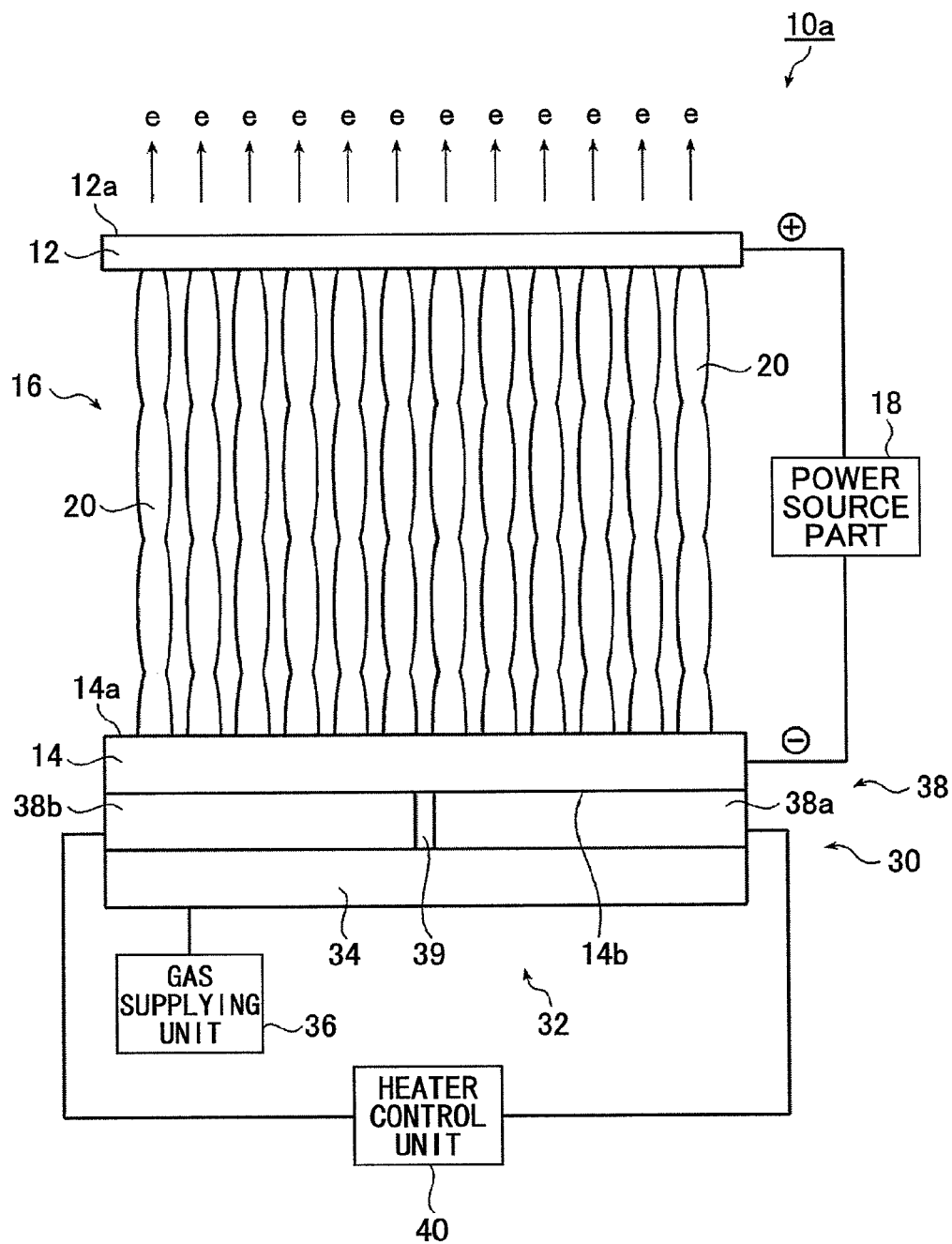
FIG. 3 is a schematic diagram of a surface emission type electron source according to a second embodiment of the present invention.

FIG. 3 is a schematic diagram of a surface emission type electron source according to a second embodiment of the present invention.

In the present embodiment, the same elements as those of the surface emission type electron source according to the first embodiment shown in FIG. 1 are denoted by the same reference numerals and are not further described.

A surface emission type electron source 10a shown in FIG. 3 is different from the surface emission type electron source 10 (see FIG. 1) according to the first embodiment in that the electron passage layer 16 has a temperature adjusting unit 30 for maintaining the temperature at less than or equal to room temperature. Otherwise, the surface emission type electron source 10a according to the second embodiment has the same configuration as that of the surface emission type electron source 10 according to the first embodiment, and detailed descriptions are omitted.

A temperature less than or equal to room temperature according to the present invention corresponds to a temperature $T_1$ and a temperature $T_2$ described below.

A temperature $T_1$ that is less than or equal to room temperature satisfies $$\epsilon_1 > k \cdot T_1$$

where $\epsilon_1$ is the electron energy levels dispersed in the quantum wire 20 and k is a Boltzmann constant.

A temperature $T_2$ that is less than or equal to room temperature satisfies $$\epsilon_2 > k \cdot T_2$$

where $\epsilon_2$ is the energy between the trap level of the electrons in the electron passage layer 16 and the electron energy level in the quantum wires 20.

As shown in FIG. 3, the temperature adjusting unit 30 includes a cooling unit 32 and heater unit 38.

The cooling unit 32 includes, for example, a cooler 34 of a Joule-Thomson effect type, and a gas supplying unit 36 for supplying high-pressure gas to the Joule-Thomson effect type cooler 34. The gas supplying unit 36 is filled with, for example, nitrogen gas.

The heater unit 38 is provided on a back surface 14b of the back electrode 14. The heater unit 38 includes heater parts 38a and 38b in each of which a heater and a thermocouple are combined, and a heater control unit 40 for adjusting the heating value of each of the heater parts 38a and 38b based on the temperature detected by the thermocouple in each of the heater parts 38a and 38b. The heater parts 38a and 38b are thermally insulated by a partitioning part 39.

In the present embodiment, when high-pressure nitrogen gas is supplied from the gas supplying unit 36 to the cooler 34, the surface emission type electron source 10a can be cooled to 77 K according to the Joule-Thomson effect. However, with such a simple cooling process, the entire surface emission type electron source 10a may not have a uniform temperature, because heat may be generated by driving the surface emission type electron source 10a and heat may be transmitted through holders fixing the surface emission type electron source 10a.

The amount of electrons e emitted from the surface emission type electron source 10a depends on the amount of electrons injected from the back electrode 14 to the electron passage layer 16. However, the amount of electrons injected from the back electrode 14 to the electron passage layer 16 depends on the temperature, and therefore the amount of emitted electrons varies according to the position on the front surface 12a of the front electrode 12 of the surface emission type electron source 10a.

Furthermore, the volume of the materials constituting the surface emission type electron source 10a may change according to the temperature. Therefore, when the temperature in the surface emission type electron source 10a becomes non-uniform, the change in volume of the materials constituting the surface emission type electron source 10a may vary. That is, the volume of the materials may change in a non-uniform manner, and consequently the surface emission type electron source 10a may become distorted. In order to eliminate such a deficiency caused by non-uniform temperature levels, the back electrode 14 of the surface emission type electron source 10a is provided with the plural heater parts 38a and 38b.

As shown in FIG. 3, two heater parts 38a and 38b are provided in the present embodiment, but the number of heater parts is not so limited. More than two heater parts may be provided in the present embodiment.

In the present embodiment, for example, the surface emission type electron source 10a may be square-shaped. The region on the back surface 14b of the back electrode 14 may be a two-dimensional matrix sectioned into 100×100 coordinate regions, and a heater part (combination of heater and thermocouple) may be provided in each section.

The coordinate region corresponding to each section is expressed as (vertical coordinate, horizontal coordinate)=(i, j), and the temperature in each coordinate region is expressed as T(i, j). The sum of the temperature differences between a predetermined coordinate region (i, j) and coordinate regions adjacent to the predetermined coordinate region, which is expressed as $$-4 \times T(i,j)+T(i-1,j)+T(i+1,j)+T(i,j-1)+T(i,j+1)$$

is obtained by the heater control unit 40, based on the temperature values measured by the thermocouples.

Then, a heating value proportional to the sum of the temperature differences is applied with the heater in the coordinate region (i, j). When the temperature becomes uniform across all of the coordinate regions, heat supplies from all heater parts are stopped. Accordingly, a uniform temperature distribution can be achieved.

In the present embodiment, when high-pressure nitrogen gas is used, a uniform temperature distribution of approximately 100 K can be achieved in the electron passage layer 16 by performing the above method.

Furthermore, a lower temperature can be achieved in the electron passage layer 16 by changing the type of high-pressure gas supplied to the cooler 34.

In the present embodiment, the cooler 34 is of a Joule-Thomson effect type; however, the cooler is not so limited. A cooler of any other method may be used as long as the target temperature is, for example, about 77 K. For example, a Gifford-McMahon refrigerator may be used as the cooler 34.

In the present embodiment, the amount of electrons emitted from the surface emission type electron source 10a depends on the amount of electrons injected from the back electrode 14 to the electron passage layer 16, and also depends on the temperature. Therefore, the amount of emitted electrons varies according to the position on the front surface 12a of the front electrode 12 of the surface emission type electron source 10a. Furthermore, the volume of the materials constituting the surface emission type electron source 10a changes according to the temperature, and consequently the surface emission type electron source 10a may become distorted. However, in the present embodiment, the temperature adjusting unit 30 is provided, and therefore the temperature is maintained uniform, the amount of emitted electrons is prevented from varying according to the position on the surface emission type electron source 10a, and the surface emission type electron source 10a is prevented from being distorted.

In practical situations, the electrons can jump across different energy levels formed by several structural deficiencies included in the electron passage layer 16, with the assistance of thermal energy. Such electrons typically become ineffective currents without acquiring a sufficient amount of energy for being emitted into a vacuum space. Additionally, the electrons having various momentum vectors and energy levels are emitted into a vacuum space with the assistance of thermal energy, which causes a decrease in the resolution of the electron beams emitted from the electron emitting surface, and also causes chromatic aberration in the surface electron beams when the relative positions of the surface emission type electron source and the exposure target change. However, in the present embodiment, the temperature adjusting unit 30 is provided for keeping the temperature uniform, which prevents a decrease in the resolution of the electron beams and also prevents chromatic aberration.

Furthermore, the temperature T of the electron source is uniformly adjusted so as to satisfy $\epsilon > k \cdot T$ with respect to the energy $\epsilon$ between the electron energy levels dispersed in the quantum wire 20. Accordingly, phonon scattering is prevented from occurring between the electron energy levels, so that the resolution of the electron beams is increased.

In the present embodiment, the surface emission type electron source 10a is put into a vacuum chamber, and a positive potential is applied to the front electrode 12. A voltage is applied from the power source part 18 to the part between the front electrode 12 and the back electrode 14. Accordingly, electrons are injected from the back electrode 14 to the electron passage layer 16 including many quantum wires 20. The electrons are accelerated by the potential difference between the back electrode 14 and the front electrode 12.

In this case, the temperature adjusting unit 30 can cause the electron passage layer 16 to have a uniform temperature distribution of, for example, approximately 100 K. In this state, the amount of emitted electrons is prevented from varying, the surface emission type electron source 10a is prevented from being distorted, and moreover, chromatic aberration is prevented from occurring. Thus, the surface emission type electron source 10a according to the present embodiment can form a pattern at once at the same magnification and also with high resolution, with the use of electron beams that are more highly rectilinear than those the surface emission type electron source 10 according to the first embodiment. Additionally, by changing the size of the front electrode 12 (electron passage layer 16) of the surface emission type electron source 10a, the surface emission type electron source 10a can form a pattern at once at the same magnification even when the region onto which the pattern is to be formed is large. It goes without saying that the surface emission type electron source 10a according to the present embodiment can form a pattern at once at the same magnification and also with high-resolution, with the use of more highly rectilinear electron beams than those of the surface emission type electron source 10 according to the first embodiment, even when the region onto which the pattern is to be formed is large.

The manufacturing method of the surface emission type electron source 10a according to the present embodiment includes a procedure of mounting the temperature adjusting unit 30, but is otherwise the same as the manufacturing method of the surface emission type electron source 10 according to the first embodiment, and is thus not further described.

Next, a description is given of a third embodiment of the present invention.

Figure 4:
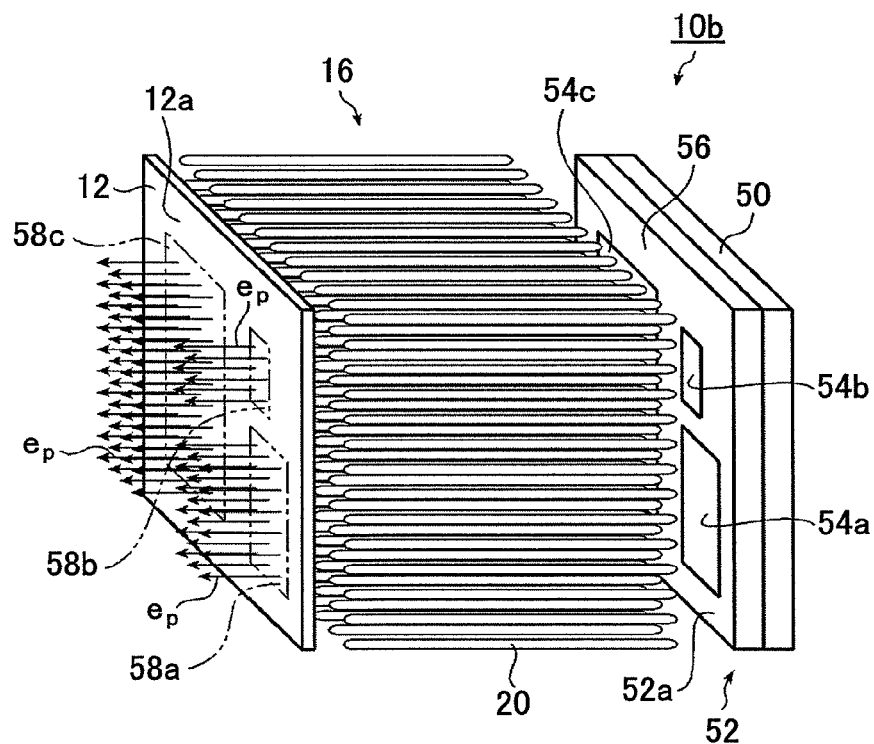
FIG. 4(a) is a schematic perspective view of a surface emission type electron source according to a third embodiment of the present invention.
FIG. 4(b) is a schematic side view of the surface emission type electron source shown in FIG. 4(a)
Figure 4:
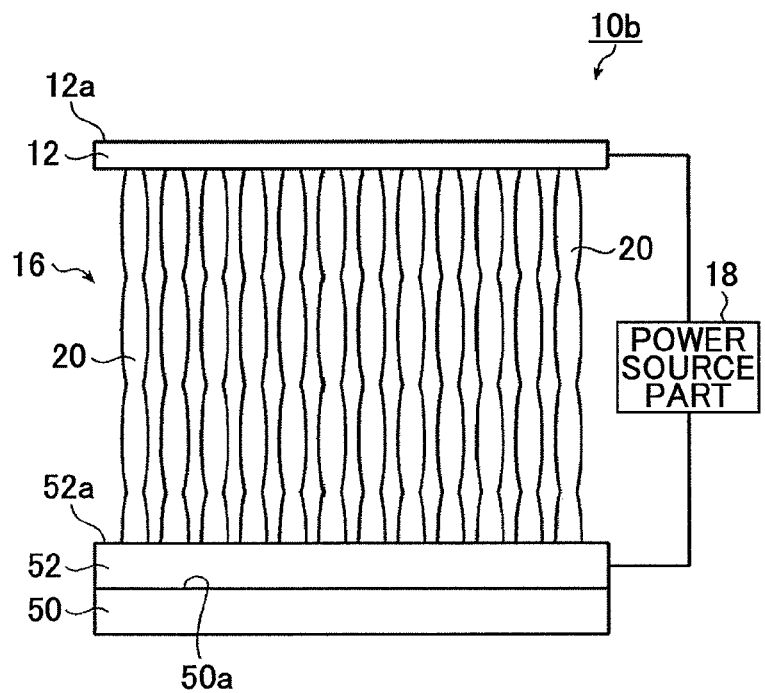

FIG. 4(a) is a schematic perspective view of a surface emission type electron source according to the third embodiment of the present invention, and FIG. 4(b) is a schematic side view of the surface emission type electron source shown in FIG. 4(a). In FIG. 4(a), the components appear to be separate from each other; however, the components are separately illustrated for the purpose of description, but are actually connected. Furthermore, the power source part 18 is not shown in FIG. 4(a).

In the present embodiment, the same elements as those of the surface emission type electron source according to the first embodiment shown in FIG. 1 are denoted by the same reference numerals and are not further described.

A surface emission type electron source 10b shown in FIGS. 4(a) and 4(b) is different from the surface emission type electron source 10 (see FIG. 1) according to the first embodiment in that a back electrode 52 is formed on a back auxiliary electrode 50, the back electrode 52 has a different configuration from that of the other electrodes, and the power source part 18 is connected to the front electrode 12 and the back auxiliary electrode 50. Otherwise, the surface emission type electron source 10b according to the second embodiment has the same configuration as that of the surface emission type electron source 10 according to the first embodiment, and detailed descriptions are omitted.

In the present embodiment, the back electrode 52 includes conductive bodies 54a, 54b, and 54c and an insulator 56 provided at parts other than the conductive bodies 54a, 54b, and 54c. The back electrode 52 is connected to a front side 50a of the back auxiliary electrode 50. The configuration of the conductive bodies 54a, 54b, and 54c is not particularly limited as long as they are made of a metal or an alloy having electrical conductivity. Furthermore, the insulator 56 is made of, for example, SiN or $SiO_2$.

In the present embodiment, the surface emission type electron source 10b is put into a vacuum chamber, and a positive potential is applied to the front electrode 12. A voltage is applied from the power source part 18 to the part between the front electrode 12 and the back auxiliary electrode 50. Accordingly, electrons are injected from the back electrode 52 via the back auxiliary electrode 50 to the electron passage layer 16 including many quantum wires 20. The electrons are accelerated by the potential difference between the back electrode 52 and the front electrode 12.

In this case, the electrons e that have passed through the quantum wires 20 in the electron passage layer 16 are not scattered in a direction including a horizontal component with respect to the front surface 12a (electron emitting surface) of the front electrode 12. Therefore, while maintaining the form of a two dimensional pattern formed by the conductive bodies 54a, 54b, and 54c disposed on the back electrode 52, the electrons can be emitted as patterned surface electron beams $e_p$ that are highly rectilinear, from regions 58a, 58b, and 58c of the front electrode 12 corresponding to the conductive bodies 54a, 54b, and 54c, respectively. Accordingly, when forming a predetermined pattern on a desired surface, a pattern having increased resolution can be formed with the electron beams.

Conventionally, to create patterns based on electron beams, the shape of the surface electrode is changed or a mask is provided on the surface electrode. However, in the present embodiment, there is no need to change the shape of the surface electrode or to provide a mask on the surface electrode, and therefore the structure can be simplified.

It goes without saying that with the present embodiment, the same effects as those of the surface emission type electron source 10 according to the first embodiment can be achieved, other than the above-described effects.

The manufacturing method of the surface emission type electron source 10b according to the present embodiment is the same as the manufacturing method of the surface emission type electron source 10 according to the first embodiment except that the manufacturing method of the back electrode 52 is manufactured by a different method, and therefore detailed descriptions are omitted.

The back electrode 52 may be formed with the use of, for example, a semiconductor substrate. When forming the back electrode 52 with the use of a semiconductor substrate, impurities are added to the regions corresponding to the conductive bodies 54a, 54b, and 54c, in amounts with which electrical conductivity can be expressed.

The back electrode 52 may be formed with the use of, for example, an insulating substrate. When forming the back electrode 52 with the use of an insulating substrate, a material having electrical conductivity such as a metal or an alloy is laminated on the regions corresponding to the conductive bodies 54a, 54b, and 54c.

Figure 5:
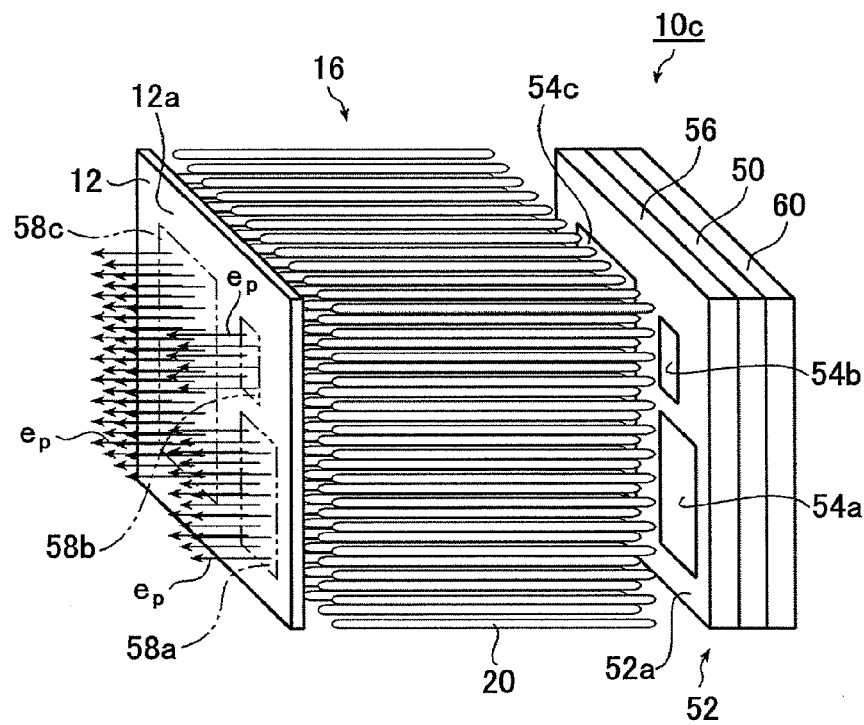
FIG. 5(a) is a schematic perspective view of a modification of the surface emission type electron source according to the third embodiment of the present invention.
FIG. 5(b) is a schematic side view of the surface emission type electron source shown in FIG. 5(a)
Figure 5:
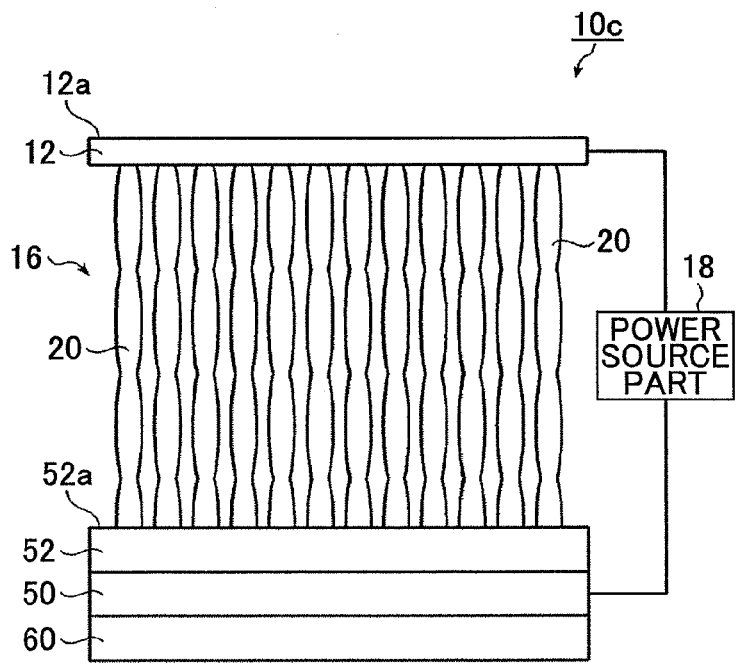

Furthermore, in the third embodiment according to the present invention, the back auxiliary electrode 50 may be provided with a substrate 60 as in a surface emission type electron source 10c shown in FIGS. 5(a) and 5(b).

In this case also, the shape of the back electrode 52 of the surface emission type electron source 10c is an arbitrary two-dimensional pattern, and the insulator 56 is provided at parts other than the conductive bodies 54a, 54b, and 54c. Furthermore, the back auxiliary electrode 50 is provided between the back electrode 52 and the substrate 60. The back auxiliary electrode 50 and the back electrode 52 are electrically connected. When a voltage is applied in between the back auxiliary electrode 50 and the front electrode 12, the electrons injected from the back electrode 52 pass through the quantum wires 20 of the electron passage layer 16. As described above, in the electron passage layer 16, the electrons do not scatter in the direction including a horizontal component with respect to the electron emitting surface. Therefore, while maintaining the form of a two dimensional pattern formed by the configuration of the back electrode 52, the electrons can be emitted as patterned surface electron beams $e_p$ from the regions 58a, 58b, and 58c of the front electrode 12 corresponding to the conductive bodies 54a, 54b, and 54c, respectively.

Thus, also in the surface emission type electron source 10c according to the third embodiment of the present invention, there is no need to change the shape of the surface electrode or to provide a mask on the surface electrode to form patterns with the electron beams. Therefore, a substantially completely uniform electric field is formed between the surface emission type electron source and the exposure target, and the resolution of the exposure pattern can be increased when exposing the exposure target to electron beams.

It goes without saying that in the present embodiment, the same effects as those of the surface emission type electron source 10 according to the first embodiment can be achieved.

Next, a description is given of a fourth embodiment of the present invention.

FIG. 6(a) is a schematic perspective view of a surface emission type electron source according to the fourth embodiment of the present invention, and FIG. 6(b) is a schematic side view of the surface emission type electron source shown in FIG. 6(a). In FIG. 6(a), the components appear to be separate from each other; however, the components are separately illustrated for the purpose of description, but are actually connected. Furthermore, the power source part 18 and a layer 66 are not shown in FIG. 6(a).

In the present embodiment, the same elements as those of the surface emission type electron source according to the first embodiment shown in FIG. 1 are denoted by the same reference numerals and are not further described.

A surface emission type electron source 10d shown in FIGS. 6(a) and 6(b) is different from the surface emission type electron source 10 (see FIG. 1) according to the first embodiment in that the back electrode 14 is formed on a substrate 5, a front electrode 62 has a different configuration from that of the other electrodes, and that the layer 66 is formed between the front electrode 62 and the quantum wires 20. Otherwise, the surface emission type electron source 10d according to the fourth embodiment has the same configuration as that of the surface emission type electron source 10 according to the first embodiment, and detailed descriptions are omitted.

In the present embodiment, the substrate 5 may be constituted by a glass substrate such as quartz glass, a semiconductor substrate, a plastic substrate, or a metal plate.

As shown in FIG. 6(b), the front electrode 62 has protrusions 64 formed at positions corresponding to the quantum wires 20, but otherwise has the same configuration as that of the front electrode 12 according to the first embodiment, and is thus not further described.

The layer 66 is formed between the front electrode 62 and the quantum wires 20 in the electron passage layer 16, and is constituted by a semiconductor or an insulator. The layer 66 has recessions 68 corresponding to the protrusions 64 of the front electrode 62, and the protrusions 64 are fit into the recessions 68.

In the surface emission type electron source 10d according to the present embodiment, the power source part 18 is connected to the front electrode 62 and the back electrode 14. A positive potential is applied to the front electrode 62, and a voltage is applied from the power source part 18 to the front electrode 62 and the back electrode 14. Accordingly, the electrons e are accelerated in the quantum wires 20 in the electron passage layer 16, and the electrons e are emitted from a surface 62a of the front electrode 62.

Figure 7:
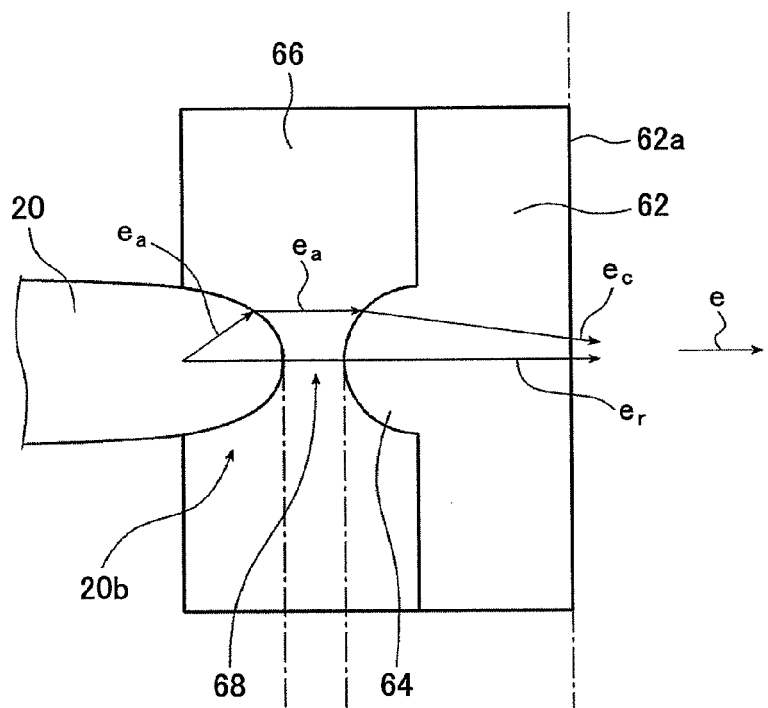
FIG. 7(a) is a schematic partial enlarged view for describing operations of the surface emission type electron source according to the fourth embodiment of the present invention.
FIG. 7(b) is an energy band diagram for describing the operations of the surface emission type electron source according to the fourth embodiment of the present invention, where the vertical axis represents the energy of the electrons and the horizontal axis represents the position.
Figure 7:
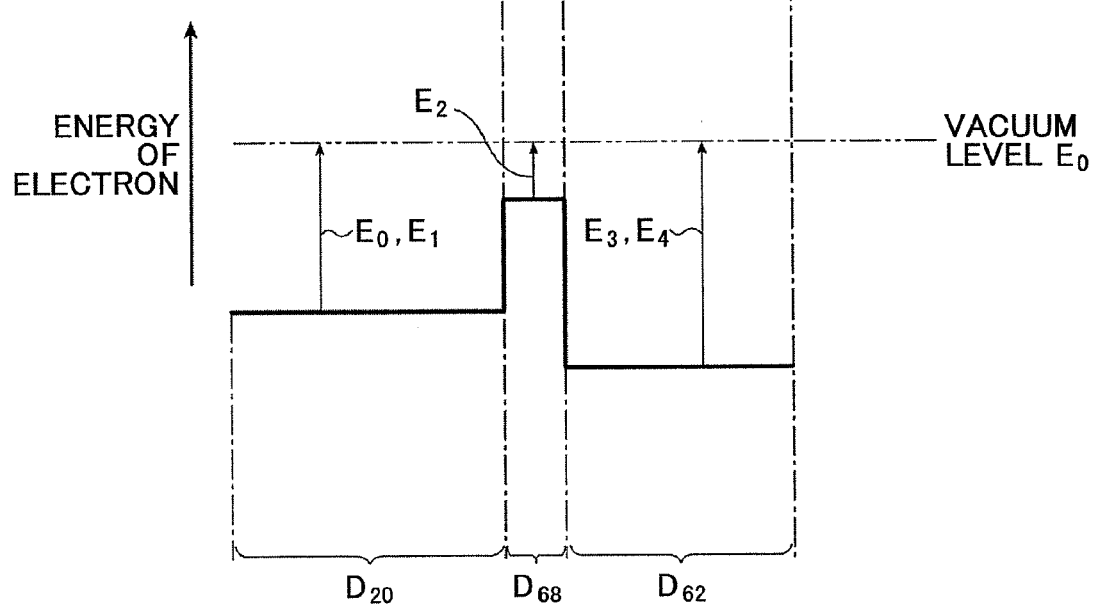

FIG. 7(a) is a schematic partial enlarged view for describing operations of the surface emission type electron source according to the fourth embodiment of the present invention. FIG. 7(b) is an energy band diagram for describing the operations of the surface emission type electron source according to the fourth embodiment of the present invention, where the vertical axis represents the energy of the electrons and the horizontal axis represents the position.

In the energy band diagram shown in FIG. 7(b), a reference numeral $D_{62}$ denotes a region corresponding to the front electrode 62, a reference numeral $D_{68}$ denotes a region corresponding to the recession 68 between the quantum wire 20 and the protrusion 64, and a reference numeral $D_{20}$ denotes a region corresponding to the quantum wire 20 in the electron passage layer 16.

In the present embodiment, as shown in FIG. 7(b), the recessions 68 are provided between the quantum wires 20 and the front electrode 62 so as to satisfy $E_2<E_0$ or $E_2<E_1$. Specifically, with respect to $E_2<E_0$, when the quantum wires 20 are made of metal, $E_0$ is the energy of a vacuum level measured from the Fermi level of the metal. With respect to $E_2<E_1$, when the quantum wires 20 are made of a semiconductor or an insulator, $E_1$ is the energy of a vacuum level measured from the bottom of the conduction band of the semiconductor or the insulator. $E_2$ is the energy of the vacuum level measured from the bottom of the conduction band of the semiconductor or the insulator constituting the recession 68. Accordingly, the directions of the electrons e moving from the quantum wire 20 toward the front electrode 62 can be converged, and the directions of the electrons e after the electrons e have been emitted into a vacuum space from the front electrode 62 are adjusted so as to be substantially perpendicular with respect to the front electrode 62.

The wavelength of an electron, which has been accelerated to the energy $E_0$ of the vacuum level in the quantum wire 20, is increased when the electrons are injected into the recession 68. Thus, when an electron $e_a$ moves from a leading end 20b of the quantum wire 20 toward the front electrode 62, and is emitted in a separating direction from the direction perpendicular to the front electrode 62, the electron $e_a$ is converged toward the direction perpendicular to the front electrode 62 by passing through the recession 68. Accordingly, the electron $e_a$ is turned into a converged electron $e_c$.

The extent of convergence may be adjusted by changing the value of the energy $E_2$ of the vacuum level measured from the bottom of the conduction band of the semiconductor or the insulator, or the curvature of the recession 68, or the thickness of the recession 68. Furthermore, the extent of convergence of the electron e may be changed by adjusting the potential difference between the layer 66 and the quantum wire 20 or the potential difference between the protrusion 64 and the layer 66.

For example, recessions may be provided on the front electrode 62 so as to satisfy $E_2<E_3$ or $E_2<E_4$. Specifically, with respect to $E_2<E_3$, when the front electrode 62 is made of a metal material, $E_3$ is the energy of a vacuum level measured from the Fermi level of the metal. With respect to $E_2<E_4$, when the front electrode 62 is made of a semiconductor material, $E_4$ is the energy of a vacuum level measured from the bottom of the conduction band of the semiconductor. Accordingly, convergence of the electrons can be intensified, and the electrons e emitted from the surface 62a of the front electrode 62 can be even more highly rectilinear in movement compared to the case of the first embodiment.

In the present embodiment, the surface emission type electron source 10d is put into a vacuum chamber, and a positive potential is applied to the front electrode 62. A potential difference is applied between the front electrode 62 and the back electrode 14, from the power source part 18. Accordingly, electrons are injected from the back electrode 14 to the electron passage layer 16 including many quantum wires 20. The electrons are accelerated by the potential difference between the back electrode 14 and the front electrode 62. If the electrons acquire energy greater than or equal to the work function of the front electrode 62 in the electron passage layer 16, the electrons are emitted from the surface 62a of the front electrode 62. When the electrons are emitted, the electron beams are converged by the structure of the recessions 68 shaped as concave lenses, so that the electrons e do not have movement components in a horizontal direction with respect to the surface of the front electrode 62.

Thus, the surface emission type electron source 10d according to the present embodiment can form a pattern at once at the same magnification and also with high resolution, with the use of even more highly rectilinear electron beams than those of the surface emission type electron source 10 according to the first embodiment. Additionally, by changing the size of the front electrode 62 (electron passage layer 16) of the surface emission type electron source 10d, the surface emission type electron source 10d can form a pattern at once at the same magnification, even when the region onto which the pattern is to be formed is large. It goes without saying that the surface emission type electron source 10d according to the present embodiment can form a pattern at once at the same magnification and also with high resolution, with the use of even more highly rectilinear electron beams than those of the surface emission type electron source 10 according to the first embodiment, even when the region onto which the pattern is to be formed is large.

In the present embodiment, the protrusions 64 are formed on the front electrode 62, and the protrusions 64 are fitted into the recessions 68. However, the present invention is not so limited. For example, the thickness of the front electrode 62 may be reduced without providing protrusions, so that the shape of the surface of the front electrode 62 is locally recessed.

Next, a description is given of a manufacturing method of the surface emission type electron source 10d according to the present embodiment.

The manufacturing method according to the present embodiment is the same as that of the first embodiment up to the procedure before forming the electron passage layer 16, and therefore detailed descriptions are omitted.

In the present embodiment, for example, a tungsten thin film having a thickness of 300 nm is formed on the substrate 5 made of quartz glass, to form the back electrode 14. The electron passage layer 16 is formed on the front surface 14*a* of the back electrode 14.

Figure 6:
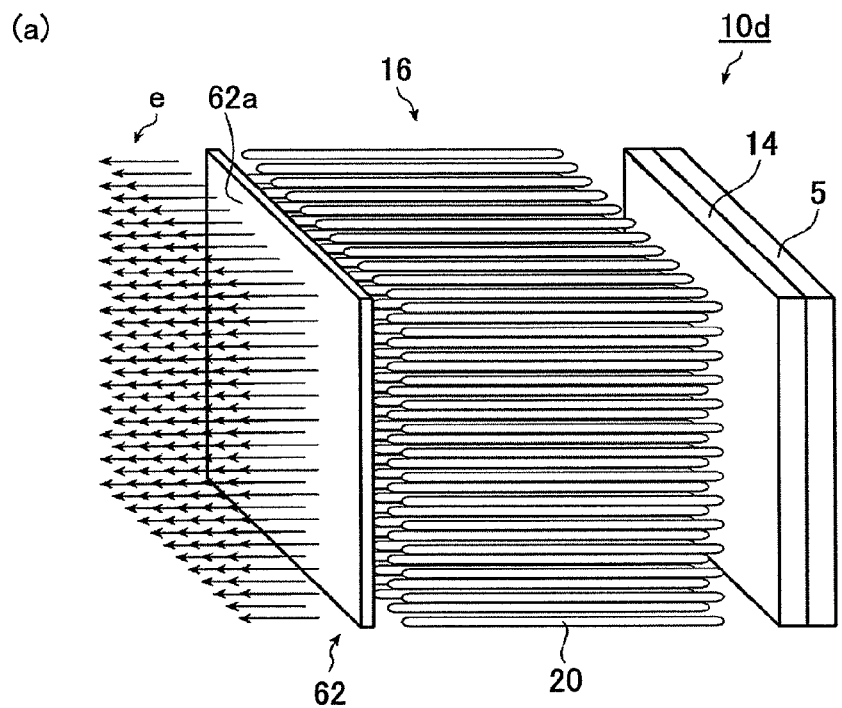
FIG. 6(a) is a schematic perspective view of a surface emission type electron source according to a fourth embodiment of the present invention.
FIG. 6(b) is a schematic side view of the surface emission type electron source shown in FIG. 6(a)
Figure 6:
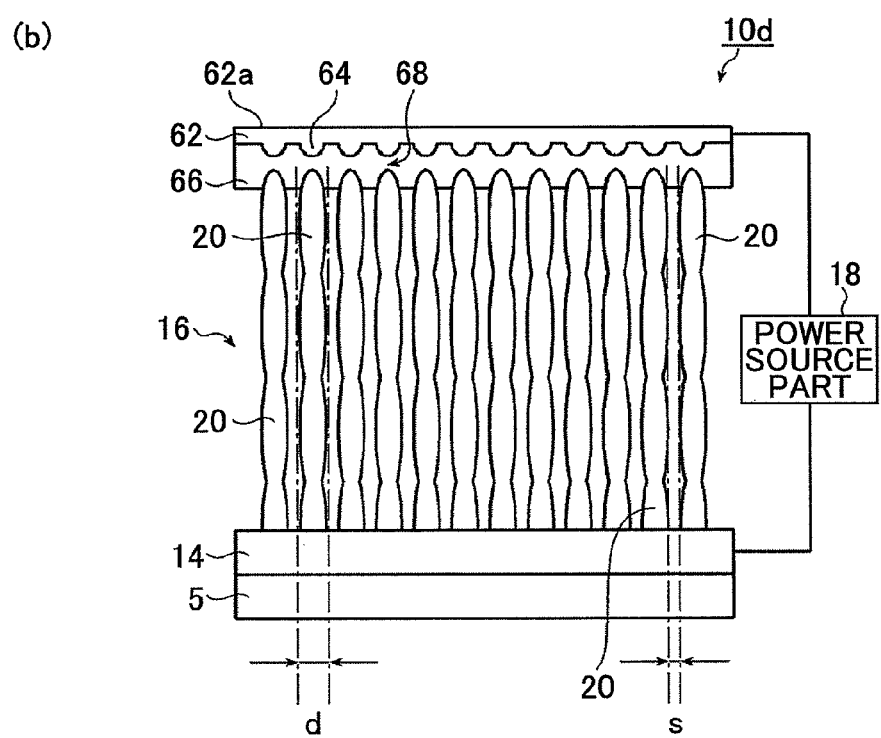

In the electron passage layer 16, for example, a silicon wire may be used as the quantum wire 20. As shown in FIG. 6(*b*), each interval s between adjacent quantum wires 20 is, for example, 1 nm. The largest thickness d of the quantum wires 20 is 10 nm.

The electron passage layer 16 is formed as follows. That is, a first layer filled with silicon particles is formed, and then silicon particles are grown on top of the silicon particles of the first layer. Growth of silicon particles is repeated until a tenth layer of silicon particles is formed. Accordingly, each silicon wire is constituted by silicon particles that are serially stacked on one another, thereby forming the quantum wires 20.

After forming the tenth layer of silicon particles, i.e., after the electron passage layer 16 is formed, silicon oxide films located between the silicon wires are removed by a wet etching process with the use of a HF solution. At this point, a structure is formed, including multiple separate silicon wires each having diameters of approximately 3 nm that are juxtaposed.

The top edge of each quantum wire 20 (silicon wire) is hemispherical.

Next, oxygen plasma is radiated onto the surface of the top edges of the quantum wires 20 (silicon wires), thereby forming an oxide film having a thickness of approximately 1 nm. Thus, the spaces between the quantum wires 20 (silicon wires) are filled with an oxide film only at the top edge parts.

Next, the silicon oxide film at the outermost surface is removed by reactive ion etching with the use of $CF_4$ gas. When removing the silicon oxide film at the outermost surface, the oxide films located between the silicon particles are not removed.

Next, for example, $SiH_4$ gas is injected, and the silicon particles are caused to grow by the thermal decomposition of the $SiH_4$ gas. The diameters of the silicon particles being grown are approximately 3 nm.

After the growth of the silicon particles, oxygen plasma is radiated to oxidize the surfaces of the silicon particles. The oxygen plasma is radiated for a longer time than that defined as the oxidation condition for forming the electron passage layer 16. Accordingly, a silicon oxide film having a thickness of approximately 2 nm is formed between the silicon particles that have just been grown and the top edges of the silicon wires that have already been formed. Thus, in the manufacturing method according to the present embodiment, the formed silicon particles are not connected to the quantum wires 20.

Next, when the surface of the electron passage layer 16 is filled with silicon particles, the silicon oxide film at the outermost surface is removed by reactive ion etching with the use of $CF_4$ gas. As described above, when removing the silicon oxide film at the outermost surface, the silicon oxide films located between the silicon particles are not removed. The cores of the silicon particles that have grown on the silicon oxide film are removed together with the silicon oxide film by the reactive ion etching process. Thus, on the surface of the electron passage layer 16, the top parts of the silicon particles are exposed. Accordingly, the layer 66 having recessions on both sides is formed, whereby the recessions are shaped as substantially spherical concave lenses.

Next, the silicon particles are removed by reactive ion etching with the use of $CF_4$ gas. Subsequently, a gold thin film having a thickness of 10 nm is formed on the layer 66 having recessions shaped as concave lenses by a vacuum evaporation method to thereby form the front electrode 62. In this procedure, a heating process is performed during the vacuum evaporation, so that the recessions 68 shaped as concave lenses are filled with gold. Accordingly, the surface emission type electron source 10*d* shown in FIGS. 6(*a*) and 6(*b*) is formed.

In the surface emission type electron source 10*d* according to the present embodiment, for example, when electrons emitted from the surface emission type electron source 10*d* are accelerated by a voltage of 50 kV, and an image is formed on a semiconductor wafer having electron beam resist PMMA (polymethyl methacrylate) applied thereon, a resolution of approximately 5 nm can be achieved.

Next, a description is given of a fifth embodiment of the present invention.

Figure 8:
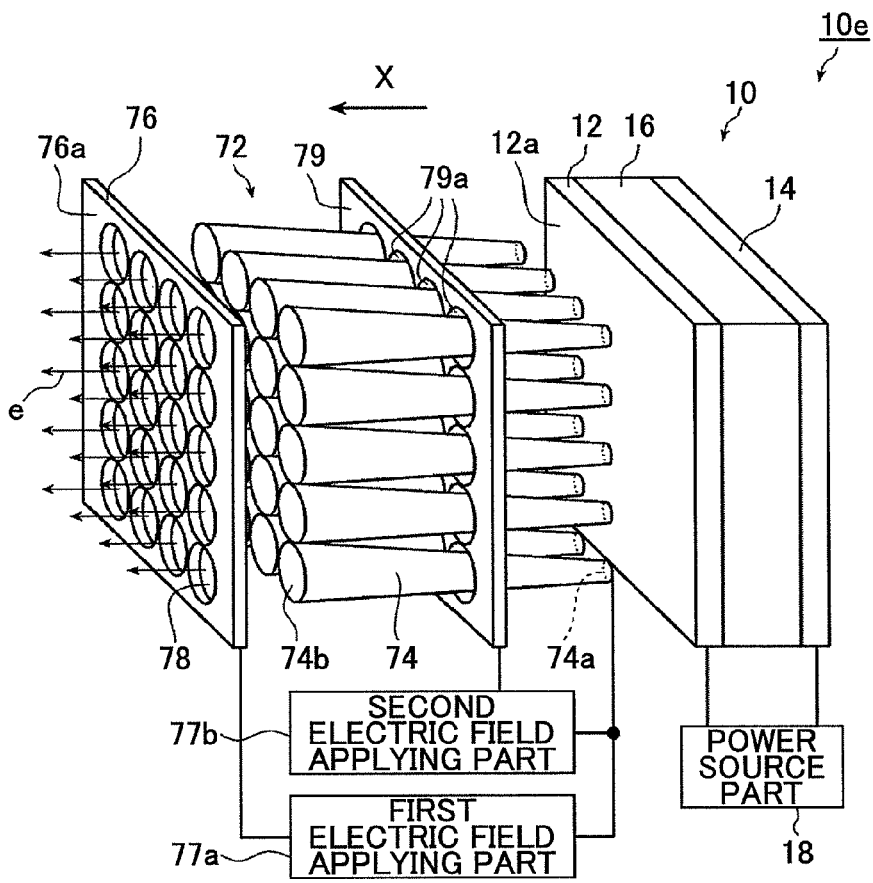
FIG. 8(a) is a schematic perspective view of a surface emission type electron source according to a fifth embodiment of the present invention.
FIG. 8(b) is an enlarged schematic cross-sectional view of relevant parts of the surface emission type electron source shown in FIG. 8(a)
Figure 8:
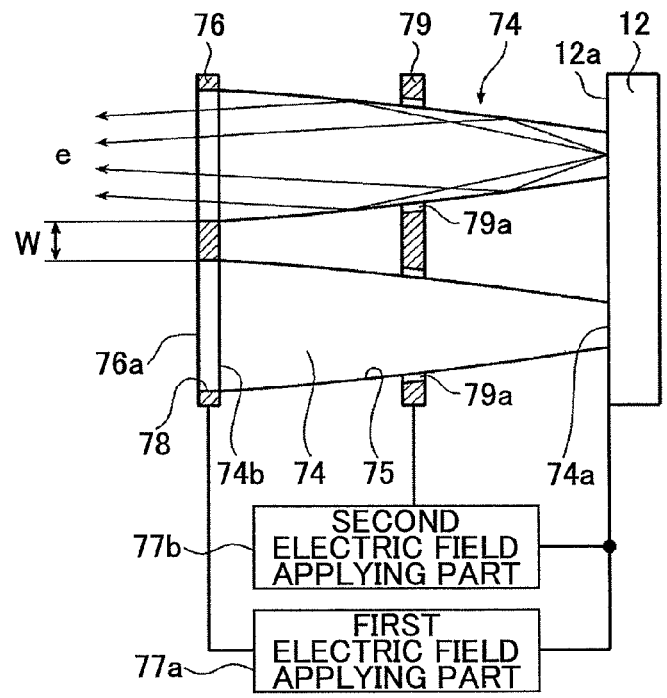

FIG. 8(*a*) is a schematic perspective view of a surface emission type electron source according to the fifth embodiment of the present invention, and FIG. 8(*b*) is an enlarged schematic cross-sectional view of relevant parts of the surface emission type electron source shown in FIG. 8(*a*).

In FIG. 8(*a*), the components appear to be separated from each other; however, the components are separately illustrated for the purpose of description, but are actually connected.

In the present embodiment, the same elements as those of the surface emission type electron source according to the first embodiment shown in FIG. 1 are denoted by the same reference numerals and are not further described.

A surface emission type electron source 10*e* shown in FIGS. 8(*a*) and 8(*b*) is different from the surface emission type electron source 10 (see FIG. 1) according to the first embodiment in that a porous member 72, a first surface electrode 76, and a second surface electrode 79 are provided on the front surface 12*a* of the front electrode 12 of the surface emission type electron source 10 (see FIG. 1) according to the first embodiment. Otherwise, the surface emission type electron source 10*e* according to the fifth embodiment has the same configuration as that of the surface emission type electron source 10 according to the first embodiment, and detailed descriptions are omitted.

In the present embodiment, as shown in FIG. 8(*a*), the porous member 72 includes plural electron transit tubes (tube-like members) 74 that are bound together. A second opening part 74*b* at one end of each electron transit tube 74 is wider than a first opening part 74*a* at the other end, and the diameter of each electron transit tube 74 monotonously increases from the first opening part 74*a* toward the second opening part 74*b*. The electron transit tubes 74 are made of, for example, a semiconductor or an insulator.

The porous member 72 is provided on the front surface 12*a* of the front electrode 12 such that the first opening parts 74*a* are facing the front surface 12*a* of the front electrode 12.

Furthermore, the first surface electrode 76 is connected to the porous member 72 on the side with the second opening parts 74*b*. The first surface electrode 76 has a planar shape, and has openings 78 formed at positions corresponding to the second opening parts 74*b* of the electron transit tubes 74 of the porous member 72. The first surface electrode 76 may be made of, for example, metal, semiconductor, carbon, or a carbon compound.

As long as the first surface electrode 76 can emit, from its surface 76a, electrons that have been accelerated in the electron transit tubes 74 of the porous member 72, the openings 78 do not necessarily need to be formed.

The second surface electrode 79 has a planar shape, and has plural openings 79a into which the electron transit tubes 74 are inserted. The electron transit tubes 74 are inserted into the openings 79a of the second surface electrode 79, and the second surface electrode 79 is included in the porous member 72.

Similar to the first surface electrode 76, the second surface electrode 79 may be made of, for example, metal, a semiconductor, carbon, or a carbon compound.

Furthermore, the present embodiment includes a first electric field applying part 77a and a second electric field applying part 77b for applying an electric field (potential difference) between the front electrode 12 of the surface emission type electron source 10 and the first surface electrode 76. The first electric field applying part 77a and the second electric field applying part 77b have the same configuration as, for example, the power source part 18.

The present embodiment is provided with two first electric field applying parts, i.e., the first electric field applying part 77a and the second electric field applying part 77b; however, the present embodiment is not so limited, as long as one first electric field applying part is provided.

In the present embodiment, the surface emission type electron source 10e is put into a vacuum chamber. An electric field (potential difference) is applied between the front electrode 12 of the surface emission type electron source 10 and the first surface electrode 76, from the first electric field applying part 77a. Furthermore, an electric field (potential difference) is applied between the front electrode 12 of the surface emission type electron source 10 and the second surface electrode 79, from the second electric field applying part 77b. Accordingly, as shown in FIG. 8(b), electrons e are emitted from the surface emission type electron source 10e into the electron transit tubes 74, and are reflected by inner surfaces 75 of the electron transit tubes 74. Thus, the movement directions of the electrons can be converged to a substantially perpendicular direction with respect to the surface 76a of the first surface electrode 76.

Furthermore, in the present embodiment, conductive films are formed on the inner surfaces 75 of the electron transit tubes 74, and the conductive films may be connected to the first surface electrode 76 or the second surface electrode 79. Accordingly, it is possible to prevent a charge-up phenomenon that occurs when electrons e adhere to the inner surfaces 75.

Intervals w between the electron transit tubes 74 are determined according to the movement energy of electrons passing through the electron transit tubes 74. For example, if the intervals between the electron transit tubes 74 are narrowed for the purpose of increasing the resolution of electron beam exposure, the following problem may occur. That is, after an electron enters the insulator or the semiconductor constituting one of the electron transit tubes 74, whereby the electron is moving with energy that is higher than that of vacuum level, the electron may pass through the tube walls and enter the vacuum space of an adjacent electron transit tube 74. Under such a condition, the electrons emitted from the first surface electrode 76 may not be sufficiently rectilinear, which may decrease the resolution of electron beam exposure.

Thus, the intervals w between adjacent electron transit tubes 74 are set so as to satisfy $w > 1/\mu$, where $\mu$ is an electron absorption coefficient of the insulator or the semiconductor constituting the electron transit tubes 74. The absorption coefficient $\mu$ is substantially inversely proportional to the square of the speed of the electrons.

The porous member 72 may be, for example, a porous structure obtained by anodizing a semiconductor substrate. Each pore of such a porous structure corresponds to one of the electron transit tubes 74.

For example, the porous member 72 may be fabricated by performing a reactive ion etching method to form multiple through holes in a semiconductor substrate, a quartz substrate, or a plastic substrate. The multiple through holes correspond to the electron transit tubes 74.

In the present embodiment, the resolution of the surface emission type electron source 10e is determined by the diameter of the second opening part 74b of the electron transit tube 74.

In the present embodiment, the surface emission type electron source 10e is placed in a vacuum space, and electrons e are emitted from a surface emission type electron part (the surface emission type electron source 10 according to the first embodiment) into the vacuum in the electron transit tubes 74. The electrons e are reflected by the inner surfaces 75 of the electron transit tubes 74, so that the movement directions of the electrons e are converged in a substantially perpendicular direction with respect to the surface 76a of the first surface electrode 76 before the electrons e are emitted outside.

The present embodiment is provided with the second surface electrode 79; however, the present invention is not so limited. For example, the movement directions of the electrons can be controlled separately for each of the electron transit tubes 74.

In this case, instead of providing the second surface electrode 79 according to the present embodiment, as shown in a first modification of the present embodiment shown in FIG. 9(a), a ring-type electrode 95 may be provided around each of the electron transit tubes 74, in such a manner as to surround the corresponding electron transit tube 74. Furthermore, a second electric field applying part 96 is provided for applying a potential difference between the electrode 95 and the front electrode 12.

FIG. 9(a) only illustrates relevant parts, and does not show the first surface electrode 76, the first electric field applying part 77a, or the surface emission type electron source 10. Furthermore, in FIG. 9(a), part of the second electric field applying part 96 is not shown, and therefore only six electron transit tubes 74 and three second electric field applying parts 96 are shown. In FIG. 9(a), it appears that there are electron transit tubes 74 that are not connected to second electric field applying parts 96; however, it goes without saying that all of the electron transit tubes 74 are actually connected to second electric field applying parts 96, although some of the second electric field applying parts 96 are not shown as a matter of simplification.

The electrodes 95 surround the corresponding electron transit tubes 74, and are thus provided in the porous member 72.

The electrode 95 can be made of a material such as metal, a semiconductor, carbon, and a carbon compound. The electron transit tube 74 can be constituted by an insulator or a semiconductor.

In the second electric field applying part 96, one electric field applying part 97 is provided for each electrode 95, and each electric field applying part 97 is connected to both the corresponding electrode 95 and the front electrode 12.

Each electric field applying part 97 includes an electric field applying element 97a and a capacitor 97b. The capacitor 97b is connected in parallel to the electric field applying element 97a.

The capacitor 97b is provided as an electrical capacity; in the present invention, the element is not limited to the capacitor 97b as long as the element can function as an electrical capacity.

The electric field applying element 97a is for applying a potential difference between the electrode 95 and the front electrode 12, and has the same configuration as that of, for example, the power source part 18. Furthermore, the potential differences between the electrodes 95 and the front electrode 12 are maintained by the corresponding capacitors 97b (electrical capacity).

In the first modification of the present embodiment, one electrode 95 is provided for each electron transit tube 74, and one electric field applying part 97 is provided for each electrode 95. Therefore, each of the electron transit tubes 74 can separately receive a potential difference between the corresponding electrode 95 and the front electrode 12. Thus, the first modification is different from the configuration of the present embodiment having the second surface electrode 79 in the following respect. That is, the movement directions of the electrons e in the electron transit tubes 74 can be separately controlled for each of the electron transit tubes 74, and the electrons e can be even more converged in the direction substantially perpendicular with respect to the surface 76a of the first surface electrode 76 before being emitted outside.

Furthermore, in the present embodiment, in addition to the first modification shown in FIG. 9(a), there may be another approach for separately controlling the movement directions of the electrons e for each of the electron transit tubes 74. That is, in a second modification shown in FIG. 9(b), ring-type electrodes 95 (second electrode) surrounding corresponding electron transit tubes 74 are provided, and furthermore, second electric field applying parts 96a are provided for applying potential differences between the corresponding electrodes 95 and the front electrode 12.

The configurations and compositions of the electrodes 95 and the electron transit tubes 74 are the same as those of the first modification.

In FIG. 9(b), only one electron transit tube 74 is shown for the purpose of description; however, it goes without saying that there are plural electron transit tubes 74 formed in the porous member 72, and that each electron transit tube 74 is provided with an electrode 95.

The second electric field applying part 96a is provided with an element unit 98 including a resistor 98a, a FET 98b, and a capacitor 98c. Furthermore, the second electric field applying part 96a includes a power source part 99 (second power source part) for applying a potential difference between the electrode 95 and the front electrode 12. Each electrode 95 is provided with one element unit 98. One power source part 99 is provided for plural electrodes 95, and the power source part 99 is connected to each of the electrodes 95.

The power source part 99 is for applying a potential difference between the electrode 95 and the front electrode 12, and has the same configuration as that of, for example, the power source part 18.

In the element unit 98, the resistor 98a and the FET 98b are connected in series, and the capacitor 98c and the FET 98b are connected in parallel. The element unit 98 is for controlling the potential difference between the electrode 95 and the front electrode 12. The FET 98b gate is connected to a control circuit 98e (control unit) via a terminal 98d. One control circuit 98e is provided for plural electrodes 95.

Signals (for example, predetermined voltage application) are input from the control circuit 98e to the terminal 98d of each connected FET 98b. Accordingly, each of the FETs 98b can be switched to a conductive state, a non-conductive state, or a half-conductive state in which the electric resistance is high, thereby controlling the potential difference between each of the electrodes 95 and the front electrode 12. The half-conductive state is in the middle of the conductive state and the non-conductive state, in which the electric resistance is high but an electric current can flow.

The control circuit 98e is for controlling the amount of electrons e emitted from each of the connected electron transit tubes 74 and the intensity of the convergence of the electron beams, and for controlling the conductivity of each connected FET 98b. For example, the control circuit 98e can control the conductivity of each connected FET 98b in accordance with respective parts of a pattern to be exposed, to change the current density caused by the electron beams as continuous amounts.

Accordingly, in the second modification, during electron beam exposure, even when a proximity effect is caused by a dimensional change in the pattern due to the presence/absence of a marginal pattern or the size of the pattern, such a proximity effect can be prevented by changing the current density caused by the electron beams in accordance with the pattern to be exposed.

Furthermore, in the element unit 98, the potential difference between the electrode 95 and the front electrode 12 is maintained by the capacitor 98c (electrical capacity).

The capacitor 98c is provided as an electrical capacity; in the present invention, the element is not limited to the capacitor 98c as long as the element can function as an electrical capacity.

In the second modification, while the power source part 99 is applying a potential difference between the electrode 95 and the front electrode 12, the conduction state of one FET 98b is changed by signals input from the terminal 98d of one FET 98b by the control circuit 98e. Accordingly, the potential difference between each electrode 95 and the front electrode 12 is controlled.

Also in the second modification, one electrode 95 is provided for each electron transit tube 74, and one element unit 98 is provided for each electrode 95. Therefore, each of the electron transit tubes 74 can separately receive a potential difference between the corresponding electrode 95 and the front electrode 12. Thus, the second modification is different from the configuration of the present embodiment having the second surface electrode 79 in the following respect. That is, the movement directions of the electrons e in the electron transit tubes 74 can be separately controlled for each of the electron transit tubes 74, and the electrons e can be even more converged in the direction substantially perpendicular with respect to the surface 76a of the first surface electrode 76 before being emitted outside.

It is assumed that a two-dimensional matrix has multiple electron transit tubes 74 arranged in a two-dimensional manner as elements. One power source part 99 for applying a voltage is connected to each line of electron transit tubes 74, and one control circuit 98e is connected to each row of electron transit tubes 74 for simultaneously controlling all of the FETs 98b connected to the electron transit tubes 74 in the corresponding row. Accordingly, a two-dimensional active matrix structure can be constituted. The power source part 99 described in the present embodiment is caused to have high resistance when maintaining the potential in the capacitor 98c, thereby preventing discharge of the capacitor 98c.

As described above, in the present embodiment and the first modification and the second modification of the present embodiment, the porous member 72 is provided. Therefore, compared to the case of the surface emission type electron source 10 according to the first embodiment, electron beams that are more highly rectilinear can be used to form a pattern at once at the same magnification and also with high-resolution. Additionally, by changing the size of the front electrode 12 (electron passage layer 16) of the surface emission type electron source 10e, even when the region onto which the pattern is to be formed is large, it is possible to form a pattern at once at the same magnification. It goes without saying that the surface emission type electron source 10e according to the present embodiment can form a pattern at once at the same magnification and also with high-resolution, with the use of even more highly rectilinear electron beams than those of the surface emission type electron source 10 according to the first embodiment, even when the region onto which the pattern is to be formed is large.

In the present embodiment and the first modification and the second modification of the present embodiment, the surface emission type electron source 10 according to the first embodiment is used as a surface emission type electron source unit; however, the present invention is not so limited. It is also possible to use, as the surface emission type electron source unit, the surface emission type electron source 10a according to the second embodiment, the surface emission type electron source 10b according to the third embodiment, or the surface emission type electron source 10c according to a modification of the third embodiment.

Next, a description is given of a sixth embodiment of the present invention.

Figure 10:
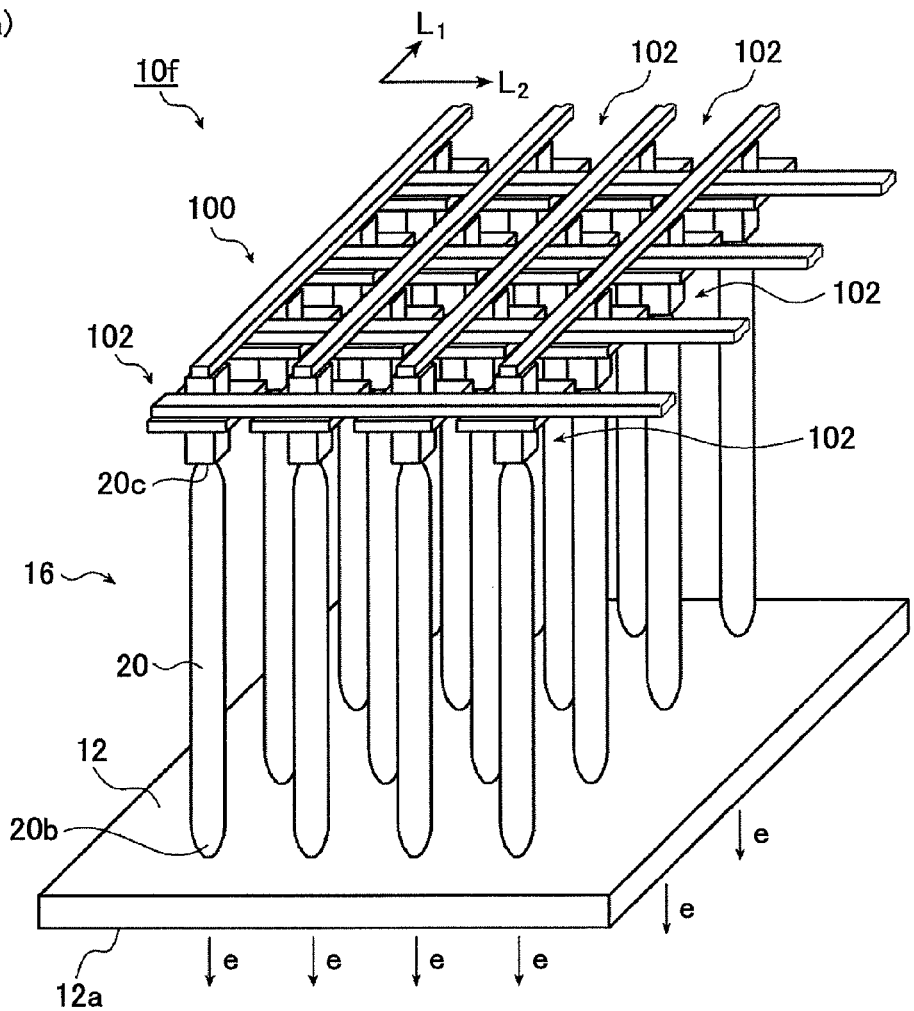
FIG. 10(a) is a schematic perspective view of a surface emission type electron source according to a sixth embodiment of the present invention.
FIG. 10(b) is a block diagram of the surface emission type electron source according to the sixth embodiment of the present invention.
Figure 10:
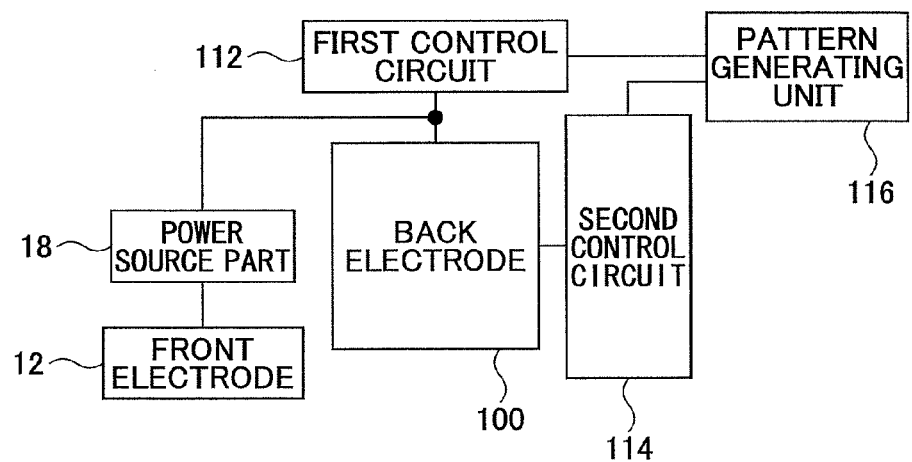

FIG. 10(a) is a schematic perspective view of a surface emission type electron source according to the sixth embodiment of the present invention, and FIG. 10(b) is a block diagram of the surface emission type electron source according to the sixth embodiment of the present invention.

Figure 11:
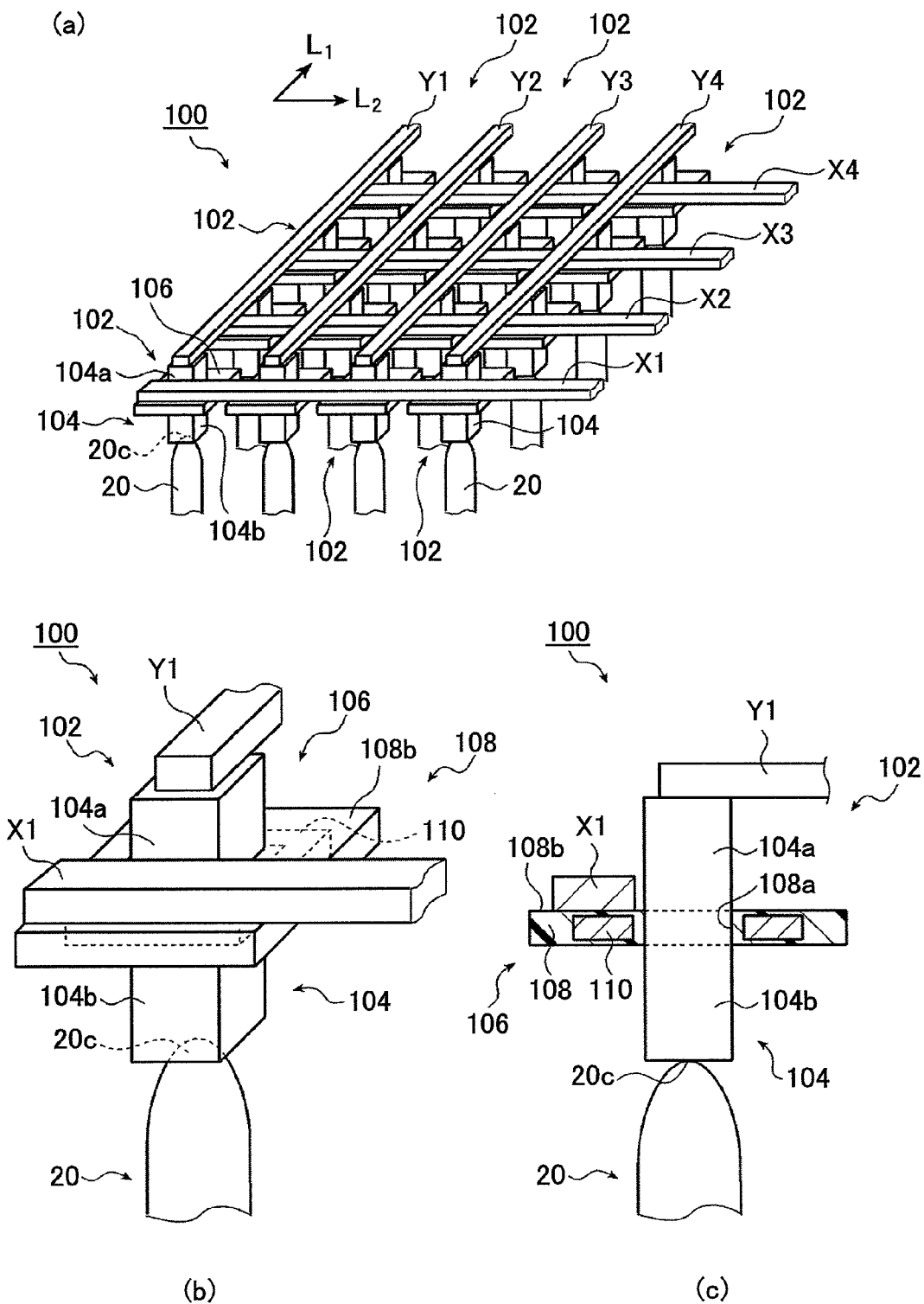
FIG. 11(a) is an enlarged view of a back electrode of the surface emission type electron source according to the sixth embodiment of the present invention shown in FIG. 10(a)
FIG. 11(b) is an enlarged schematic side view of relevant parts of the back electrode shown in FIG. 11(a)
FIG. 11(c) is a cross-sectional view of relevant parts of the back electrode shown in FIG. 11(a)

FIG. 11(a) is an enlarged view of a back electrode of the surface emission type electron source according to the sixth embodiment of the present invention shown in FIG. 10(a), FIG. 11(b) is an enlarged schematic side view of relevant parts of the back electrode shown in FIG. 11(a), and FIG. 11(c) is a cross-sectional view of relevant parts of the back electrode shown in FIG. 11(a).

In the present embodiment, the same elements as those of the surface emission type electron source according to the first embodiment shown in FIG. 1 are denoted by the same reference numerals and are not further described.

A surface emission type electron source 10f shown in FIG. 10(a) is different from the surface emission type electron source 10 (see FIG. 1) according to the first embodiment in that a back electrode 100 has an active matrix structure, and the surface emission type electron source 10f includes a first control circuit 112, a second control circuit 114, and a pattern generating unit 116 for driving the back electrode 100 as shown in FIG. 10(b). Otherwise, the surface emission type electron source 10f according to the second embodiment has the same configuration as that of the surface emission type electron source 10 according to the first embodiment, and detailed descriptions are omitted. A switch control unit according to the present invention is constituted by the first control circuit 112, the second control circuit 114, and the pattern generating unit 116.

In the surface emission type electron source 10f according to the present embodiment, the electrons e can be emitted from arbitrary quantum wires 20 among all of the quantum wires 20 included in the electron passage layer 16, and the electrons e can be emitted with a predetermined two-dimensional pattern.

In the surface emission type electron source 10f according to the present embodiment, the pattern of the radiated electron beams is not fixed as in the case of the surface emission type electron source 10b (see FIGS. 4(a) and 4(b)) according to the third embodiment.

The back electrode 100 has an active matrix structure. The back electrode 100 has switch elements 102 each connected to a single quantum wire 20, for example. The switch elements 102 can be in a conductive state, a non-conductive state, or a half-conductive state in which the electric resistance is high. The half-conductive state is in the middle of the conductive state and the non-conductive state, in which the electric resistance is high but an electric current can flow.

The back electrode 100 locally functions as a conductive body, an insulator, or a resistor, according to the conductive states of the switch elements 102.

If the switch elements 102 are made of a material that locally functions as a conductive body or a resistor, such as a chalcogenide semiconductor, the switch elements 102 can be spatially connected to each other.

As shown in FIG. 11(a), the surface emission type electron source 10f includes the switch elements 102, first control electrodes Y1 through Y4 for driving the switch elements 102, and second control electrodes X1 through X4 for driving the switch elements 102.

In the surface emission type electron source 10f according to the present embodiment, there are a total of 16 quantum wires 20 arranged in a lattice, with four quantum wires 20 arranged along a vertical direction $L_1$ and four quantum wires 20 arranged along a horizontal direction $L_2$. In the present embodiment, there are 16 switch elements 102, four first control electrodes Y1 through Y4, and four second control electrodes X1 through X4; however, these numbers are not so limited.

In the present embodiment, a switch element 102 is provided for each of the quantum wires 20; however, the present invention is not so limited. For example, a switch element 102 may be provided for plural quantum wires 20 in accordance with the resolution of the image to be formed.

The switch element 102 is a transistor having a floating gate structure. All of the switch elements 102 have the same configuration, and therefore a description is given for only one of the switch elements 102.

The switch element 102 can be in a conductive state or a non-conductive state. Thus, the voltage applied to each switch element 102 can be turned on/off.

The switch element 102 includes, for example, a semiconductor part 104 shaped as a quadrangular prism having a source 104a and a drain 104b formed one on each end, and a gate part 106 for controlling the conductivity between the source 104a and the drain 104b.

The source 104a and the drain 104b are formed by doping the semiconductor part 104 with impurities of an appropriate concentration level.

The gate part 106 includes, for example, a planar insulator 108 having a square opening 108a in its center, and a floating gate 110 constituted by a frame-like conductive body provided inside the insulator 108 in such a manner as to surround the opening 108a.

In the switch element 102, the semiconductor part 104 shaped as a quadrangular prism is inserted through the opening 108a of the gate part 106.

In the switch element 102, the first control electrode Y1 is connected to the source 104a of the semiconductor part 104. Furthermore, the second control electrode X1 is connected to a surface 108b of the insulator 108 of the gate part 106.

The drain 104b of the semiconductor part 104 is connected to a trailing end 20c which is the other end of the quantum wire 20 opposite to the leading end 20b at the front electrode 12 side (see FIG. 10(a)).

In the switch element 102, a predetermined voltage is applied to the source 104a via the first control electrode Y1 and a predetermined voltage is applied to the source 104a via the second control electrode X1. Accordingly, electrical charges are injected into the floating gate 110 of the gate part 106, and the source 104a and the drain 104b become electrically conducted. That is, the switch element 102 switches to a conductive state or a half-conductive state. The switch element 102 according to the present embodiment has the floating gate 110, and therefore once the switch element 102 switches to a conductive state or a half-conductive state, the corresponding state is maintained until electrical charges are discharged from the floating gate 110.

The switch element 102 may be configured such that the source 104a and the drain 104b become electrically conductive by discharging the electrical charges from the floating gate 110 of the gate part 106.

In the present embodiment, the first control electrode Y1 is connected to the sources 104a of the switch elements 102 aligned in the same line in a vertical direction $L_1$. Similarly, the first control electrode Y2, the first control electrode Y3, and the first control electrode Y4 are connected to the sources 104a of the switch elements 102 aligned in the corresponding same lines in a vertical direction $L_1$.

The first control electrodes Y1 through Y4 are connected to the first control circuit 112. The first control circuit 112 can arbitrarily apply a predetermined voltage to any of the first control electrodes Y1 through Y4.

In the present embodiment, the second control electrode X1 is connected to the surfaces 108b of the insulating bodies 108 of the gate parts 106 of the switch elements 102 aligned in the same line in a horizontal direction $L_2$. Similarly, the second control electrode X2, the second control electrode X3, and the second control electrode X4 are connected to the surfaces 108b of the insulating bodies 108 of the gate parts 106 of the switch elements 102 aligned in the corresponding same lines in a horizontal direction $L_2$.

The second control electrodes X1 through X4 are connected to the second control circuit 114. The second control circuit 114 can arbitrarily apply a predetermined voltage to any of the second control electrodes X1 through X4.

In the present embodiment, for example, each of the switch elements 102 arranged in a lattice can have coordinates (Xn, Yn), which correspond to a combination of one of the first control electrodes Y1 through Y4 and one of the second control electrodes X1 through X4 connected to the corresponding switch element 102. In the above coordinates, "n" denotes an integer.

The first control circuit 112 and the second control circuit 114 can apply a predetermined voltage to the switch elements 102 in the region for emitting electrons e from the front surface 12a of the front electrode 12, so that the corresponding switch elements 102 are switched to a conductive state. Accordingly, the back electrode 100 locally acts as a conductive body or an insulator, so that the conductivity of the quantum wires 20 is controlled.

Furthermore, the first control circuit 112 and the second control circuit 114 are connected to the pattern generating unit 116.

The pattern generating unit 116 selects coordinates based on the pattern of electron beams radiated from the front surface 12a of the front electrode 12, selects an electrode among the first control electrodes Y1 through Y4 to which a predetermined voltage is to be applied, and outputs, to the first control circuit 112, an instruction signal for giving an instruction to apply the predetermined voltage to the electrode selected among the first control electrodes Y1 through Y4.

Furthermore, also with regard to the second control electrodes X1 through X4, the pattern generating unit 116 selects an electrode among the second control electrodes X1 through X4 to which a predetermined voltage is to be applied, and outputs, to the second control circuit 114, an instruction signal for giving an instruction to apply the predetermined voltage to the electrode selected among the second control electrodes X1 through X4.

As described above, by means of the pattern generating unit 116, the switch elements 102 of the back electrode 100 can be switched to conductive states based on a predetermined two-dimensional pattern. In the present embodiment, regions corresponding to the conductive bodies 54a, 54b, and 54c indicated in the third embodiment can be formed.

Based on the instruction signals from the pattern generating unit 116, the first control circuit 112 and the second control circuit 114 apply a predetermined voltage on the switch elements 102 via the selected first control electrodes Y1 through Y4 and the selected second control electrodes X1 through X4.

Furthermore, in the present embodiment, the power source part 18 is connected to the front electrode 12 and to the first control electrodes Y1 through Y4, and the power source part 18 is connected to the quantum wires 20 via the switch elements 102.

When a predetermined voltage is applied by the power source part 18, a predetermined voltage is applied to the switch elements 102 selected from the first control electrodes Y1 through Y4, electrons are injected to the selected quantum wires 20, the electrons are accelerated, and electron beams corresponding to a predetermined pattern are emitted from the front electrode 12 as patterned surface electron beams.

In the present embodiment, the pattern generating unit 116 selects the quantum wires 20 from which electrons are to be emitted, based on the pattern of electron beams to be emitted outside from the front electrode 12. The switch elements 102 to be switched to conductive states are selected in accordance with the pattern, in order to emit electrons from the selected quantum wires 20. Then, based on the coordinates of the selected switch elements 102, the pattern generating unit 116 selects the electrode among the first control electrodes Y1 through Y4 to which a predetermined voltage is to be applied from the first control circuit 112, and also selects the electrode among the second control electrodes X1 through X4 to which a predetermined voltage is to be applied from the second control circuit 114.

Next, the first control circuit 112 and the second control circuit 114 apply a predetermined voltage to the electrode selected among the first control electrodes Y1 through Y4 and the electrode selected among the second, control electrodes X1 through X4, respectively. In order for the power source part 18 to apply a potential difference between the switch elements 102 and the front electrode 12, a predetermined voltage is applied to the electrode selected among the first control electrodes Y1 through Y4. Accordingly, electrons e can be emitted from the front surface 12a of the front electrode 12 in accordance with the region from which the electrons e are to be emitted from the front surface 12a of the front electrode 12, i.e., a predetermined two-dimensional pattern.

As described above, in the present embodiment, the pattern does not need to be fixed as in the third embodiment; the pattern of electron beams can be changed by changing the positions from which the electrons e are to be emitted by means of turning the switch elements 102 into conductive states or non-conductive states.

Furthermore, in the present embodiment, besides being switched to a conductive state or a non-conductive state, the switch elements 102 may be switched to a half-conductive state. Therefore, the emission amount of electrons e can be continuously changed. Specifically, by switching the switch elements 102 to a conductive state, a non-conductive state, or a half-conductive state, the emission amount of electrons e can be changed as a continuous quantity.

As described above, in the present embodiment, the emission amount of electrons e can be continuously changed, and therefore even if a proximity effect is caused in the exposed pattern as described above, the current density according to the electron beams can be changed as a continuous quantity at the respective parts of the exposed pattern. Accordingly, the proximity effect in the exposed pattern can be corrected.

In the present embodiment, the surface emission type electron source 10f is put into a vacuum chamber, and in order to form a predetermined pattern, the pattern generating unit 116 switches the switch elements 102 to a conductive state or a non-conductive state by means of the first control circuit 112 and the second control circuit 114. A positive potential is applied to the front electrode 12, and a voltage is applied from the power source part 18 to a part between the back electrode 100 and the front electrode 12. Accordingly, electrons are injected to the quantum wires 20 from the switch elements 102 that are in a conductive state, and the electrons are accelerated by the potential difference between the back electrode 100 and the front electrode 12.

In this case, the electrons e that have passed through the quantum wires 20 of the electron passage layer 16 are not scattered in a direction including horizontal components with respect to the front surface 12a (electron emitting surface) of the front electrode 12. Therefore, the electrons can be emitted as patterned surface electron beams that are highly rectilinear, from the regions on the front electrode 12 corresponding to the selected quantum wires 20 (switch elements 102) while maintaining the shape of the selected switch elements 102, i.e., the two-dimensional pattern expressed by the selected quantum wires 20. Accordingly, when a predetermined pattern is formed on a substrate being radiated by the emitted electrons, the resolution of the pattern formed with the electron beams can be increased.

Conventionally, to create patterns based on electron beams, the shape of the surface electrode is changed or a mask is provided on the surface electrode. However, in the present embodiment, there is no need to change the shape of the front electrode 12 or to provide a mask on the front electrode 12, and therefore, the structure can be simplified. Furthermore, in the present embodiment, the pattern of the electron beams can be changed according to the substrate being radiated by the emitted electrons.

Next, a description is given of a seventh embodiment of the present invention.

Figure 12:
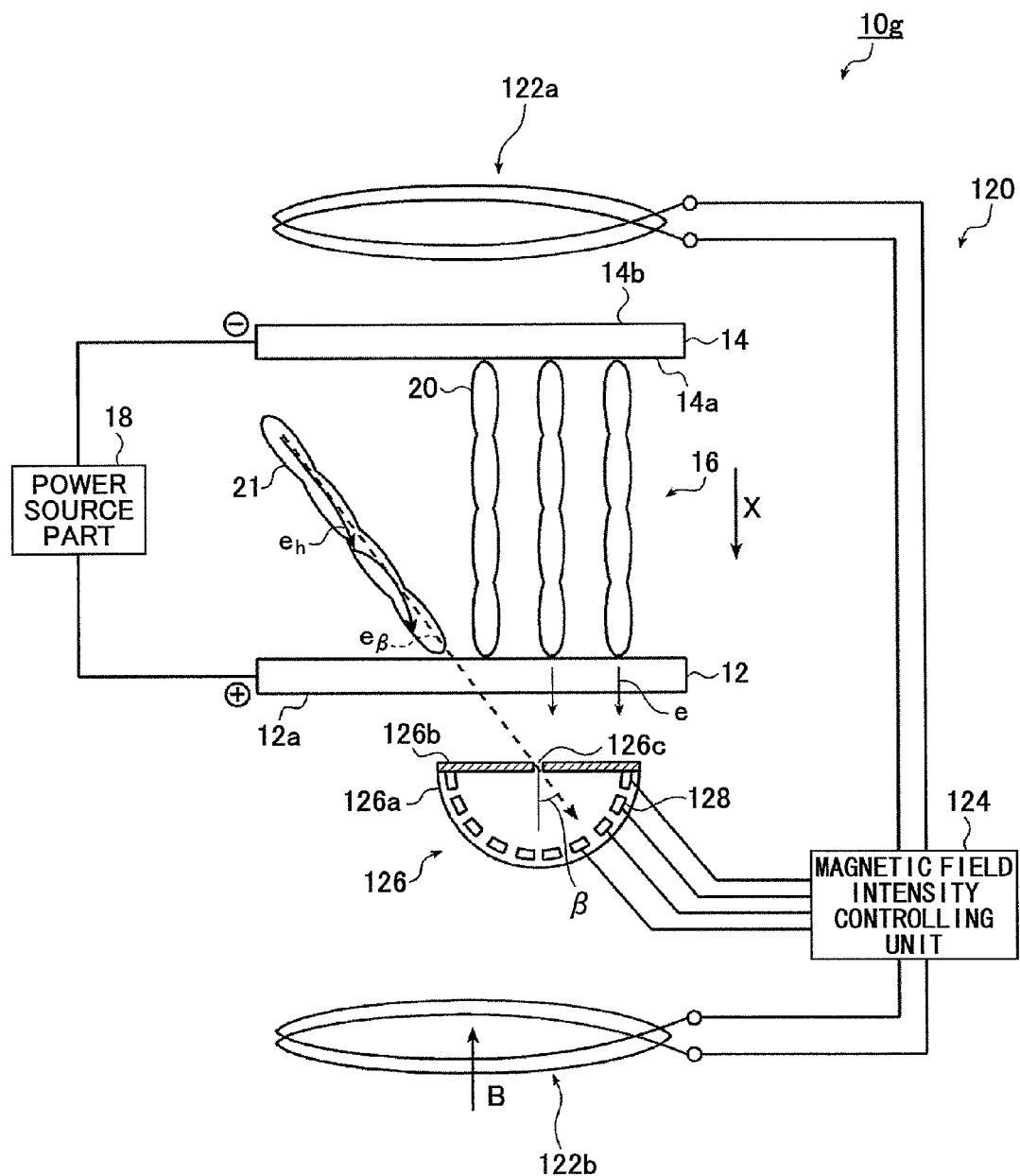
FIG. 12 is a schematic diagram of a surface emission type electron source according to a seventh embodiment of the present invention.

FIG. 12 is a schematic diagram of a surface emission type electron source according to the seventh embodiment of the present invention.

In the present embodiment, the same elements as those of the surface emission type electron source according to the first embodiment shown in FIG. 1 are denoted by the same reference numerals and are not further described.

A surface emission type electron source 10g shown in FIG. 12 is different from the surface emission type electron source 10 (see FIG. 1) according to the first embodiment in that a magnetic field applying unit 120 for applying a magnetic field is provided in a direction perpendicular to the front surface 12a (electron emitting surface) of the front electrode 12 (hereinafter, simply referred to as a perpendicular direction), and an electron emission angle detector 126 is provided for detecting the emission angles of the electrons e emitted from the front surface 12a of the front electrode 12. Otherwise, the surface emission type electron source 10g according to the seventh embodiment has the same configuration as that of the surface emission type electron source 10 according to the first embodiment, and detailed descriptions are omitted. Furthermore, the above-described perpendicular direction is parallel to a first direction X.

In the surface emission type electron source 10g according to the present embodiment, the magnetic field applying unit 120 includes a first magnetic field generating coil 122a, a second magnetic field generating coil 122b, and a magnetic field intensity controlling unit 124.

The first magnetic field generating coil 122a is wound around in the form of a loop, and the opening of the loop is disposed in such a manner as to face the back surface 14b of the back electrode 14. Furthermore, the second magnetic field generating coil 122b is also wound around in the form of a loop, and the opening of the loop is disposed in such a manner as to face the front surface 12a of the front electrode 12. The first magnetic field generating coil 122a and the second magnetic field generating coil 122b are connected to the magnetic field intensity controlling unit 124.

The magnetic field intensity controlling unit 124 is for applying a predetermined current to the first magnetic field generating coil 122a and the second magnetic field generating coil 122b, and for adjusting the amount of current to be applied. As the magnetic field intensity controlling unit 124 applies the predetermined current to the first magnetic field generating coil 122a and the second magnetic field generating coil 122b, a magnetic field can be generated in the perpendicular direction.

In the electron emission angle detector 126, there are plural electron detecting elements 128 provided inside a hemispherical case 126a that provides shielding from the magnetic field as much as possible. Furthermore, a lid 126b is provided for sealing the opening of the case 126a. An opening 126c is formed in the lid 126b. The plural electron detecting elements 128 are for detecting electrons. Furthermore, the positional relationships between the plural electron detecting elements 128 and the opening 126c are set in advance.

In the electron emission angle detector 126, electrons enter the case 126a through the opening 126c, and the electron detecting elements 128 detect the electrons. Information expressing an angle β of an electron that has entered the case 126a with respect to the opening 126c can be acquired based on the position of the electron detecting element 128 that has detected the electron.

In the electron emission angle detector 126, the lid 126b is disposed so as to face the front surface 12a of the front electrode 12. Furthermore, the electron emission angle detector 126 can be withdrawn from the front surface 12a of the front electrode 12. Accordingly, when examining the rectilinearity of the electrons, the electron emission angle detector 126 can be moved to the position facing the front surface 12a of the front electrode 12 according to need.

With the use of the electron emission angle detector 126, it is possible to examine the rectilinearity of the electrons that are radiated from the front surface 12a of the front electrode 12.

The plural electron detecting elements 128 are connected to the magnetic field intensity controlling unit 124. As described below, the magnetic field intensity controlling unit 124 is for adjusting the intensity of the magnetic field by adjusting the current applied to the first magnetic field generating coil 122a and the second magnetic field generating coil 122b in accordance with the detection results of electrons indicated by the electron detecting elements 128.

In the present embodiment, for example, in a state where the electron emission angle detector 126 has been placed in a position facing the front surface 12a of the front electrode 12, the power source part 18 applies a direct voltage to the part between the front electrode 12 and the back electrode 14. Then, the electron emission angle detector 126 measures the rectilinearity of the electrons e emitted from the front surface 12a and the front electrode 12.

Based on the results indicating the rectilinearity of the electrons, the magnetic field intensity controlling unit 124 adjusts the current applied to the first magnetic field generating coil 122a and the second magnetic field generating coil 122b in accordance with the detection results of electrons acquired by the electron detecting elements 128. After the current is applied, the electron emission angle detector 126 once again measures the rectilinearity of the electrons, and based on the results of the measurement, the magnetic field intensity controlling unit 124 adjusts the current applied to the first magnetic field generating coil 122a and the second magnetic field generating coil 122b. In this manner, the surface emission type electron source 10g can further increase the rectilinearity of the emitted electrons.

For example, there may be cases where the quantum wire 20 the electron passage layer 16 extends in a direction that is not perpendicular with respect to the front surface 12a of the front electrode 12, due to manufacturing conditions during the manufacturing procedure, thereby forming a quantum wire 21. In such a case, electrons $e_\beta$ that are emitted from the quantum wire 21 are emitted at an angle that is not perpendicular (90°) with respect to the front surface 12a of the front electrode 12. Accordingly, electrons with low rectilinearity are emitted.

In the present embodiment, the magnetic field applying unit 120 applies a magnetic field in a perpendicular direction with respect to the front surface 12a of the front electrode 12. The perpendicular magnetic field causes electrons $e_h$, which have been generated in the quantum wire 21, to collide with the walls of the quantum wire 21 many times, so that the mobility of such electrons $e_h$ is decreased. Accordingly, it is possible to prevent momentum components of electrons that are in a direction parallel to the front surface 12a of the front electrode 12, and to prevent electrons that have been emitted from the front surface 12a of the front electrode 12 from spreading by applying the vertical magnetic field.

Furthermore, as described above, the electron emission angle detector 126 measures the rectilinearity of the electrons, and according to the results of measurement, the magnetic field intensity controlling unit 124 adjusts the amount of current applied to the first magnetic field generating coil 122a and the second magnetic field generating coil 122b, thereby adjusting the intensity of the applied magnetic field. The intensity of the applied magnetic field is repeatedly adjusted until the electrons have a predetermined level of rectilinearity, so that the pattern formed with electron beams has the required resolution. In this manner, the surface emission type electron source 10g according to the present embodiment is capable of increasing the rectilinearity of the emitted electrons even when the quantum wire 21 that is not perpendicular with respect to the front surface 12a is formed, and therefore the pattern formed with electron beams can have the required resolution.

Other than the above effects, it goes without saying that with the present embodiment, the same effects as those of the first embodiment can also be attained.

As the mechanism for generating a magnetic field, in the magnetic field applying unit 120, the front electrode 12, the electron passage layer 16, and the back electrode 14 are sandwiched between two coils (the first magnetic field generating coil 122a and the second magnetic field generating coil 122b). However, the present embodiment is not so limited. Any mechanism may be used as long as a uniform magnetic field can be generated in a perpendicular direction with respect to the front surface 12a of the front electrode 12, i.e., in the first direction X, in the space between the front electrode 12 and the exposure target that is facing the front electrode 12. Thus, a superconducting magnet or a permanent magnet may be used as the magnetic field applying unit 120.

Next, a description is given of an eighth embodiment of the present invention.

Figure 13:
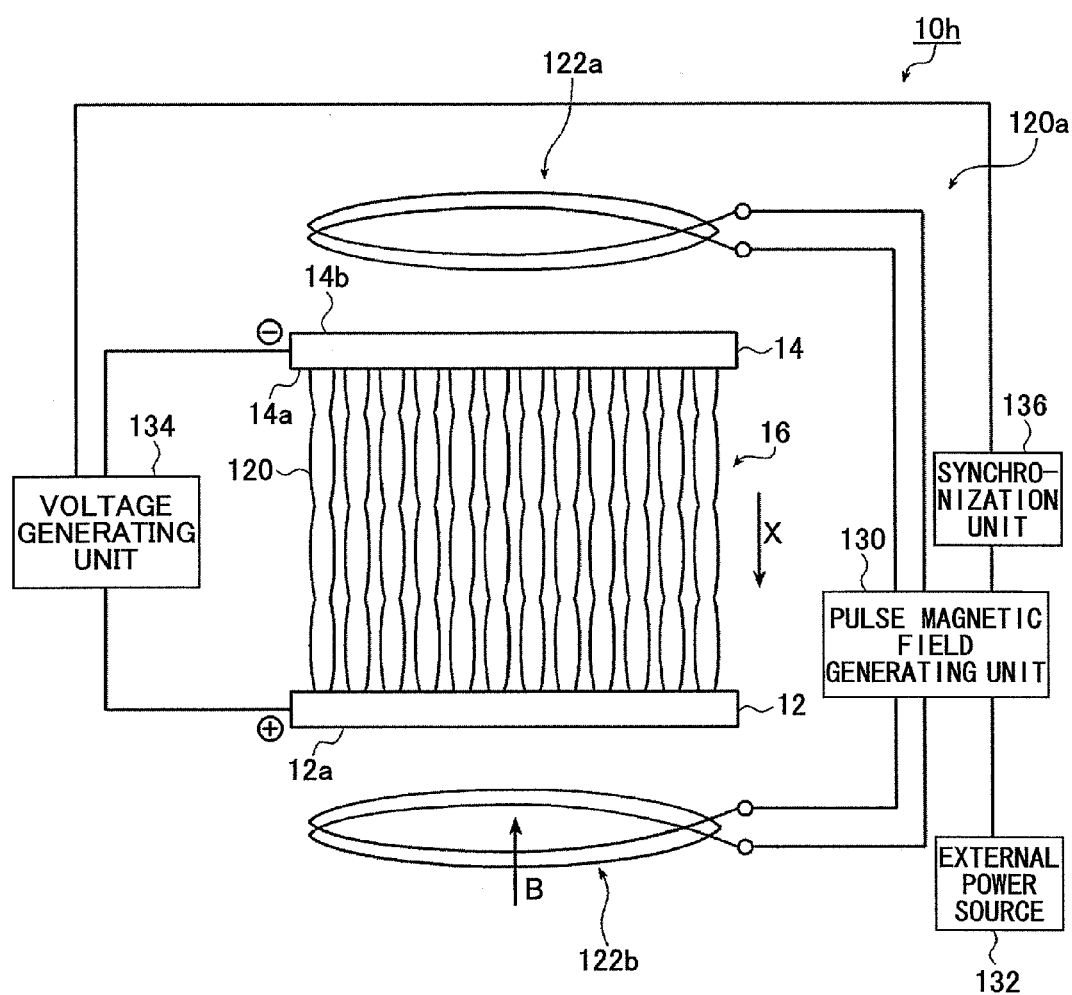
FIG. 13 is a schematic diagram of a surface emission type electron source according to an eighth embodiment of the present invention.

FIG. 13 is a schematic diagram of a surface emission type electron source according to the eighth embodiment of the present invention.

In the present embodiment, the same elements as those of the surface emission type electron source according to the first embodiment shown in FIG. 1 are denoted by the same reference numerals and are not further described.

A surface emission type electron source 10h shown in FIG. 13 is different from the surface emission type electron source 10 (see FIG. 1) according to the first embodiment in that the power source part 18 is replaced with a voltage generating unit 134, a magnetic field applying unit 120a for applying a magnetic field is provided in a direction perpendicular to the front surface 12a (electron emitting surface) of the front electrode 12, and a synchronization unit 136 is provided. Otherwise, the surface emission type electron source 10h according to the eighth embodiment has the same configuration as that of the surface emission type electron source 10 according to the first embodiment, and detailed descriptions are omitted.

In the surface emission type electron source 10h according to the present embodiment, the magnetic field applying unit 120a includes the first magnetic field generating coil 122a, the second magnetic field generating coil 122b, a pulse magnetic field generating unit 130, and an external power source 132.

The first magnetic field generating coil 122a is wound around in the form of a loop, and the opening of the loop is disposed in such a manner as to face the back surface 14b of the back electrode 14. Furthermore, the second magnetic field generating coil 122b is also wound around in the form of a loop, and the opening of the loop is disposed in such a manner as to face the front surface 12a of the front electrode 12. The first magnetic field generating coil 122a and the second magnetic field generating coil 122b are connected to the pulse magnetic field generating unit 130, and the pulse magnetic field generating unit 130 (pulse magnetic field applying unit) is connected to the external power source 132.

The pulse magnetic field generating unit 130 includes, for example, a capacitor (not shown) and a thyristor (not shown). The capacitor, the thyristor, the first magnetic field generating coil 122a, and the second magnetic field generating coil 122b are connected in series. Accordingly, a series circuit is formed, including the capacitor of the pulse magnetic field generating unit 130, the first magnetic field generating coil 122a, and the second magnetic field generating coil 122b. The capacitor is charged by the external power source 132.

In the pulse magnetic field generating unit 130, the capacitor is charged for a predetermined amount of time, and then the charging is stopped. Then, the thyristor is turned on. Accordingly, a pulse current flows through the first magnetic field generating coil 122a and the second magnetic field generating coil 122b. At this procedure, a pulse magnetic field is generated in the perpendicular direction for a length of time corresponding to the inverse number of a resonance frequency of the series circuit including the capacitor, the thyristor, the first magnetic field generating coil 122a, and the second magnetic field generating coil 122b. That is, a pulse magnetic field is applied to the electron passage layer 16 in the perpendicular direction.

The voltage generating unit 134 is for applying a pulse voltage to the part between the front electrode 12 and the back electrode 14 so that the electrons e are emitted from the front surface 12a of the front electrode 12.

The synchronization unit 136 is for adjusting the timings of the operations of the pulse magnetic field generating unit 130 and the voltage generating unit 134. The synchronization unit 136 causes the pulse magnetic field generating unit 130 to generate a pulse magnetic field in the perpendicular direction for a length of time corresponding to the inverse number of a resonance frequency of the series circuit including the capacitor of the pulse magnetic field generating unit 130, the first magnetic field generating coil 122a, and the second magnetic field generating coil 122b. Furthermore, the synchronization unit 136 causes the voltage generating unit 134 to apply a pulse voltage to a part between the front electrode 12 and the back electrode 14 for a length of time corresponding to the above inverse number, i.e., while a pulse magnetic field is being generated. Thus, a perpendicular magnetic field is constantly applied while electrons are being emitted. Accordingly, in the surface emission type electron source 10h according to the present embodiment, the electrons emitted from the front surface 12a of the front electrode 12 can be prevented from spreading in a direction parallel to the front surface 12a of nanometer-scale.

It goes without saying that with the present embodiment, the same effects as those of the surface emission type electron source 10 according to the first embodiment can be achieved, other than the above-described effects.

In the present embodiment, a pulse magnetic field is used, and therefore it is possible to generate a relatively intensive magnetic field of approximately 10 T through 100 T.

Next, a description is given of a ninth embodiment of the present invention.

Figure 14:
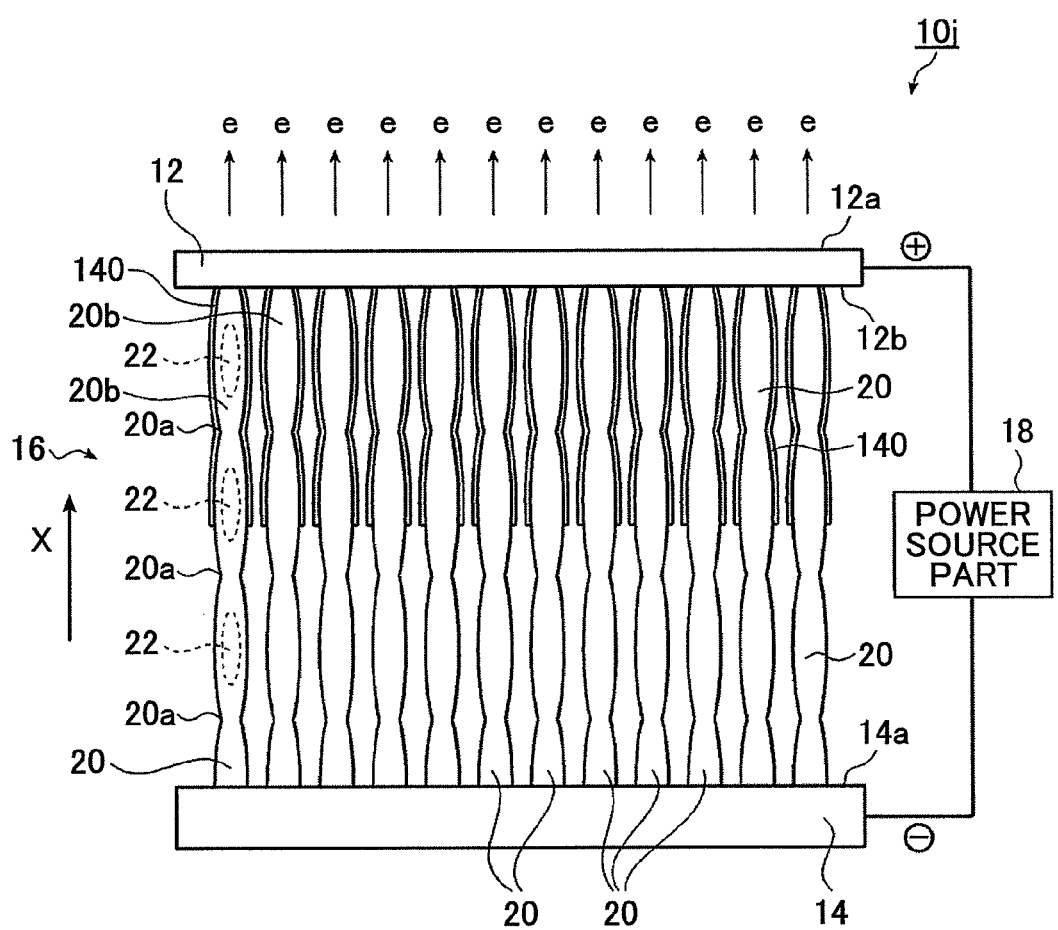
FIG. 14 is a schematic diagram of a surface emission type electron source according to a ninth embodiment of the present invention.

FIG. 14 is a schematic diagram of a surface emission type electron source according to the ninth embodiment of the present invention.

In the present embodiment, the same elements as those of the surface emission type electron source according to the first embodiment shown in FIG. 1 are denoted by the same reference numerals and are not further described.

A surface emission type electron source 10j shown in FIG. 14 is different from the surface emission type electron source 10 (see FIG. 1) according to the first embodiment in that an electron absorbing layer 140 having electrical conductivity is formed on the leading end 20b of each quantum wire 20. Otherwise, the surface emission type electron source 10j according to the ninth embodiment has the same configuration as that of the surface emission type electron source 10 according to the first embodiment, and detailed descriptions are omitted.

In the surface emission type electron source 10j according to the present embodiment, the electron absorbing layer 140 is formed on the leading end 20b of each quantum wire 20, and is electrically connected to the front electrode 12.

When the electrons e are accelerated to have energy greater than or equal to vacuum level and are injected into a vacuum space, the electron absorbing layer 140 prevents the electrons e from flying out toward an adjacent quantum wire 20 or the front surface 12a (electron emitting surface) of the front electrode 12 in a movement direction including components perpendicular to the direction in which the quantum wires 20 extend (first direction X) due to scattering factors originating from phonons or structural defects in the quantum wires 20. According to the electron absorbing layer 140, the rectilinearity of the emitted electrons can be further enhanced. For the above reasons, the electron absorbing layer 140 is formed on the surfaces of the leading ends 20b on the front surface 12a (side of electron emitting surface) of the front electrode 12.

The electron absorbing layer 140 is made of a material having conductivity, for example, amorphous carbon or amorphous silicon.

For example, the electron absorbing layer 140 is formed by the following method.

First, before forming the front electrode 12, a conductive material is deposited on the surface of the leading end of the quantum wire 20 by a vacuum evaporation method. Then, the surface of the leading end of the quantum wire 20 or the whole quantum wire 20 is heated at a temperature such that the quantum wire 20 does not melt or break. By performing this heating process, the conductive material spreads and moves on the surface of the quantum wire 20. Accordingly, the electron absorbing layer 140 is formed.

If the quantum wires 20 are uniformly formed, even if the electrons are scattered in a particular quantum wire 20 and such electrons cannot be emitted, substantially the same amount of electron emission can be obtained from every quantum wire 20 as a result of performing temporal integration. However, if there are electrons remaining in the electron absorbing layer 140, such remaining electrons may cause new electrons to scatter. Nevertheless, in the present embodiment, the electron absorbing layer 140 having conductivity is electrically connected to the front electrode 12 having an electron emitting surface, and therefore electrical charging is prevented.

As described above, in the surface emission type electron source 10j according to the present embodiment, the rectilinearity can be improved compared to the surface emission type electron source 10 according to the first embodiment.

It goes without saying that with the present embodiment, the same effects as those of the surface emission type electron source 10 according to the first embodiment can be achieved, other than the above-described effects.

Furthermore, the respective surface emission type electron sources 10a through 10h according to the second through eighth embodiments may also have a configuration in which the electron absorbing layer 140 is formed on the leading ends 20b of the quantum wires 20 and the electron absorbing layer 140 is electrically connected to the front electrode 12.

Next, a description is given of a tenth embodiment of the present invention.

Figure 15:
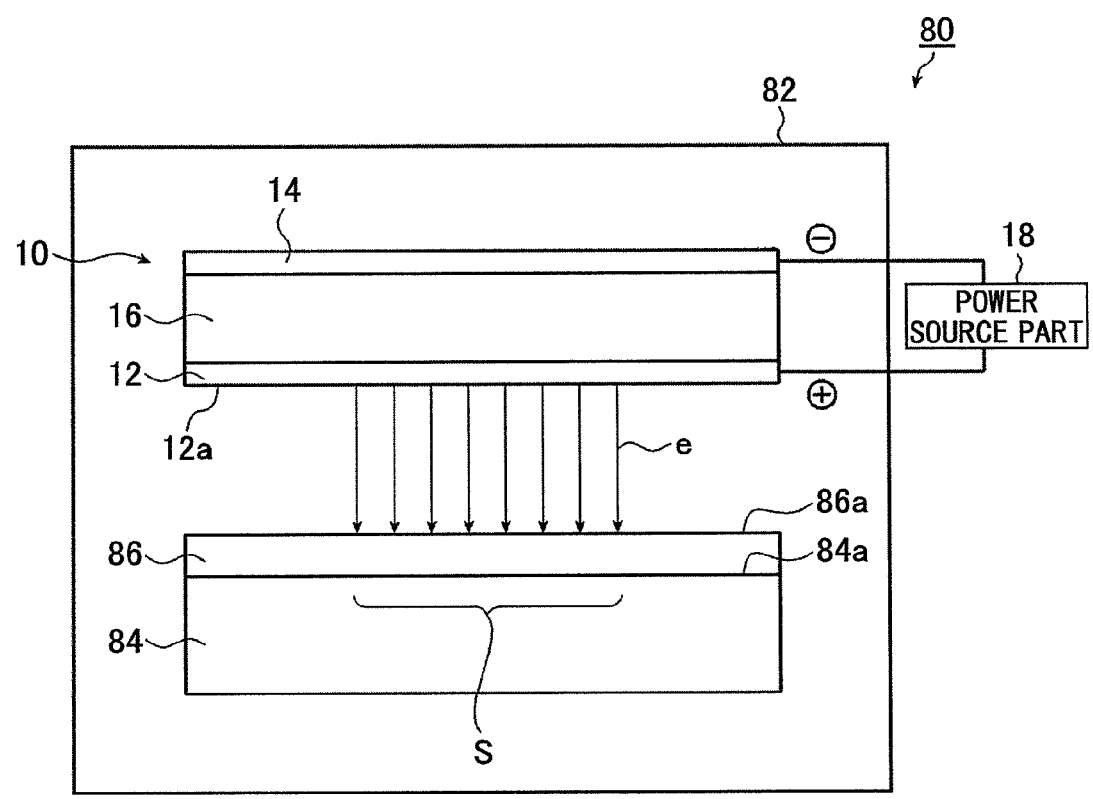
FIG. 15 is a schematic diagram of a surface emission type electron source according to a tenth embodiment of the present invention.

FIG. 15 is a schematic diagram of an electron emission device according to the tenth embodiment of the present invention.

In an electron emission device 80 according to the present embodiment, the same elements as those of the surface emission type electron source according to the first embodiment shown in FIG. 1 are denoted by the same reference numerals and are not further described.

In the electron emission device 80 shown in FIG. 15, the surface emission type electron source 10 (see FIG. 1) according to the first embodiment is provided as the surface emission type electron source. Accordingly, detailed descriptions regarding the surface emission type electron source 10 (see FIG. 1) according to the first embodiment are omitted.

In the electron emission device 80 according to the present embodiment, the surface emission type electron source 10 is disposed inside a vacuum chamber 82 such that the front surface 12a of the front electrode 12 faces a surface 84a of a stage 84. A substrate 86 is placed on the surface 84a of the stage 84. The substrate 86 is, for example, a silicon wafer whose size is greater than or equal to four inches. The vacuum chamber 82 has a vacuum exhauster (not shown) such as a vacuum pump, and therefore the inside of the vacuum chamber 82 can have a predetermined degree of vacuum.

In the electron emission device 80 according to the present embodiment, by means of the surface emission type electron source 10, electrons e having high rectilinearity can be extracted from the front surface 12a (electron emitting surface) of the front electrode 12 in a perpendicular direction. Accordingly, the electrons e are radiated in a substantially perpendicular direction onto a predetermined region S onto which the pattern is to be formed of the stage 84, i.e., the electrons e can be radiated onto a surface 86a of the substrate 86 in a perpendicular direction. Thus, in the electron emission device 80, a mask of a predetermined pattern is placed between the front surface 12a of the front electrode 12 and the surface 86a of the substrate 86, electrons e are radiated from the front surface 12a of the front electrode 12 to the surface 86a of the substrate 86 in a substantially perpendicular direction, so that highly rectilinear electron beams can be used to form a predetermined pattern at once at the same magnification on the substrate 86 with high resolution. Furthermore, by changing the size of the front electrode 12 (electron passage layer 16) of the surface emission type electron source 10, even when the region onto which the pattern is to be formed is large, the pattern can be formed at once at the same magnification. As described above, by using the surface emission type electron source 10, even when the region onto which the pattern is to be formed is large, electron beams can be used to form a pattern at once at the same magnification, and with high resolution.

Furthermore, in the present embodiment, similar to the surface emission type electron source 10a according to the second embodiment, the temperature adjusting unit 30 is provided for maintaining the electron passage layer 16 at a temperature less than or equal to room temperature (see FIG. 3).

Next, a description is given of an eleventh embodiment of the present invention.

Figure 16:
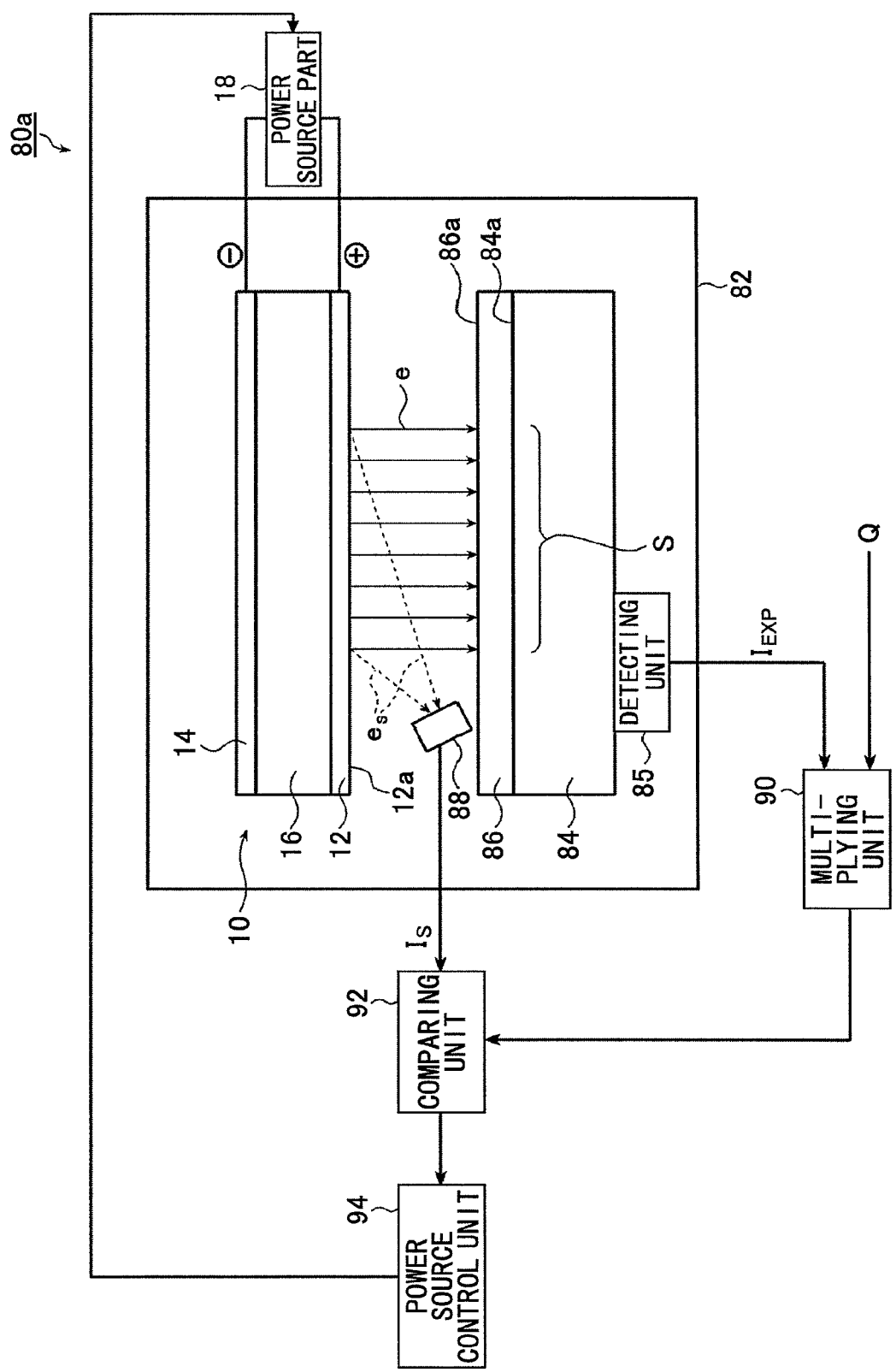
FIG. 16 is a schematic diagram of a surface emission type electron source according to an eleventh embodiment of the present invention.

FIG. 16 is a schematic diagram of an electron emission device according to the eleventh embodiment of the present invention.

In an electron emission device according to the present embodiment, the same elements as those of the surface emission type electron source according to the first embodiment shown in FIG. 1 are denoted by the same reference numerals and are not further described.

In an electron emission device 80a shown in FIG. 16, the surface emission type electron source 10 (see FIG. 1) according to the first embodiment is provided as the surface emission type electron source. Accordingly, detailed descriptions regarding the surface emission type electron source 10 (see FIG. 1) according to the first embodiment are omitted.

The electron emission device 80a according to the present embodiment is constituted by adding the following elements to the electron emission device 80 according to the tenth embodiment. Specifically, the electron emission device 80a includes a detecting unit 85 provided on the stage 84 for detecting the amount of electrons e in the region S onto which the pattern is to be formed in terms of a current value ($I_{EXP}$); a detecting sensor 88 for detecting, from among electrons emitted from the surface emission type electron source 10, electrons (scattered electrons $e_s$) that are emitted at a significantly large angle (with respect to the perpendicular direction) as a result of scattering in the electron passage layer 16; a multiplying unit 90 for calculating the product of a ratio Q of the allowable amount of scattered electrons in the total amount of emitted electrons e and the amount of electrons ($I_{EXP}$) emitted toward the stage 84 (substrate 86) detected by the detecting unit 85; a comparing unit 92 for comparing the output results (product $Q \cdot I_{EXP}$) from the multiplying unit 90 with the detection result of the detecting sensor 88 (current value Is); and a power source control unit 94 for adjusting the voltage applied by the power source part 18 in accordance with the comparison results obtained by the comparing unit 92.

The detecting unit 85 is for detecting the electrons emitted from the surface emission type electron source 10 toward the stage 84 (substrate 86) as, for example, a current value $I_{EXP}$. The detecting unit 85 measures the current value of the stage 84 during the pattern forming process, and detects this current value as the amount of electrons emitted from the surface emission type electron source 10 to the stage 84 (substrate 86). A known current measuring device may be used as the detecting unit 85.

The detecting sensor 88 is for detecting the scattered electrons $e_s$ emitted from the surface emission type electron source 10 as a current value Is. The detecting sensor 88 may be constituted by, for example, a scintillator and an optical electron multiplier. The detecting sensor 88 is for detecting scattered electrons $e_s$, and the configuration of the detecting sensor 88 is not particularly limited as long as secondary electrons that become noise are not generated when detecting the scattered electrons $e_s$.

The detecting sensor 88 is provided, for example, between the surface emission type electron source 10 and the stage 84, and outside the region S onto which the pattern is to be formed.

In the multiplying unit 90, an appropriate ratio Q is set, which is the allowable amount of scattered electrons in the total amount of emitted electrons e. The ratio Q is set in consideration of the processing precision of the pattern to be formed. The ratio Q of the allowable amount of scattered electrons in the total amount of emitted electrons e is obtained in advance based on, for example, experiment results.

The comparing unit 92 compares the output result of the multiplying unit 90 (product $Q \cdot I_{EXP}$) with the detection results of the detecting sensor 88 (current value Is). When $Q \cdot I_{EXP} < Is$ is satisfied as a result of the comparison, the comparing unit 92 outputs, to the power source control unit 94, a first signal indicating an instruction to reduce the output voltage from the power source part 18. Conversely, when $Q \cdot I_{EXP} > Is$ is satisfied as a result of the comparison, the comparing unit 92 outputs, to the power source control unit 94, a second signal indicating an instruction to raise the output voltage from the power source part 18.

When the first signal is input from the comparing unit 92, the power source control unit 94 reduces the output voltage from the power source part 18. Conversely, when the second signal is input form the comparing unit 92, the power source control unit 94 raises the output voltage from the power source part 18.

The electron emission device 80a according to the present embodiment detects the ratio of the scattered electrons, which do not move rectilinearly, included in the emitted electrons. Based on the detection results, the electron emission device 80*a* controls the voltage applied to the surface emission type electron source 10, further improves the rectilinearity of the emitted electrons, and improves the resolution when forming a pattern with the electron beams.

Furthermore, the electron emission device 80*a* according to the present embodiment reduces the voltage applied to the surface emission type electron source close to a value corresponding to the minimum voltage required for ballistic electron emission. Accordingly, electrons moving in a direction including horizontal components with respect to the electron emitting surface can be mitigated, by reflecting such electrons from an electronic barrier formed between the front electrode and a space (vacuum space) between the front electrode and the substrate.

With the present embodiment, the same effects as those of the tenth embodiment can be achieved. A mask of a predetermined pattern is placed between the front surface 12*a* of the front electrode 12 and the surface 86*a* of the substrate 86, electrons e are radiated from the front surface 12*a* of the front electrode 12 to the surface 86*a* in a substantially perpendicular direction, so that electron beams that are even more highly rectilinear than those of the tenth embodiment can be used to form a predetermined pattern at once at the same magnification on the substrate 86 with high resolution.

Next, a description is given of a twelfth embodiment of the present invention.

Figure 17:
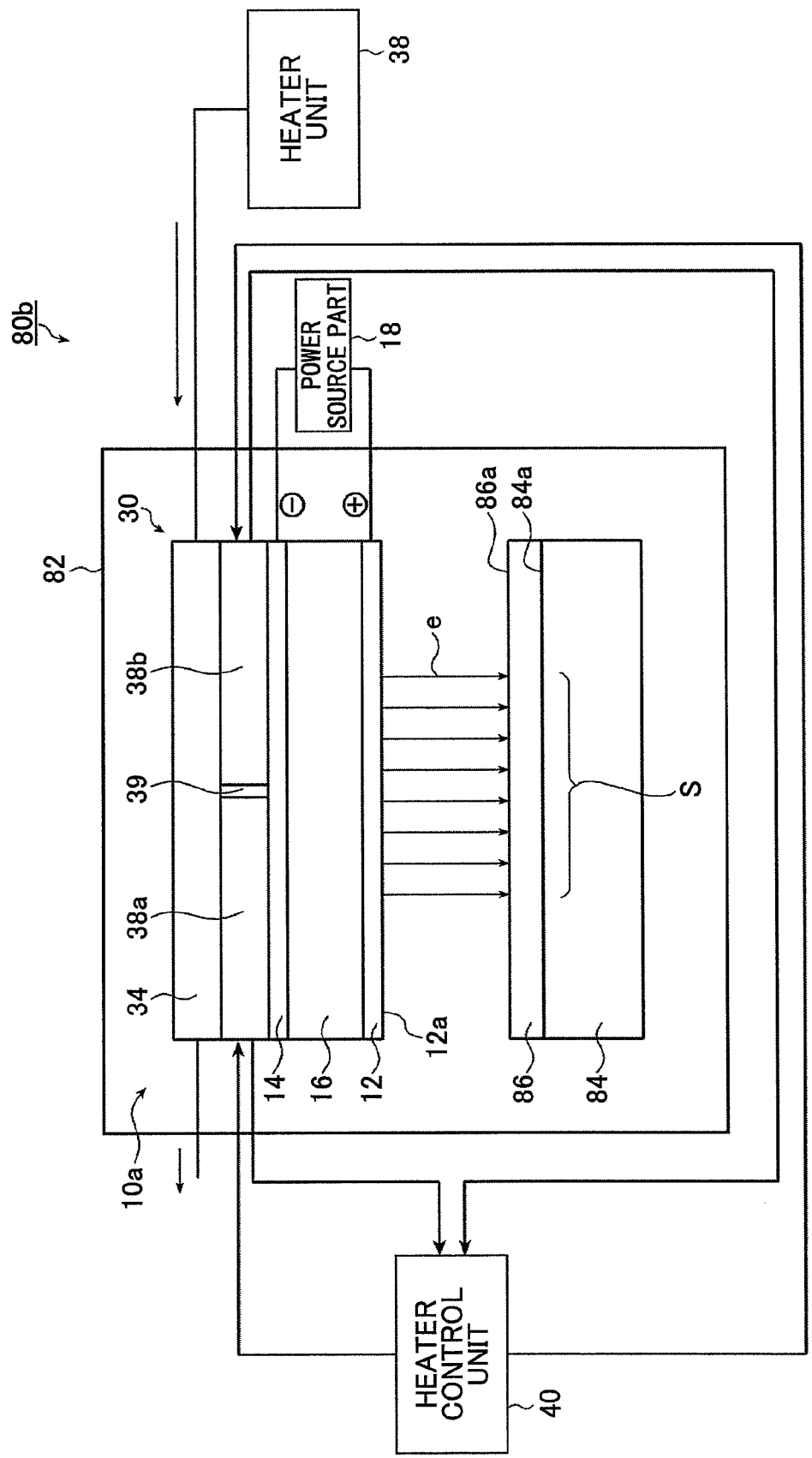
FIG. 17 is a schematic diagram of a surface emission type electron source according to a twelfth embodiment of the present invention.

FIG. 17 is a schematic diagram of an electron emission device according to the twelfth embodiment of the present invention.

In an electron emission device according to the present embodiment, the same elements as those of the surface emission type electron source according to the second embodiment shown in FIG. 3 are denoted by the same reference numerals and are not further described.

In an electron emission device 80*b* shown in FIG. 17, the surface emission type electron source 10*a* (see FIG. 3) according to the second embodiment is provided as the surface emission type electron source. Accordingly, detailed descriptions regarding the surface emission type electron source 10*a* (see FIG. 3) according to the second embodiment are omitted.

In the electron emission device 80*b* according to the present embodiment, the surface emission type electron source 10*a* is used, and therefore a uniform temperature distribution of, for example, approximately 100K can be achieved in the electron passage layer 16.

In the electron emission device 80*b* according to the present embodiment, the surface emission type electron source 10*a* is used, and therefore the temperature can be maintained uniform, the electron emission amount can be prevented from varying, and the surface emission type electron source 10*a* is prevented from being distorted. Accordingly, in the electron emission device 80*b*, the electron emission amount in the region S onto which the pattern is to be formed is prevented from varying and the surface emission type electron source 10*a* is prevented from being distorted, and therefore the electron emission device 80*b* can form a pattern with higher precision compared to the case of the tenth embodiment.

Figure 9:
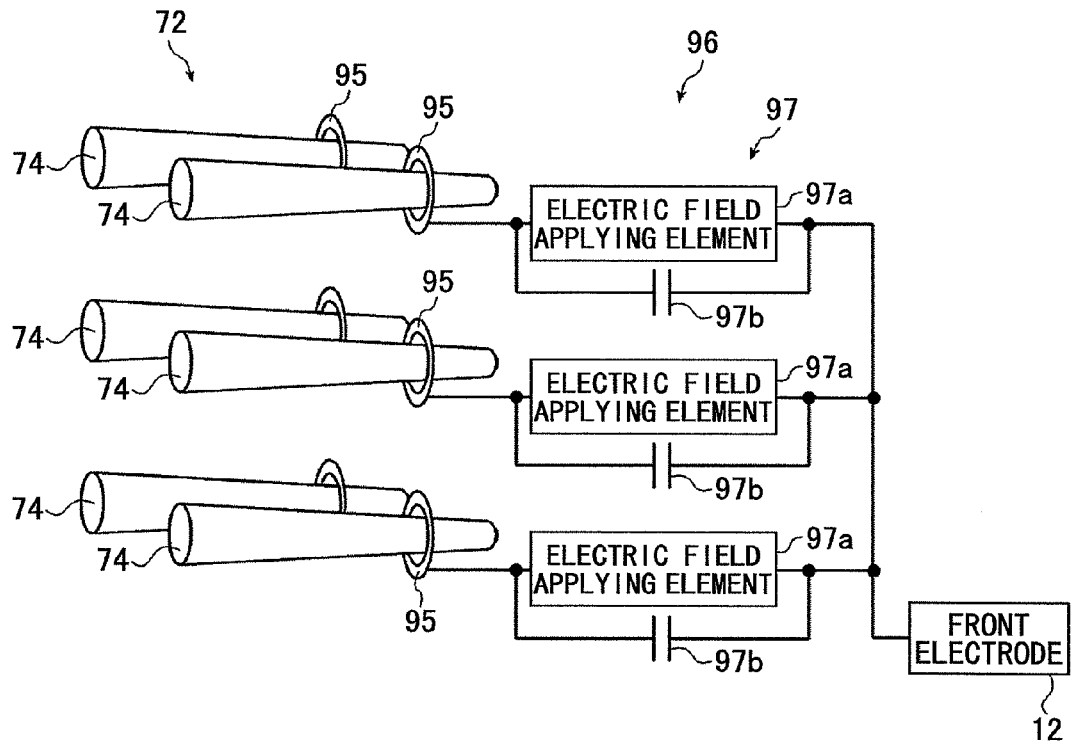
FIG. 9(a) is a schematic perspective view of a first modification of the surface emission type electron source according to the fifth embodiment of the present invention.
FIG. 9b is a schematic perspective view of a second modification of the surface emission type electron source according to the fifth embodiment of the present invention.
Figure 9:
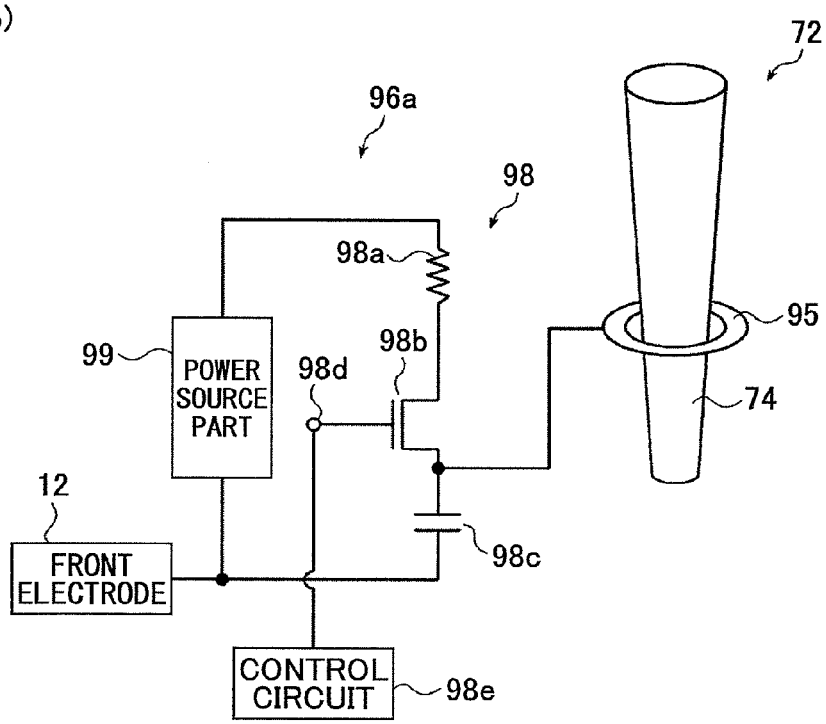

Furthermore, any of the electron emission devices 80 through 80*b* according to the tenth through twelfth embodiments described above may have the porous member 72 shown in FIG. 8 provided on the front surface 12*a* of the front electrode 12, and may have the configuration shown in FIG. 9(*a*) or FIG. 9(*b*) provided on the front surface 12*a* of the front electrode 12.

Furthermore, the electron emission device 80*a* according to the eleventh embodiment may be combined with the electron emission device 80*b* according to the twelfth embodiment, so that the electron emission device 80*a* according to the eleventh embodiment includes the temperature adjusting unit 30.

Furthermore, the surface emission type electron source 10*f* according to the sixth embodiment may be used to form an electron emission device. As described above, the surface emission type electron source 10*f* can emit patterned surface electron beams having high rectilinearity while maintaining the shape of a predetermined two-dimensional pattern. Accordingly, when a predetermined pattern is formed on a substrate being radiated by the emitted electrons, a pattern formed with electron beams can have increased resolution.

Conventionally, a pattern of electron beams are formed by changing the shape of the surface electrode or by providing a mask having patterns on the surface electrode. However, in the present embodiment, there is no need to change the shape of the surface electrode or to provide a mask on the surface electrode, and therefore the structure can be simplified. Furthermore, in the present embodiment, the pattern of electron beams can be changed according to the substrate being radiated by the emitted electrons.

Next, a description is given of a thirteenth embodiment of the present invention.

Figure 18:
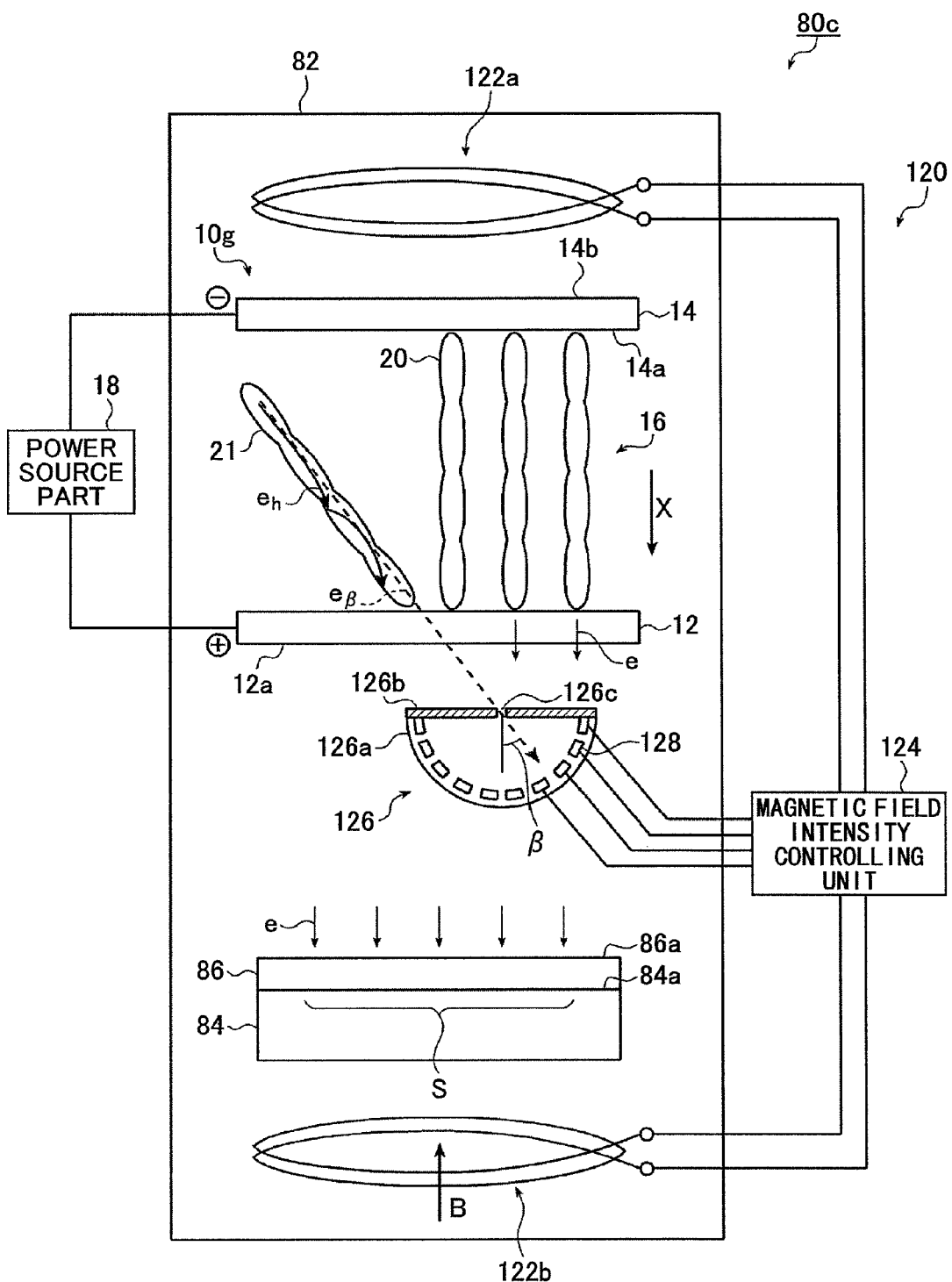
FIG. 18 is a schematic diagram of a surface emission type electron source according to a thirteenth embodiment of the present invention.

FIG. 18 is a schematic diagram of an electron emission device according to the thirteenth embodiment of the present invention.

In an electron emission device 80*c* according to the present embodiment, the same elements as those of the surface emission type electron source according to the seventh embodiment shown in FIG. 12 are denoted by the same reference numerals and are not further described.

In the electron emission device 80*c* shown in FIG. 18, the surface emission type electron source 10*g* is provided as the surface emission type electron source. Accordingly, detailed descriptions regarding the surface emission type electron source 10*g* (see FIG. 12) according to the seventh embodiment are omitted.

In the electron emission device 80*c* according to the present embodiment, the surface emission type electron source 10*g* is disposed inside the vacuum chamber 82 such that the front surface 12*a* of the front electrode 12 faces the surface 84*a* of the stage 84. The substrate 86 is placed on the surface 84*a* of the stage 84. The substrate 86 is, for example, a silicon wafer of a diameter greater than or equal to four inches.

In the electron emission device 80*c* according to the present embodiment, by means of the surface emission type electron source 10*g*, electrons e having rectilinearity that is even higher than the case of the surface emission type electron source 10 according to the first embodiment, can be extracted from the front surface 12*a* (electron emitting surface) of the front electrode 12. Accordingly, the electrons e are radiated in a substantially perpendicular direction onto a predetermined region S onto which the pattern is to be formed of the stage 84, i.e., the electrons e can be radiated onto a surface 86*a* of the substrate 86 in a perpendicular direction. Thus, in the electron emission device 80*c*, a mask of a predetermined pattern is placed between the front surface 12*a* of the front electrode 12 and the surface 86*a* of the substrate 86, and electrons e are radiated from the front surface 12*a* of the front electrode 12 to the surface 86*a* of the substrate 86 in a substantially perpendicular direction, so that highly rectilinear electron beams can be used to form a predetermined pattern at once at the same magnification on the substrate 86 with high resolution. Furthermore, by changing the size of the front electrode 12 (electron passage layer 16) of the surface emission type electron source 10g, when the region onto which the pattern is to be formed is large, the pattern can be formed at once at the same magnification. As described above, by using the surface emission type electron source 10g, even when the region onto which the pattern is to be formed is large, electron beams can be used to form a pattern at once at the same magnification, and with even higher resolution.

Next, a description is given of a fourteenth embodiment of the present invention.

Figure 19:
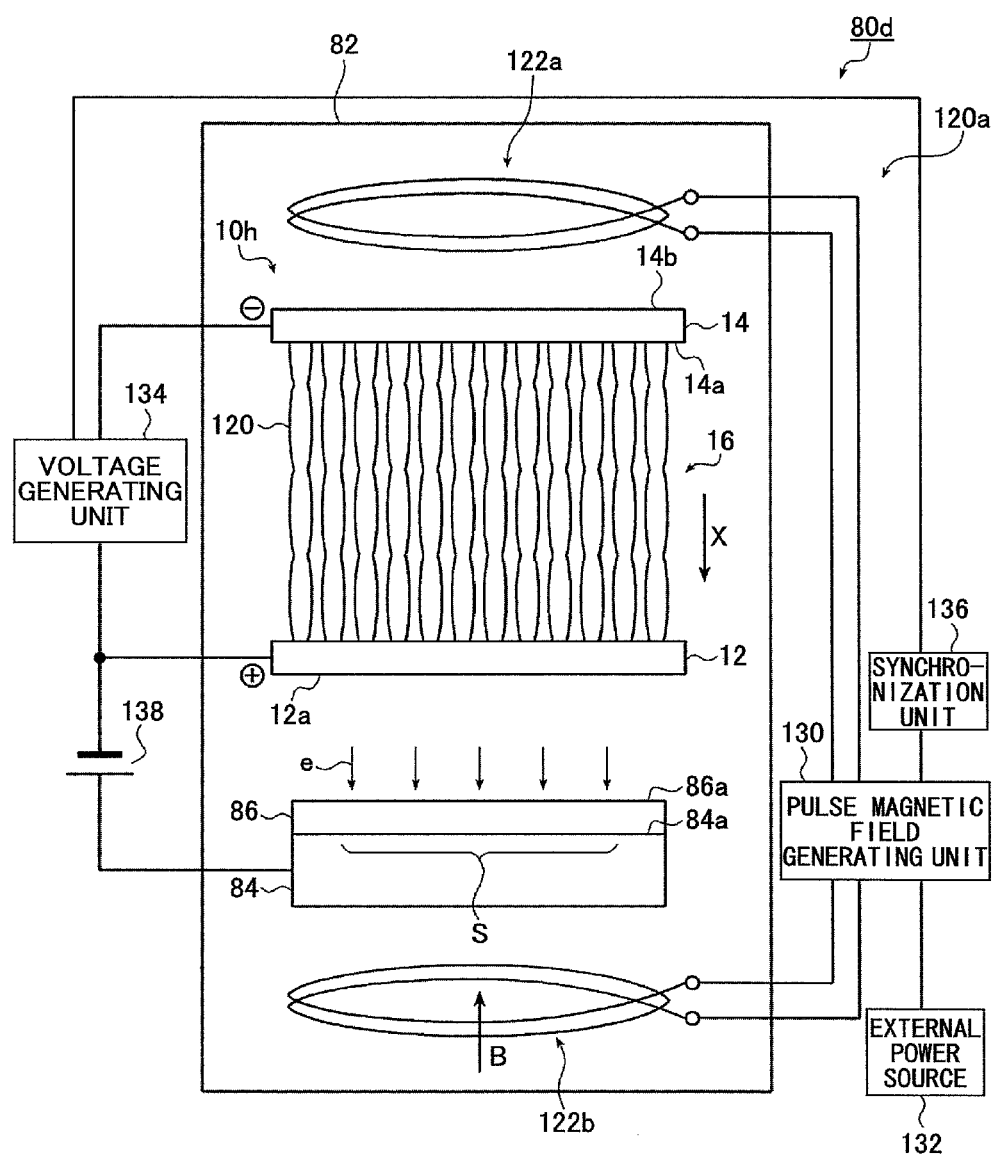
FIG. 19 is a schematic diagram of a surface emission type electron source according to a fourteenth embodiment of the present invention.

FIG. 19 is a schematic diagram of an electron emission device according to the fourteenth embodiment of the present invention.

In an electron emission device 80d according to the present embodiment, the same elements as those of the surface emission type electron source according to the eighth embodiment shown in FIG. 13 are denoted by the same reference numerals and are not further described.

In the electron emission device 80d shown in FIG. 19, the surface emission type electron source 10h (see FIG. 13) according to the eighth embodiment is provided as the surface emission type electron source. Accordingly, detailed descriptions regarding the surface emission type electron source 10h (see FIG. 13) according to the eighth embodiment are omitted.

In the electron emission device 80d according to the present embodiment, the surface emission type electron source 10h is disposed inside the vacuum chamber 82 such that the front surface 12a of the front electrode 12 faces the surface 84a of the stage 84. The substrate 86 is placed on the surface 84a of the stage 84. The substrate 86 is, for example, a silicon wafer of diameter greater than or equal to four inches.

In the electron emission device 80d according to the present embodiment, by means of the surface emission type electron source 10h, electrons e having even higher rectilinearity, which are prevented from spreading in a direction parallel to the front surface 12a of the front electrode 12 of nanometer-scale, can be extracted. Accordingly, the electrons e are radiated in a substantially perpendicular direction onto a predetermined region S onto which the pattern is to be formed of the stage 84, i.e., the electrons e can be radiated onto a surface 86a of the substrate 86 in a perpendicular direction. Thus, in the electron emission device 80d, a mask of a predetermined pattern is placed between the front surface 12a of the front electrode 12 and the surface 86a of the substrate 86, and electrons e are radiated from the front surface 12a of the front electrode 12 to the surface 86a of the substrate 86 in a substantially perpendicular direction, so that even more highly rectilinear electron beams can be used to form a predetermined pattern at once at the same magnification on the substrate 86 with high resolution. Furthermore, by changing the size of the front electrode 12 (electron passage layer 16) of the surface emission type electron source 10h, when the region onto which the pattern is to be formed is large, the pattern can be formed at once at the same magnification. As described above, by using the surface emission type electron source 10h, even when the region onto which the pattern is to be formed is large, electron beams can be used to form a pattern at once at the same magnification, and with high resolution.

Next, a description is given of a fifteenth embodiment of the present invention.

Figure 20:
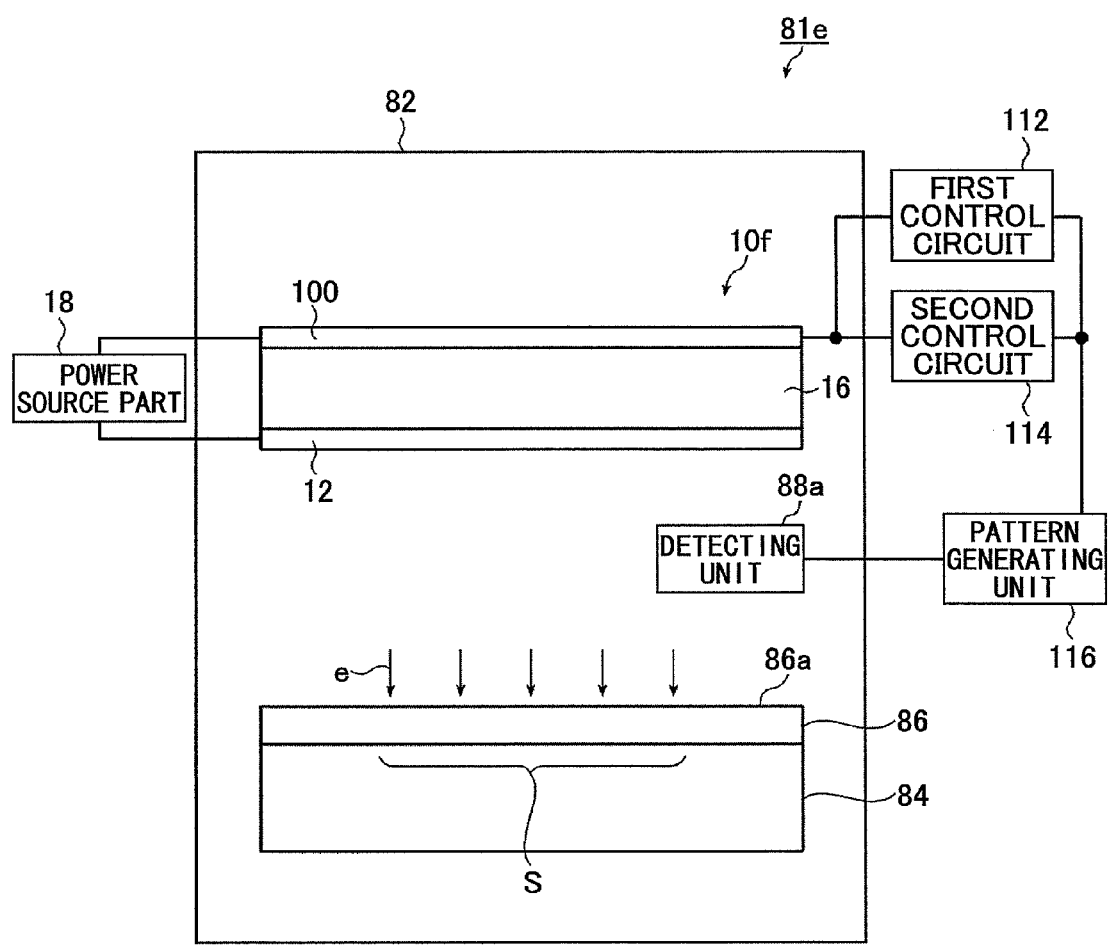
FIG. 20 is a schematic diagram of a surface emission type electron source according to a fifteenth embodiment of the present invention.

FIG. 20 is a schematic diagram of an electron emission device according to the fifteenth embodiment of the present invention.

Figure 21:
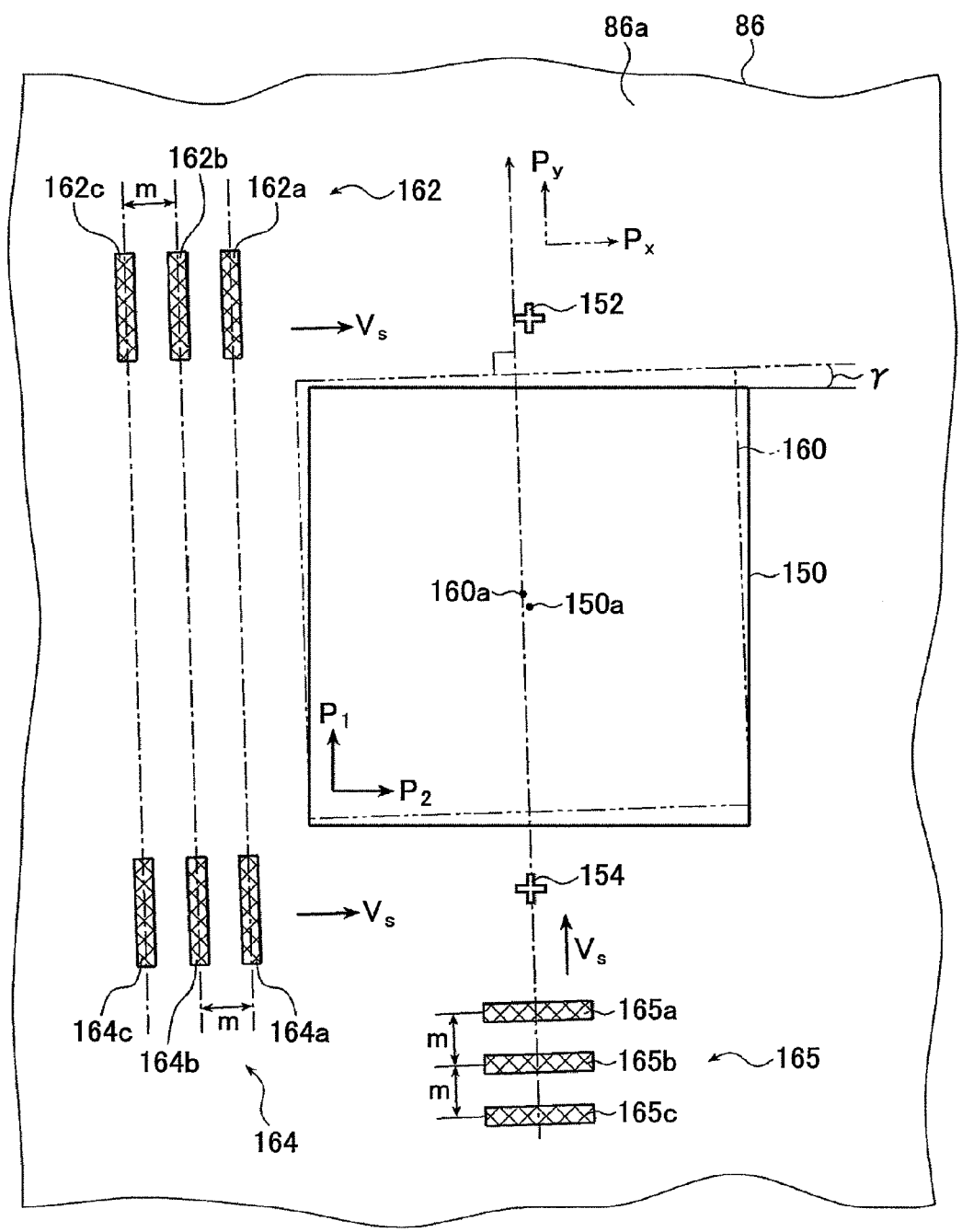
FIG. 21 is a schematic diagram for describing a pattern forming method performed by the electron emission device according to the fifteenth embodiment of the present invention.
Figure 22:
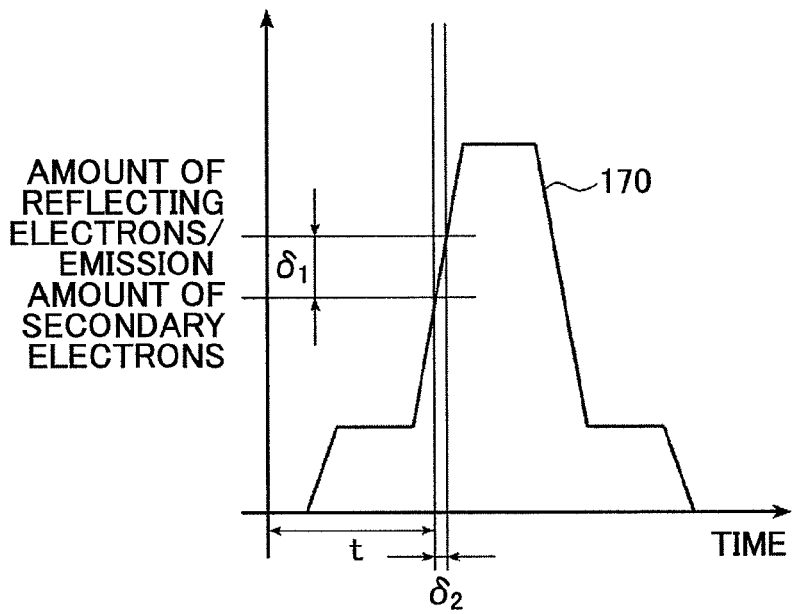
FIG. 22(a) is a graph indicating an example of detection results of marks obtained by the drawing method according to the present embodiment.
FIG. 22(b) is a graph indicating another example of detection results of marks obtained by the pattern forming method according to the present embodiment.
Figure 22:
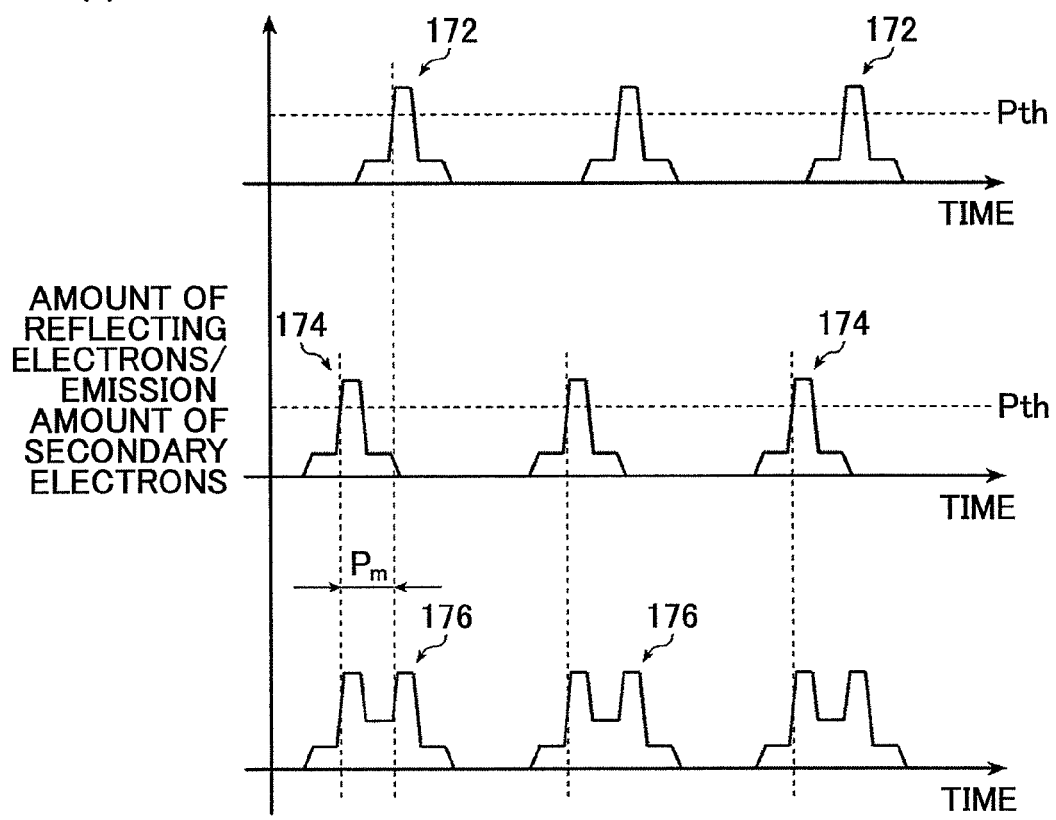
Figure 23:
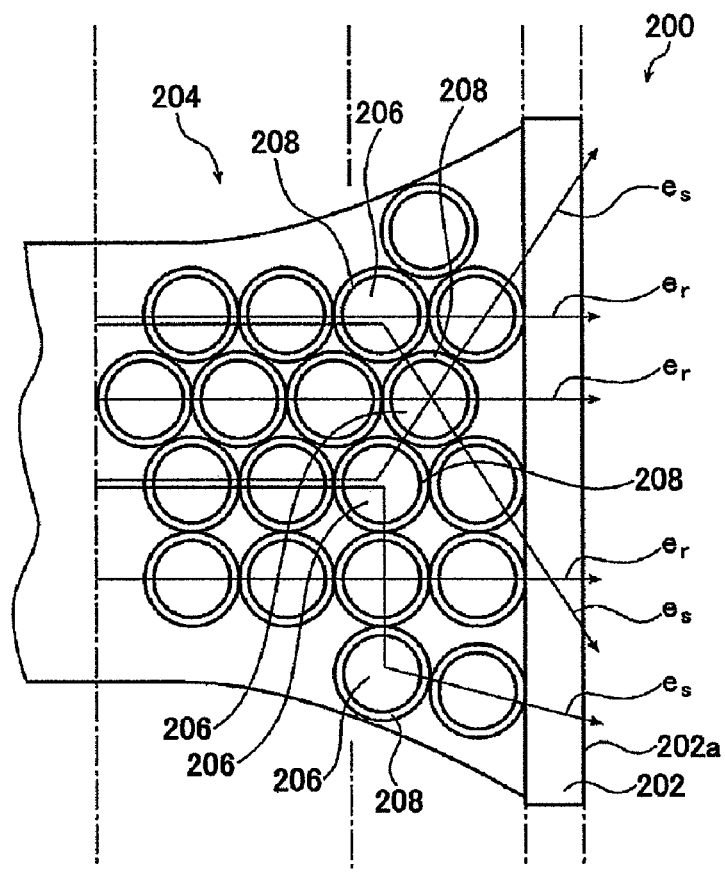
FIG. 23 is a schematic diagram of an electron beam source disclosed in patent document 1 and patent document 2.
Figure 24:
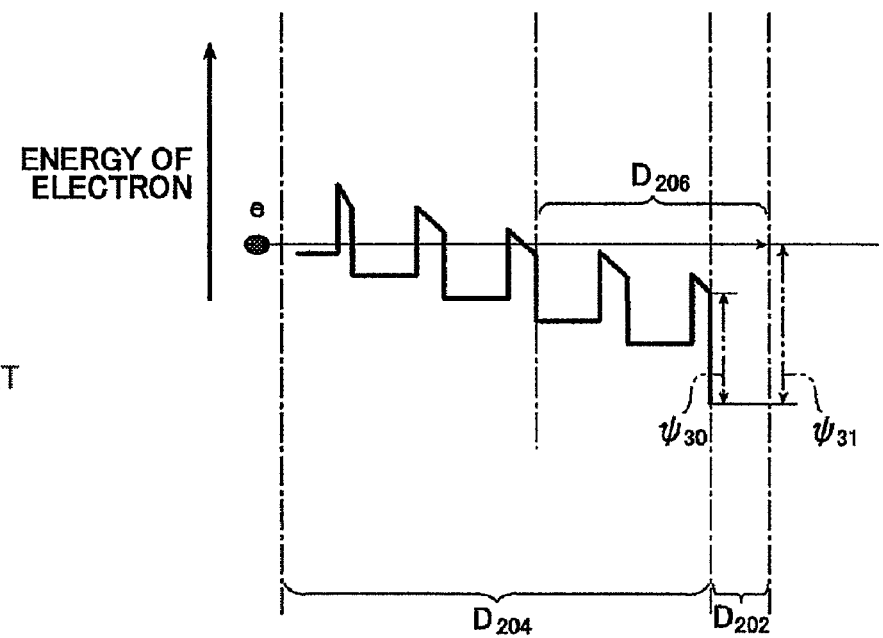
FIG. 24 is an energy band diagram of the electron beam source disclosed in patent document 1 and patent document 2, where the vertical axis represents the energy of the electrons and the horizontal axis represents the position.

FIG. 21 is a schematic diagram for describing a pattern forming method performed by the electron emission device according to the fifteenth embodiment of the present invention. FIG. 22(a) is a graph indicating an example of detection results of marks obtained by the pattern forming method according to the present embodiment, and FIG. 22(b) is a graph indicating another example of detection results of marks obtained by the pattern forming method according to the present embodiment.

In an electron emission device 81e according to the present embodiment, the same elements as those of the surface emission type electron source according to the sixth embodiment shown in FIGS. 10(a) and 10(b) are denoted by the same reference numerals and are not further described.

In the electron emission device 81e shown in FIG. 20, the surface emission type electron source 10f (see FIGS. 10(a) and 10(b)) according to the sixth embodiment is provided as the surface emission type electron source. Accordingly, detailed descriptions regarding the surface emission type electron source 10f (see FIGS. 10(a) and 10(b)) according to the sixth embodiment are omitted.

In the electron emission device 81e according to the present embodiment, the surface emission type electron source 10f is disposed inside the vacuum chamber 82 such that the front surface 12a of the front electrode 12 faces the surface 84a of the stage 84. The substrate 86 is placed on the surface 84a of the stage 84. The substrate 86 is, for example, a silicon wafer of a diameter greater than or equal to four inches.

In the electron emission device 81e, a detecting unit 88a is provided above the substrate 86 inside the vacuum chamber 82, and the detecting unit 88a is connected to the pattern generating unit 116.

The detecting unit 88a is for detecting, for example, secondary electrons or reflection electrons generated on the surface 86a of the substrate 86. The detecting unit 88a may be constituted by, for example, a scintillator and an optical electron multiplier.

In the electron emission device 81e according to the present embodiment, by means of the surface emission type electron source 10f, electrons e can be emitted from the front surface 12a of the front electrode 12 according to a predetermined two-dimensional pattern, and emission electrons having high rectilinearity can be extracted from the front surface 12a (electron emitting surface) of the front electrode 12 in a substantially perpendicular direction. Thus, in the electron emission device 81e, highly rectilinear electron beams can be used to form a predetermined pattern at once at the same magnification on the substrate 86 with high resolution, without the need of providing a mask of the predetermined pattern between the front surface 12a of the front electrode 12 and the surface 86a of the substrate 86. Furthermore, by changing the size of the front electrode 12 (electron passage layer 16) of the surface emission type electron source 10f, even when the region onto which the pattern is to be formed is large, the pattern can be formed at once at the same magnification. As described above, by using the surface emission type electron source 10f, even when the region onto which the pattern is to be formed is large, electron beams can be used to form a pattern at once at the same magnification, and with high resolution.

Next, a description is given of a pattern forming method performed by the electron emission device 81e according to the present embodiment, by taking as an example a case where the surface emission type electron source 10f is used to form a pattern on a rectangular region 150 onto which the pattern is to be formed on the surface 86a of the substrate 86 as shown in FIG. 21.

The region 150 onto which the pattern is to be formed is, for example, a square area. The region 150 onto which the pattern is to be formed has two pairs of parallel sides facing each other. The sides of one pair are parallel to a $P_1$ direction, and the sides of the other pair are parallel to a $P_2$ direction, where the $P_1$ direction and the $P_2$ direction are orthogonal to each other on the surface 86a of the substrate 86.

On the surface 86a of the substrate 86, alignment marks 152 and 154 are provided outside the region 150 onto which the pattern is to be formed. The alignment marks 152 and 154 are spaced apart in the $P_1$ direction and are aligned with each other in the $P_2$ direction. The alignment marks 152 and 154 have an electron reflectance and a secondary electron emissivity that are different from those of the surface 86a of the substrate 86. Accordingly, the detecting unit 88a can detect reflectance electrons or secondary electrons from the alignment marks 152 and 154.

In the surface emission type electron source 10f, among all regions on the front electrode 12 from which electrons e can be emitted, it is possible to specify a particular region from which electrons e used for pattern forming are to be emitted, in accordance with, for example, the region 150 onto which the pattern is to be formed. Thus, an electron emission region 160 is specified in accordance with the region 150 onto which the pattern is to be formed.

In this case, even in a region outside the electron emission region 160, the electrons e can be emitted as a predetermined pattern as long as the electrons e can be emitted.

The electron emission region 160 has the same shape and size as the region 150 onto which the pattern is to be formed. Similar to the region 150 onto which the pattern is to be formed, the electron emission region 160 also has two pairs of parallel sides facing each other. The sides of one pair are parallel to a $P_x$ direction, and the sides of the other pair are parallel to a $P_y$ direction, where the $P_x$ direction and the $P_y$ direction are orthogonal to each other on the front surface 12a of the front electrode 12.

In the surface emission type electron source 10f, as described above, electrons e corresponding to a pattern to be formed on the region 150 onto which the pattern is to be formed are emitted from the electron emission region 160 to form the pattern.

First, it is necessary to match the positions of the region 150 onto which the pattern is to be formed and the electron emission region 160.

In the present embodiment, a description is given of a case where a center 150a of the region 150 onto which the pattern is to be formed does not match a center 160a of the electron emission region 160, and the region 150 onto which the pattern is to be formed and the electron emission region 160 are displaced from one another by an angle γ.

When forming the pattern, first, the surface emission type electron source 10f is fixed, and two groups of electron beam rows 162 and 164 are generated in the $P_y$ direction outside of the electron emission region 160. The groups of electron beam rows 162 and 164 respectively include three electron beam rows 162a through 162c and 164a through 164c, extending in the $P_y$ direction. The electron beam rows 162a through 162c and 164a through 164c of the groups of electron beam rows 162 and 164 are scanned in the $P_x$ direction at a scanning speed of Vs. That is, the quantum wires 20 for emitting the electrons e are sequentially moved in the $P_x$ direction at a scanning speed of Vs, while maintaining the electron beam rows 162a through 162c and 164a through 164c.

The electron beam rows 162a and 164a have the same coordinates in the $P_x$ direction, the electron beam rows 162b and 164b have the same coordinates in the $P_x$ direction, and the electron beam rows 162c and 164c have the same coordinates in the $P_x$ direction.

In conventional cases, a mark position is detected based on the time when a pulse signal indicating an amount of reflected electrons or an emission amount of secondary electrons is generated, which is generally obtained by scanning the mark with a single point beam.

In the present embodiment, for example, the coordinates from which scanning is to start in the $P_x$ direction (scanning-start coordinates) are determined, and the electron beam rows 162a through 162c and 164a through 164c are scanned. When the electron beam rows 162a through 162c and 164a through 164c reach the alignment marks 152 and 154, the signal indicating an amount of reflecting electrons or an emission amount of secondary electrons changes into a pulse. This change is used to calculate a time t from the time when scanning starts to the time when pulses appear. Accordingly, the positions of the alignment marks 152 and 154 can be detected from the beam scanning speed Vs which is already known. The time when the pulse appears is, for example, the time when the pulse signal exceeds a predetermined threshold Pth.

Generally, as shown in FIG. 22(a), a signal 170 indicating an amount of reflecting electrons or an emission amount of secondary electrons is not steep, and an error $\delta_2$ tends to occur when the pulse rises at the time t. Furthermore, an error $\delta_1$ of the detecting unit 88a may also occur in the signal 170 indicating an amount of reflecting electrons or an emission amount of secondary electrons. With the mark position detecting method according to the present embodiment, the positions can be detected with high speed and high precision by using the electron beam rows 162a through 162c and 164a through 164c.

In the present embodiment, a description is given of an example of detecting the positions of the alignment marks 152 and 154 by using the time until a pulse appears. However, the present embodiment is also applicable to a method of detecting the positions by using the time until the maximum value of the pulse is attained or the time taken to reach the time corresponding to the middle of the pulse. In this example, only one detecting unit 88a for detecting the amount of reflecting electrons or the emission amount of secondary electrons is provided.

FIG. 22(b) shows rows of pulse signals 172, 174, and 176, the pulse signals indicating an amount of reflecting electrons or an emission amount of secondary electrons acquired when the electron beam rows 162a through 162c and 164a through 164c shown in FIG. 21 scan the alignment marks 152 and 154.

The row of pulse signals 176 shown at the bottom of FIG. 22(b) is obtained when the electron beam rows 162a through 162c and 164a through 164c simultaneously scan the alignment marks 152 and 154, i.e., the signals from the alignment marks 152 and 154 are superposed.

As described below, by sufficiently reducing the beam width in the scanning direction, the signal from the alignment mark 152 and the signal from the alignment mark 154 can be separated.

Furthermore, the alignment mark 152 and the alignment mark 154 can be separately scanned; however, in this case, an error may occur in the detected positions if either of the positions changes while performing the scanning process twice.

In the present embodiment, a pulse signal 172 originating from the alignment mark 152 and a pulse signal 174 originating from the alignment mark 154 are separately described. The pulse signals 172 and 174 do not appear at the detecting unit 88a.

The graph at the second row in FIG. 22(b) indicates a row of the pulse signals 174 obtained when the electron beam rows 164a through 164c scan the alignment mark 154. The pulse signals 174 in this row are generated at intervals of a time expressed by m/(Vs·cos γ), with respect to the scanning speed Vs of the electron beam rows 164a through 164c that are equally spaced apart at intervals of m.

When the mark position is detected based on the time when a single pulse signal 174 appears, the same error as described with reference to FIG. 22(a) may occur. Therefore, the intervals of the pulse signals 174 are measured and averaged. Then, the time from the scanning-start coordinates until the pulse appears is obtained. In this manner, the mark position can be detected with high precision.

Furthermore, the top graph in FIG. 22(b) indicates a row of the pulse signals 172 obtained when the electron beam rows 162a through 162c scan the alignment mark 152. Similar to the case of the alignment mark 154, the mark position can be detected with high precision.

A phase difference Pm between the pulse signal 174 originating from the alignment mark 154 and the pulse signal 172 originating from the alignment mark 152 is determined by the relative angle between the surface emission type electron source and the substrate being radiated by the emitted electrons. Accordingly, by averaging the phase differences Pm between the pulse signals 172 and 174, the relative angle can be detected within a short period of time and with high precision. Furthermore, the time intervals in the rows of the pulse signals 172 and 174 increase depending on the increase of the relative angle, and therefore the relative angle and the mark position may be detected together based on the time intervals in the rows of the pulse signals 172 and 174. Such a method requires only one row of electron beams and only one mark.

Furthermore, the positions of the alignment marks 152 and 154 in the $P_y$ direction can also be detected with the same method as that used for the $P_x$ direction.

However, when detecting the positions of the alignment marks 152 and 154 in the $P_y$ direction, the following points are different from the case of detecting the mark positions in the $P_x$ direction. That is, as shown in FIG. 21, a single group of electron beam rows 165 including three electron beam rows 165a, 165b, and 165c extending in the $P_x$ direction is used to scan across the region 150 onto which the pattern is to be formed in the $P_y$ direction. Furthermore, in the region 150 onto which the pattern is to be formed, electrons e are prevented from being radiated from the electron beam rows 165a, 165b, and 165c by blanking the electron beam rows 165a, 165b, and 165c. Otherwise, the method of detecting the alignment marks 152 and 154 is the same as that in the case of detecting the mark positions in the $P_x$ direction, and is thus not further described.

Maximum detection precision can be achieved by forming the electron beam rows 162a through 162c and 164a through 164c so as to have the minimum width in the scanning direction ($P_x$ direction) required for the surface emission type electron source to emit electrons. Furthermore, the width of the electron beam rows in the $P_y$ direction (direction perpendicular to the scanning direction of the beams) is to be sufficiently large with respect to the relative angle and the relative positional displacement between the surface emission type electron source and the exposure target, so that the marks can be definitely scanned.

In accordance with the detection results of the positions of the alignment marks 152 and 154 in the $P_x$ direction and the $P_y$ direction obtained in the above manner, the pattern to be formed is converted into coordinates so that the pattern generating unit 116 can appropriately form the pattern in the region 150 onto which the pattern is to be formed. Electrons e corresponding to the pattern that has been converted into coordinates are emitted from the electron emission region 160 to form the pattern. Accordingly, the pattern can be formed in the region 150 onto which the pattern is to be formed with high precision.

Furthermore, the stage 84 is configured to translate and rotate in a planar direction. In accordance with the detected positions of the alignment marks 152 and 154, the stage 84 is moved by rotating, translating, or rotating and translating the stage 84, so that the pattern is formed at an appropriate position in the region 150 onto which the pattern is to be formed. This process also provides the effect of forming a pattern in the region 150 onto which the pattern is to be formed with high precision.

All of the surface emission type electron sources and electron emission devices according to the above embodiments may be suitably used for manufacturing various products including a semiconductor device such as a memory, a master optical disk such as a DVD, a hard disk, or a micromachine.

INDUSTRIAL APPLICABILITY

The surface emission type electron source and the electron emission device according to the present invention have a electron passage layer constituted by quantum wires, and therefore highly rectilinearly moving electrons from the quantum wires can be extracted from the front surface (electron emitting surface) of the front electrode in a substantially perpendicular direction. Accordingly, highly rectilinear electron beams can be used to form a pattern at once at the same magnification on the substrate with high resolution. Furthermore, by changing the size of the front electrode of the surface emission type electron source, even when the region onto which the pattern is to be formed is large, the pattern can be formed at once at the same magnification. As described above, even when the region onto which the pattern is to be formed is large, electron beams can be used to form a pattern at once at the same magnification, and with high resolution.

The present invention is not limited to the specifically disclosed embodiment, and variations and modifications may be made without departing from the scope of the present invention.

The present application is based on Japanese Priority Patent Application No. 2007-115471, filed on Apr. 25, 2007, and Japanese Priority Patent Application No. 2007-207887, filed on Aug. 9, 2007, the entire contents of which are hereby incorporated by reference.

The invention claimed is:

1. A surface emission type electron source comprising:
a first electrode having a planar form;
a second electrode having a planar form facing the first electrode;
an electron passage layer disposed between the first electrode and the second electrode;
a power source part configured to apply a voltage to the second electrode and the first electrode; and
a porous member comprising a plurality of tube members that are bound together, wherein:

the electron passage layer comprises a plurality of quantum wires extending in a first direction from the first electrode to the second electrode, the quantum wires being spaced apart from each other at predetermined intervals, and electrons are emitted from a front surface of the second electrode; and the quantum wires are made of silicon, a layer constituted by an insulator or a semiconductor is formed between the second electrode and the electron passage layer, and protrusions protruding toward leading ends of the quantum wires are formed on a back surface of the second electrode at positions corresponding to the quantum wires, each tube member has a first opening at one end and a second opening at another end that is wider than the first opening, each tube member has a diameter that monotonously increases from the first opening toward the second opening, and the porous member is connected to the front surface of the second electrode such that the first openings are facing the front surface of the second electrode.

2. The surface emission type electron source according to claim 1, wherein:

each of the quantum wires has a plurality of thin parts having small thicknesses formed at predetermined intervals along the first direction.

3. The surface emission type electron source according to claim 1, further comprising:

a temperature adjusting unit configured to maintain the electron passage layer at a temperature less than or equal to room temperature.

4. The surface emission type electron source according to claim 1, further comprising:

a surface electrode having a planar form that is connected to the porous member on a side of the porous member having the second openings, wherein each tube member is constituted by an insulator or a semiconductor.

5. The surface emission type electron source according to claim 1, further comprising:

an electrode provided for each tube member of the porous member;

a second power source part configured to apply a voltage to a part between the second electrode and each of the electrodes; and a control unit configured to control the voltage applied by the second power source part, wherein:

each tube member is constituted by an insulator or a semiconductor.

6. The surface emission type electron source according to claim 1, wherein:

on the first electrode, a conductive body is disposed in a region corresponding to a region from which the electrons are emitted from the front surface of the second electrode, and an insulator is disposed in regions other than the region corresponding to the region from which the electrons are emitted.

7. The surface emission type electron source according to claim 1, wherein:

an electron absorber formed as a predetermined pattern is provided on the front surface of the second electrode.

8. The surface emission type electron source according to claim 1, further comprising:

a plurality of switch elements provided on the first electrode, wherein the switch elements are connected to at least one of the quantum wires and are configured to switch to a conductive state, a non-conductive state, or a half-conductive state; and a switch control unit configured to switch particular switch elements among the switch elements to the conductive state, wherein the particular switch elements are provided in the region corresponding to the region from which the electrons are emitted from the front surface of the second electrode.

9. The surface emission type electron source according to claim 1, wherein:

the quantum wire has a thickness of less than or equal to 5 nm.

10. The surface emission type electron source according to claim 1, wherein:

the predetermined intervals between the quantum wires are greater than or equal to atom intervals of substances constituting the quantum wires.

11. The surface emission type electron source according to claim 1, further comprising:

a magnetic field applying unit configured to apply a magnetic field in a direction perpendicular to the front surface of the second electrode;

an electron emission angle detector configured to detect an emission angle of the electron emitted from the front surface of the second electrode when the voltage is applied by the power source part; and a control unit configured to adjust an intensity of the magnetic field applied by the magnetic field applying unit based on a detection result indicating the emission angles of the electrons obtained by the electron emission angle detector.

12. The surface emission type electron source according to claim 1, further comprising:

a pulse magnetic field applying unit configured to apply a pulse magnetic field in a direction perpendicular to the front surface of the second electrode, wherein:

the power source part is configured to apply a pulse voltage to the second electrode and the first electrode; and the power source part applies the pulse voltage to the second electrode and the first electrode while the pulse magnetic field applying unit is applying the pulse magnetic field.

13. The surface emission type electron source according to claim 2, wherein:

in the quantum wire, regions partitioned by the thin parts comprise quantum dots.

14. The surface emission type electron source according to claim 1, wherein:

an electron absorbing layer is formed on a leading end of the quantum wire, the leading end being at the second electrode side; and the electron absorbing layer is electrically connected to the second electrode.

15. An electron emission device comprising:

a surface emission type electron source comprising a first electrode having a planar form, a second electrode having a planar form facing the first electrode, an electron passage layer disposed between the first electrode and the second electrode, and a power source part configured to apply a voltage to the second electrode and the first electrode, and a porous member comprising a plurality of tube members that are bound together, wherein the electron passage layer comprises a plurality of quantum wires extending in a first direction from the first electrode to the second electrode, the quantum wires being spaced apart from each other at predetermined intervals, and electrons are emitted from a front surface of the second electrode;

a stage having a surface on which a substrate being radiated by the emitted electrons is placed, the stage being disposed so as to face the second electrode of the surface emission type electron source, wherein:

the quantum wires of the surface emission type electron source are made of silicon, a layer constituted by an insulator or a semiconductor is formed between the second electrode and the electron passage layer of the surface emission type electron source, and protrusions protruding toward leading ends of the quantum wires are formed on a back surface of the second electrode at positions corresponding to the quantum wires, each tube member has a first opening at one end and a second opening at another end that is wider than the first opening, each tube member has a diameter that monotonously increases from the first opening toward the second opening, and the porous member is connected to the front surface of the second electrode such that the first openings are facing the front surface of the second electrode.

16. The drawing device according to claim 15, wherein:
the quantum wire of the surface emission type electron source has a plurality of thin parts having small thicknesses formed at predetermined intervals along the first direction.

17. The electron emission device according to claim 15, wherein the surface emission type electron source further comprises:
a magnetic field applying unit configured to apply a magnetic field in a direction perpendicular to the front surface of the second electrode;
an electron emission angle detector configured to detect an emission angle of the electron emitted from the front surface of the second electrode when the voltage is applied by the power source part; and
a control unit configured to adjust an intensity of the magnetic field applied by the magnetic field applying unit based on a detection result indicating the emission angles of the electrons obtained by the electron emission angle detector.

18. The electron emission device according to claim 15, further comprising:
a temperature adjusting unit configured to maintain the electron passage layer of the surface emission type electron source at a temperature less than or equal to room temperature.

19. The electron emission device according to claim 15, wherein the surface emission type electron source further comprises:
a surface electrode having a planar form that is connected to the porous member on a side of the porous member having the second openings, wherein:
each tube member is constituted by an insulator or a semiconductor.

20. The electron emission device according to claim 15, wherein the surface emission type electron source further comprises:
an electrode provided for each tube member of the porous member;
a second power source part configured to apply a voltage to a part between the second electrode and each of the electrodes; and
a control unit configured to control the voltage applied by the second power source part, wherein:
each tube member is constituted by an insulator or a semiconductor.

21. The electron emission device according to claim 15, wherein:
on the first electrode of the surface emission, type electron source, a conductive body is disposed in a region corresponding to a region from which the electrons are emitted from the front surface of the second electrode, and an insulator is disposed in regions other than the region corresponding to the region from which the electrons are emitted.

22. The electron emission device according to claim 15, wherein:
an electron absorber formed as a predetermined pattern is provided on the front surface of the second electrode of the surface emission type electron source.

23. The electron emission devices according to claim 15, further comprising:
a plurality of switch elements provided on the first electrode of the surface emission type electron source, wherein the switch elements are connected to at least one of the quantum wires and are configured to switch to a conductive state, a non-conductive state, or a half-conductive state; and
a switch control unit configured to switch particular switch elements among the switch elements to the conductive state, wherein the particular switch elements are provided in the region corresponding to the region from which the electrons are emitted from the front surface of the second electrode.

24. The electron emission devices according to claim 16, wherein:
in the quantum wire of the surface emission type electron source, regions partitioned by the thin parts comprise quantum dots.

25. The surface emission type electron source according to claim 13, wherein
the voltage from the power source part is applied to both ends of the quantum wire such that the electrons in the quantum dots have equal energy levels.

26. The electron emission device according to claim 24, wherein
the voltage from the power source part is applied to both ends of the quantum wire such that the electrons in the quantum dots have equal energy levels.

27. The surface emission type electron source according to claim 1, further comprising:
an electron absorbing layer formed on at least a part of the quantum wire,
wherein the electron absorbing layer is made of amorphous carbon or amorphous silicon.

28. The electron emission device according to claim 15, further comprising;
an electron absorbing layer formed on at least a part of the quantum wire,
wherein the electron absorbing layer is made of amorphous carbon or amorphous silicon.

* * * * *